United States Patent
Müller

(10) Patent No.: US 12,477,745 B2
(45) Date of Patent: Nov. 18, 2025

(54) MEMORY CELL INCLUDING SPONTANEOUSLY POLARIZABLE CAPACITOR STRUCTURE

(71) Applicant: Ferroelectric Memory GmbH, Dresden (DE)

(72) Inventor: Stefan Ferdinand Müller, Radebeul (DE)

(73) Assignee: Ferroelectric Memory GmbH, Dresden (DE)

( * ) Notice: Subject to any disclaimer, the term of this patent is extended or adjusted under 35 U.S.C. 154(b) by 747 days.

(21) Appl. No.: 17/548,896

(22) Filed: Dec. 13, 2021

(65) Prior Publication Data
US 2023/0189532 A1    Jun. 15, 2023

(51) Int. Cl.
*H10B 53/30*    (2023.01)
*H10B 53/00*    (2023.01)
*H10D 1/68*    (2025.01)

(52) U.S. Cl.
CPC ............ *H10B 53/30* (2023.02); *H10B 53/00* (2023.02); *H10D 1/692* (2025.01)

(58) Field of Classification Search
CPC ...... H10B 53/30; H10B 53/00; G11C 11/221; H01L 28/57; H01L 28/75; H01L 28/55; H01L 28/60; H10D 1/692; H10D 1/696; H10D 1/682; H10D 1/688
See application file for complete search history.

(56) References Cited

U.S. PATENT DOCUMENTS

| | | | | |
|---|---|---|---|---|
| 6,548,343 B1* | 4/2003 | Summerfelt | ........... | H10B 53/00 257/E21.664 |
| 7,297,999 B1* | 11/2007 | Wang | ..................... | H10D 1/688 257/306 |
| 7,754,501 B2* | 7/2010 | Urushido | ............... | H10B 53/30 438/210 |
| 7,989,862 B2* | 8/2011 | Noda | ..................... | H10B 53/30 257/295 |
| 8,981,440 B2* | 3/2015 | Nakao | .................... | H10B 53/30 257/532 |
| 11,942,133 B2* | 3/2024 | Sato | .................... | H01L 23/5381 |
| 12,069,866 B2* | 8/2024 | Sato | ....................... | H10D 1/694 |

(Continued)

OTHER PUBLICATIONS

Saito et al., "A Triple-Protection Structured C with 1.2-V Operation and 1017-Cycle Endurance", https://www.researchgate.net/publication/283667163, dated Jul. 2015, 5 pages.

(Continued)

*Primary Examiner* — Ida M Soward
(74) *Attorney, Agent, or Firm* — Synergy IP Group AG; Natalie Albrecht

(57) ABSTRACT

Various aspects relate to a memory cell including: a thermally insulating layer disposed over one or more metallization layers of a metallization; an embedding structure disposed over the thermally insulating layer; and a spontaneously polarizable capacitor structure disposed at least partially within the embedding structure, wherein the spontaneously polarizable capacitor structure includes a spontaneously polarizable memory element; wherein the thermally insulating layer is configured as a heat barrier to reduce a heat transfer through the embedding structure into the one or more metallization layers.

17 Claims, 44 Drawing Sheets

(56) References Cited

U.S. PATENT DOCUMENTS

| | | | | |
|---|---|---|---|---|
| 12,108,608 | B1* | 10/2024 | Sato | H10D 1/682 |
| 12,132,092 | B2* | 10/2024 | Yu | H01L 23/5286 |
| 2005/0145908 | A1* | 7/2005 | Moise | H01L 28/55 |
| | | | | 257/295 |
| 2008/0076191 | A1* | 3/2008 | Hall | H10B 53/00 |
| | | | | 257/E21.664 |
| 2008/0121959 | A1* | 5/2008 | Izumi | H10D 1/688 |
| | | | | 257/E29.345 |
| 2008/0265298 | A1* | 10/2008 | Ozaki | H10D 1/682 |
| | | | | 257/295 |
| 2009/0026514 | A1* | 1/2009 | Wang | H10D 1/682 |
| | | | | 257/295 |
| 2010/0224961 | A1* | 9/2010 | Summerfelt | H01L 23/5223 |
| | | | | 257/532 |
| 2019/0130957 | A1* | 5/2019 | Müller | H10B 51/30 |
| 2020/0105940 | A1* | 4/2020 | Majhi | H01L 29/516 |
| 2020/0286686 | A1* | 9/2020 | Lin | H01L 28/60 |
| 2020/0395460 | A1* | 12/2020 | Haratipour | H01L 29/151 |
| 2021/0305398 | A1* | 9/2021 | Chang | H01L 29/245 |
| 2021/0343731 | A1* | 11/2021 | Chen | H10D 1/692 |
| 2022/0139932 | A1* | 5/2022 | Polakowski | H10D 64/689 |
| | | | | 257/295 |
| 2022/0139934 | A1* | 5/2022 | Müller | H10D 64/689 |
| | | | | 257/295 |
| 2023/0189531 | A1* | 6/2023 | Müller | H10B 51/30 |
| | | | | 257/295 |

OTHER PUBLICATIONS

Okuno et al., "SoC Compatible 1T1C FeRAM Memory Array Based on Ferroelectric Hf0.5Zr0.5O2", Symposium on VLSI Technology Digest of Technical Papers—TF2.1, dated 2020, 2 pages.

Grenouillet et al., "Nanosecond Laser Anneal (NLA) for Si-implanted HfO2 Ferroelectric Memories Integrated in Back-End Of Line (BEOL)", Symposium on VLSI Technology Digest of Technical Papers—TF2.4, dated 2020, 2 pages.

Fujitsu Semiconductor Memory Manual, "FRAM Guide Book", Sales Promotion Dept., MN05-00009-6E, 6th edition, dated Sep. 2010, 57 pages.

* cited by examiner

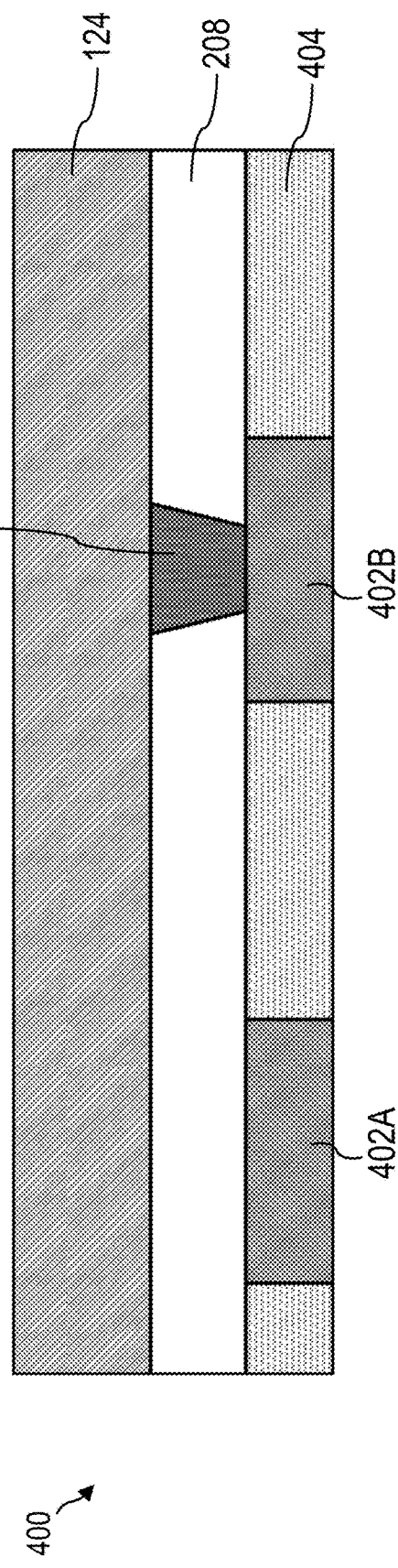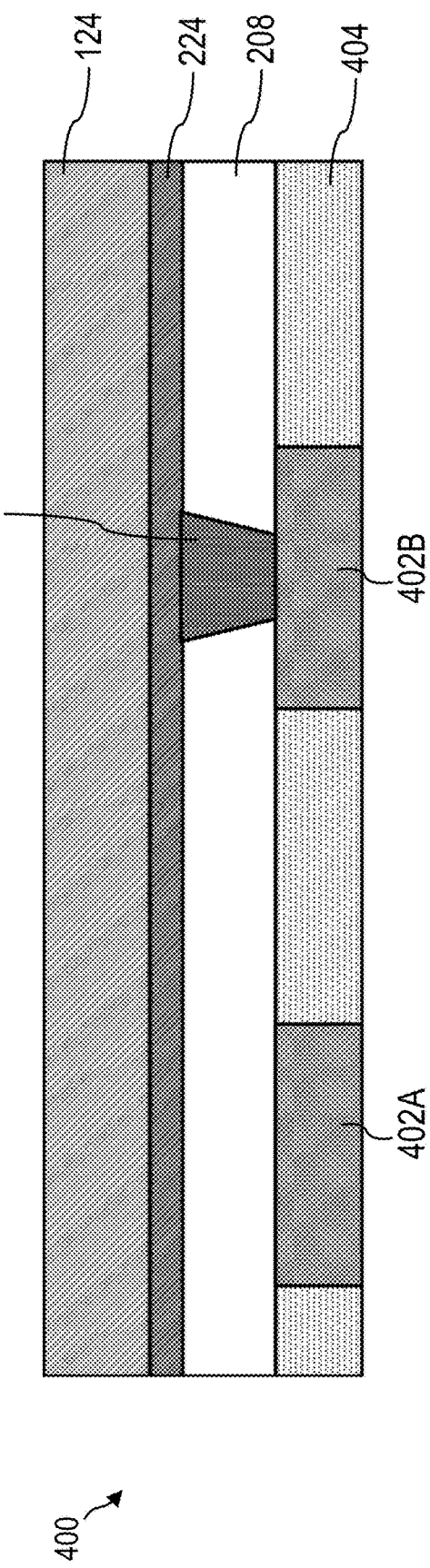

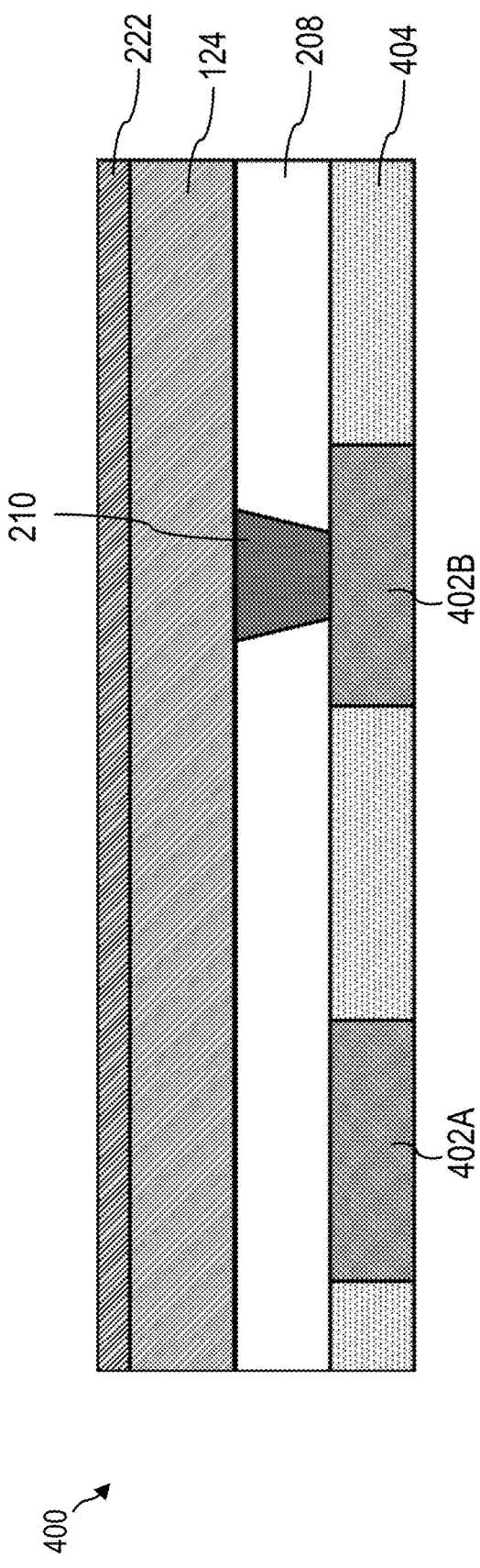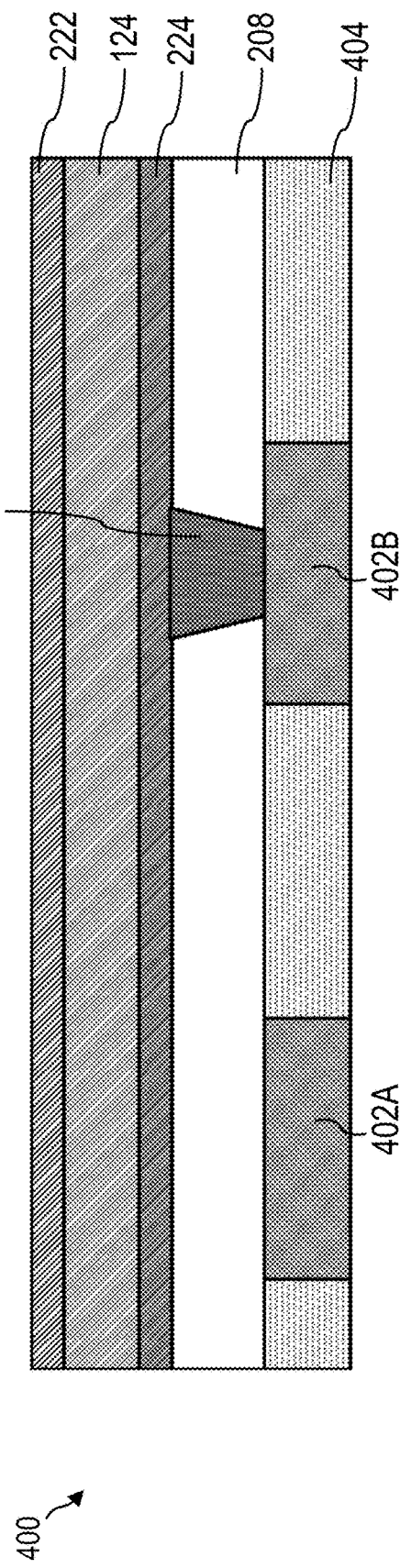

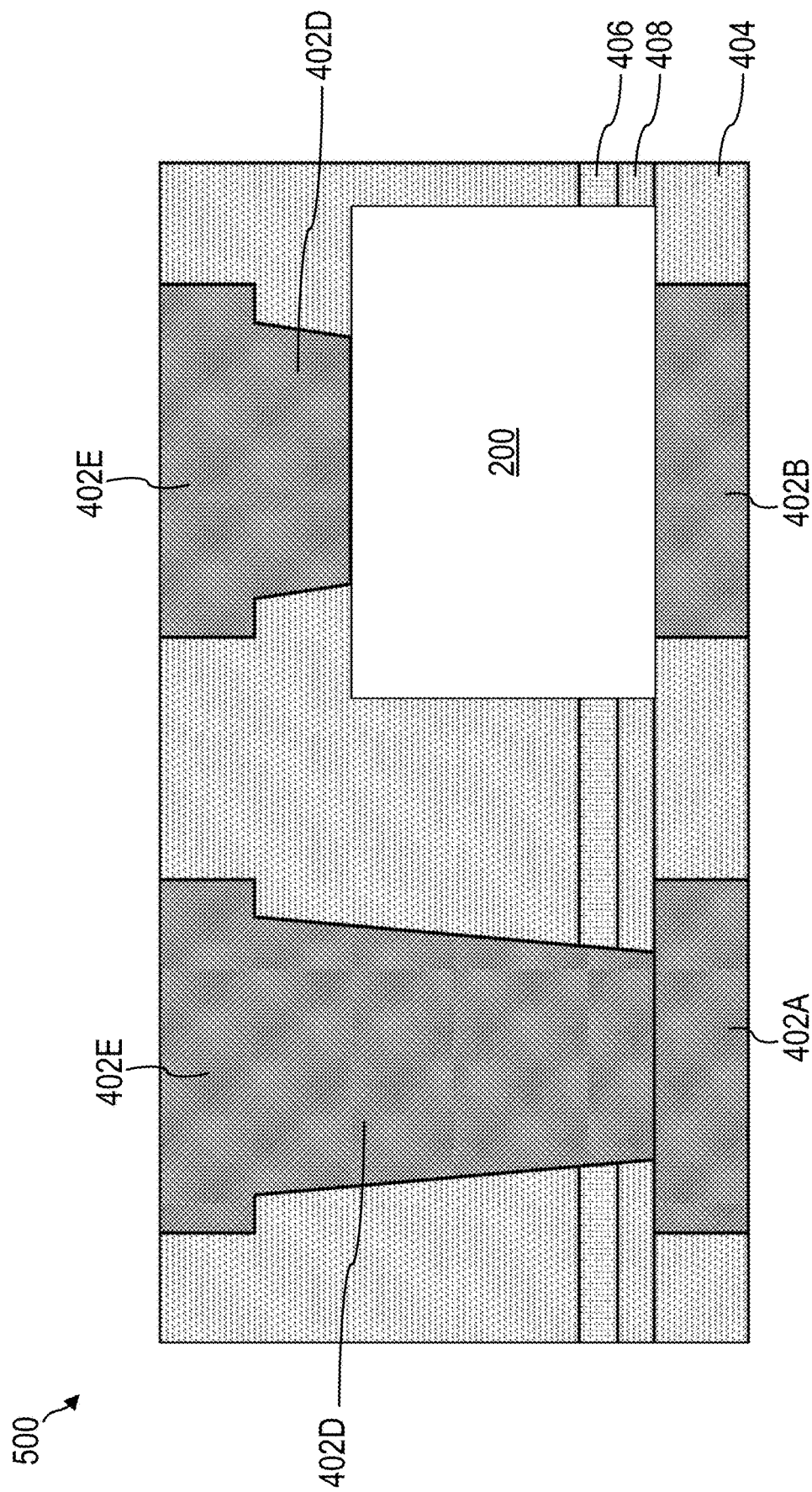

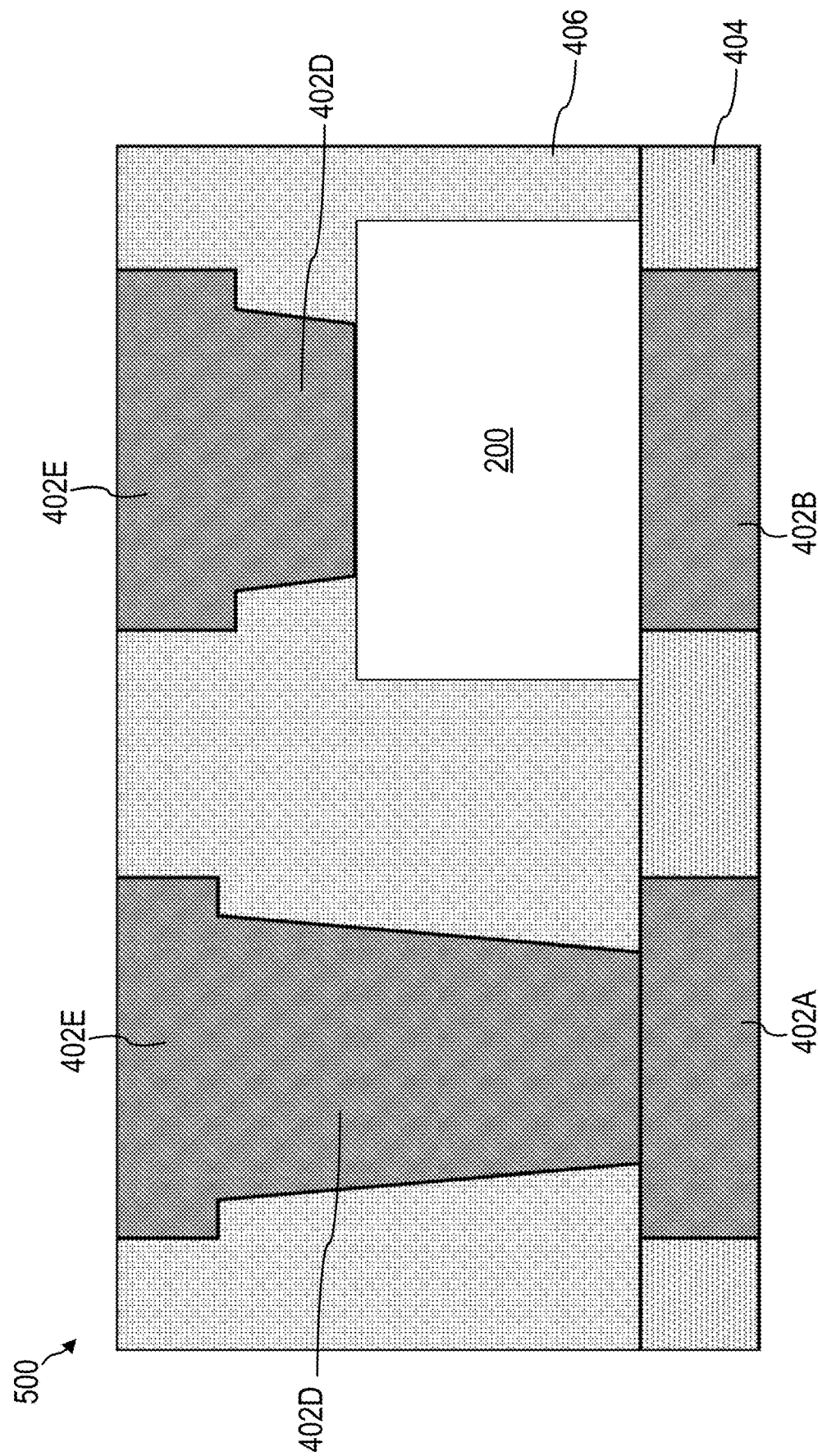

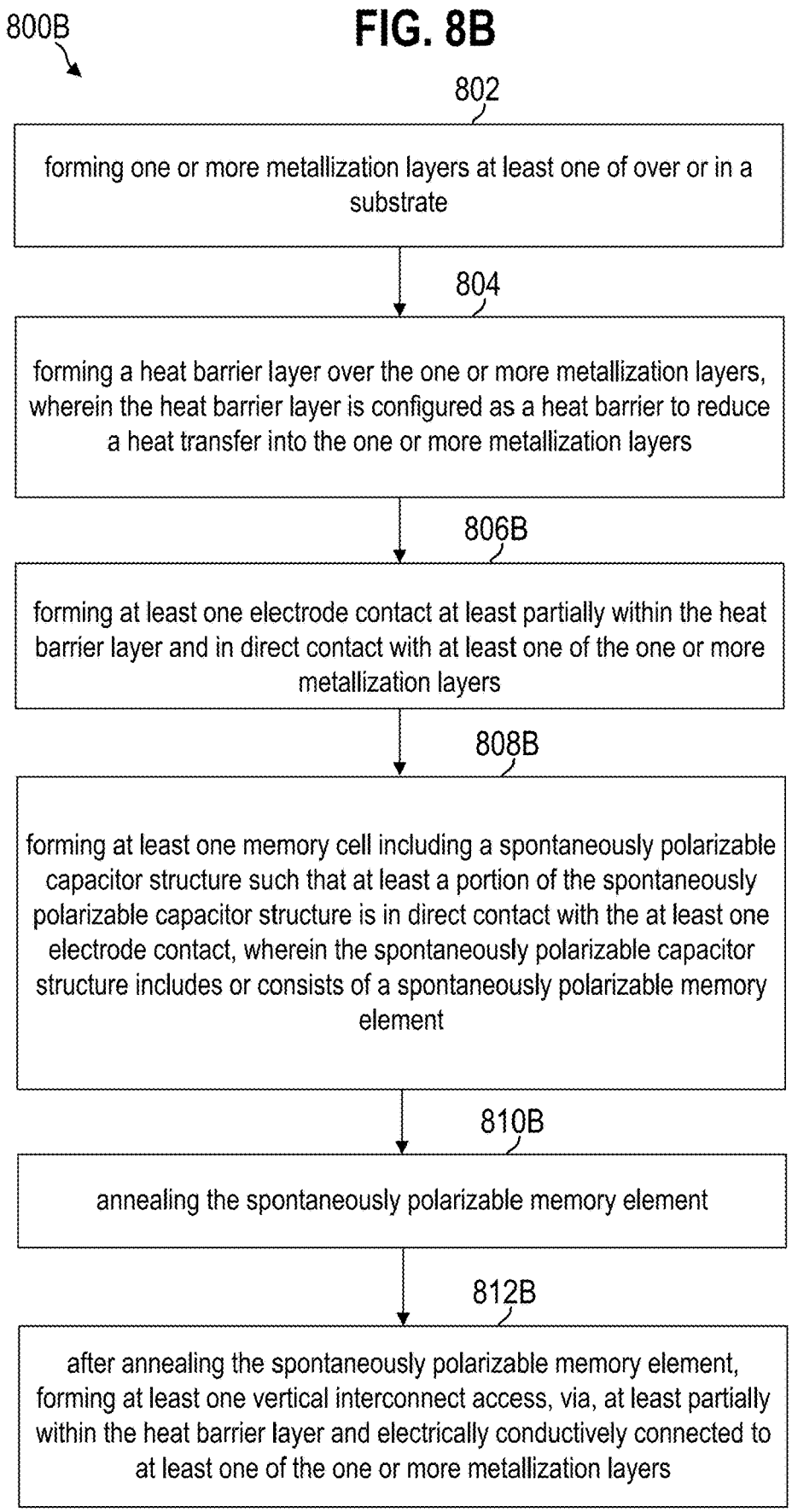

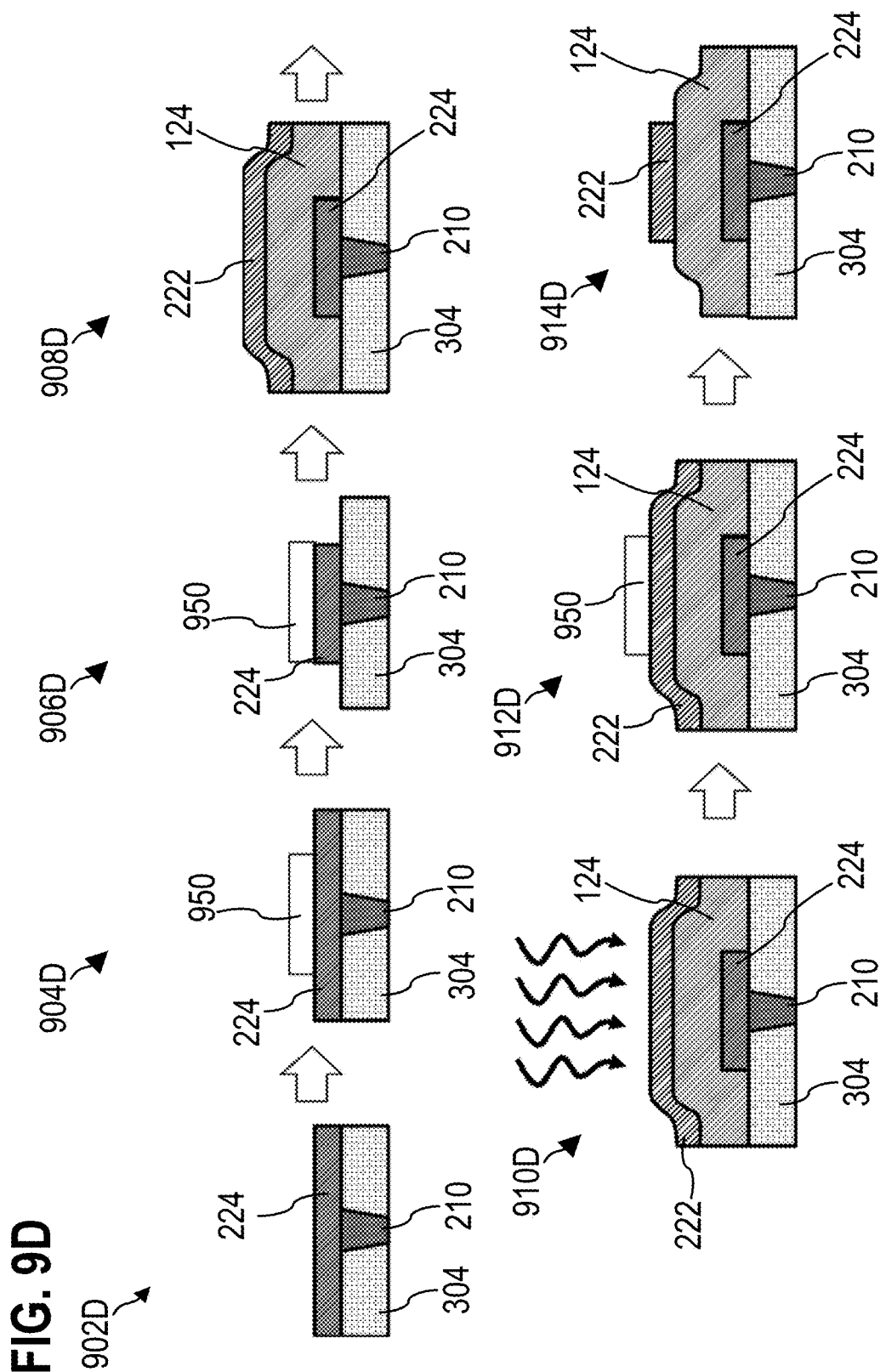

MEMORY CELL INCLUDING SPONTANEOUSLY POLARIZABLE CAPACITOR STRUCTURE

TECHNICAL FIELD

Various aspects relate to a memory cell, a memory cell arrangement, and methods thereof, e.g., a method of operating a memory cell or memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneous-polarizable material, e.g., a ferroelectric material or a configuration of an anti-ferroelectric material, whose polarization state may be changed in a controlled fashion to store data in the memory cell, e.g., in a non-volatile manner. A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 7A to FIG. 7F each show an exemplary structure during manufacturing a memory cell arrangement including vertical interconnect accesses formed after annealing a memory element according to various aspects;

FIG. 8A to FIG. 8G each show a flow diagram of a method for manufacturing a memory cell arrangement according to various aspects; and FIG. 9A to FIG. 9D each showing schematically a respective manufacturing or at least parts of a manufacturing process of a memory cell arrangement according to various aspects.

DESCRIPTION

Figure 1:
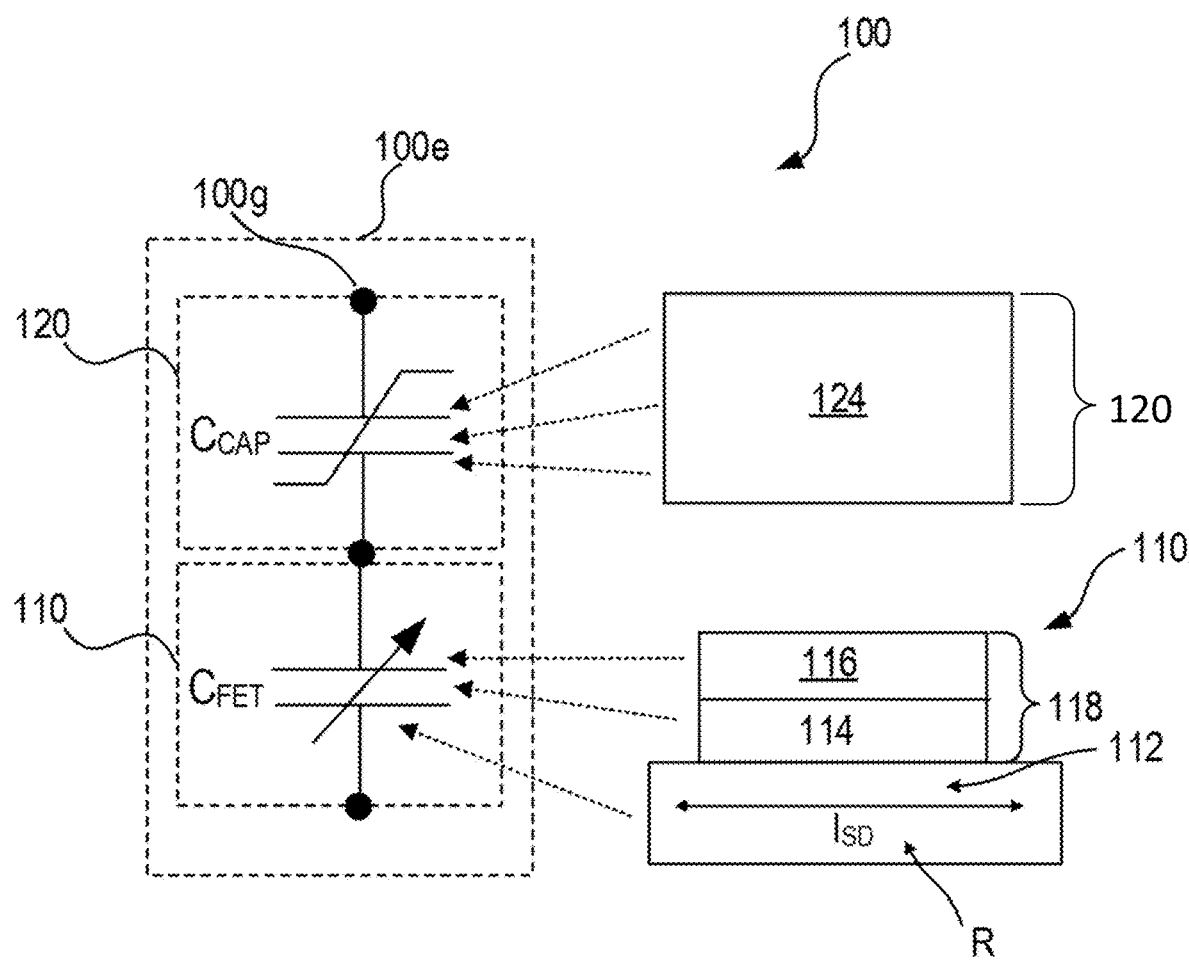
FIG. 1 shows various aspects of a memory structure in a schematic view.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

In the semiconductor industry, the integration of non-volatile memory technologies, sensor technologies, transmitter technologies, electronic filter technologies, receiver technologies, and the like may be useful for various types of devices and applications. According to various aspects, an electronic device, e.g., a non-volatile memory may be integrated on a chip.

Various aspects relate to memory cells which are integrated between metallization layers of a chip (in some aspects also referred to as interlayer metallization). According to various aspects, the memory cells may be integrated over the first metallization layer (e.g., between the first metallization layer and the second metallization layer or between the second metallization layer and the third metallization layer. Hence, the memory cells may be formed after forming transistors, after forming contact pads (in some aspects also referred to as contact metallization) for contacting terminals (e.g., gate terminals, source terminals, and/or drain terminals) of the transistors, and after forming the first metallization layer over the contact pads. Various aspects relate to structures of the integrated memory cells and methods to manufacture these structures. According to various aspects, the structures of the integrated memory cells described herein may allow to use the conventional metallization layers for contacting the memory cells (e.g., electrodes of the memory cells). Further an available space between the metallization layers is used efficiently.

According to various aspects, a memory cell may include a memory element consisting of a spontaneously polarizable material. A thermal annealing may be carried out to achieve the spontaneously polarizable properties of (e.g., to crystallize) the spontaneously polarizable material. Various aspects relate to a heat barrier layer to reduce a heat transfer to the chip structure (e.g., the transistors, the contacts, the one or more metallization layers, etc.) below the spontaneously polarizable material during annealing the spontaneously polarizable material. Thus, the chip structure below the spontaneously polarizable material is protected from thermal damage. This enables the use of spontaneously polarizable material which require a higher temperature (e.g., higher than 400° C.) for developing spontaneously polarizable properties.

FIG. 1 shows various aspects of a memory structure 100. The memory structure 100 may be a field-effect transistor (FET) based capacitive memory structure, according to various aspects. The memory structure 100 may include a field-effect transistor structure 110 and a capacitive memory structure 120. In some aspects, the capacitive memory structure 120 may be coupled to the field-effect transistor structure 110. Basically, the memory structure 100 may include a field-effect transistor structure and a memory element 124 (e.g., including a spontaneously polarizable material).

As an example, the capacitive memory structure 120 may include at least two electrodes (e.g., two electrode layers) and the memory element 124 coupled to the at least two electrodes. The memory element 124 may include or may be a functional layer disposed between two electrodes. A functional layer may also be referred to herein as memory layer. The memory element 124 may include or may consist of any type of suitable memory material, as for example a spontaneously polarizable material (e.g., a remanent polarizable material, such as a ferroelectric material, or a non-remanent polarizable material, such as an anti-ferroelectric material). In some aspects, the memory element 124 may be in direct physical contact with the at least two electrodes. Illustratively, a first (shared) interface region may be present between the memory element 124 and a first electrode, and a second (shared) interface region may be present between the memory element 124 and a second electrode.

According to various aspects, the memory element 124 may be a capacitive memory element including, for example, an electrically non-conductive material such as a spontaneously polarizable material. The capacitive memory structure 120 in a capacitive configuration may have a (first) capacitance, $C_{CAP}$, associated therewith (see equivalent circuit 100e with respect to the capacitive properties). The two electrodes and the memory element 124 may form a memory layer stack. In some aspects, the memory layer stack may be a planar layer stack; however, other shapes may be suitable as well, e.g., curved shapes, angled shapes, coaxially aligned shapes, as examples. Illustratively, the capacitive memory structure 120 may include planar electrodes, or, in other aspects, the capacitive memory structure 120 may be configured as 3D capacitor including, for example, angled or curved electrodes.

The field-effect transistor structure 110 may include a gate structure 118, wherein the gate structure 118 may include a gate isolation 114 and a gate electrode 116. The gate structure 118 is illustrated exemplarily as a planar gate stack; however, it is understood that the planar configuration shown in FIG. 1 is an example, and other field-effect transistor designs may include a gate structure 118 with a non-planar shape, for example a trench gate transistor design, a vertical field-effect transistor design, or other designs, such as a fin-FET design.

The gate structure 118 may define a channel region 112, e.g., provided in a semiconductor portion (e.g., in a semiconductor layer, in a semiconductor die, etc.). The gate structure 118 may allow for a control of an electrical behavior (e.g., a resistance R) of the channel region 112, e.g., a current flow in the channel region 112 may be controlled (e.g., allowed, increased, prevented, decreased, etc.). In some aspects, the gate structure 118 may, for example, allow to control (e.g., allow or prevent) a source/drain current, $I_{SD}$, from a first source/drain region of the field-effect transistor structure 110 to a second source/drain region of the field-effect transistor structure 110 (the source/drains are provided in or adjacent to the channel but are not shown in FIG. 1). The channel region 112 and the source/drain regions may be formed, e.g., via doping one or more semiconductor materials or by the use of intrinsically doped semiconductor materials, within a layer and/or over a layer. With respect to the operation of the field-effect transistor structure 110, a voltage may be provided at the gate electrode 116 to control the current flow, $I_{SD}$, in the channel region 112, the current flow, $I_{SD}$, in the channel region 112 being caused by voltages supplied via the source/drain regions.

According to various aspects, the semiconductor portion (illustratively, where the channel region 112 may be formed), may be made of or may include silicon. However, other semiconductor materials of various types may be used in a similar way, e.g., germanium, Group III to V (e.g., SiC), or other types, including for example carbon nanotubes, organic materials (e.g., organic polymers), etc. In various aspects, the semiconductor portion may be a wafer made of silicon (e.g., p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

The gate electrode 116 may include an electrically conductive material, for example, a metal, a metal alloy, a degenerate semiconductor (in other words a semiconductor material having such a high level of doping that the material acts like a metal and not anymore as a semiconductor), and/or the like. As an example, the gate electrode 116 may include or may be made of aluminum. As another example, the gate electrode 116 may include or may be made of polysilicon. According to various aspects, the gate electrode 116 may include one or more electrically conductive portions, layers, etc. The gate electrode 116 may include, for example, one or more metal layers (also referred to as a metal gate), one or more polysilicon layers (also referred to as poly-Si-gate), etc. A metal gate may include, for example, at least one work-function adaption metal layer disposed over the gate isolation 114 and an additional metal layer disposed over the work-function adaption metal layer. A poly-Si-gate may be, for example, p-type doped or n-type doped.

The gate isolation 114 may be configured to provide an electrical separation of the gate electrode 116 from the channel region 112 and further to influence the channel region 112 via an electric field generated by the gate electrode 116. The gate isolation 114 may include one or more electrically insulating layers, as an example. Some designs of the gate isolation 114 may include at least two layers including different materials, e.g., a first gate isolation layer (e.g., a first dielectric layer including a first dielectric material) and a second gate isolation layer (e.g., a second dielectric layer including a second dielectric material distinct from first dielectric material).

As illustrated by the circuit equivalent in FIG. 1, a (second) capacitance, $C_{FET}$, may be associated with the field-effect transistor structure 110. Illustratively, the channel region 112, the gate isolation 114, and the gate electrode 116 may have a capacitance, $C_{FET}$, associated therewith, originating from the more or less conductive regions (the channel region 112 and the gate electrode 116) separated from one another by the gate isolation 114. Further illustratively, the channel region 112 may be considered as a first capacitor electrode, the gate electrode 116 as a second capacitor electrode, and the gate isolation 114 as a dielectric medium between the two capacitor electrodes. The capacitance, $C_{FET}$, of the field-effect transistor structure 110 may define one or more operating properties of the field-effect transistor structure 110. The configuration of the field-effect transistor structure 110 (e.g., of the gate isolation 114) may be adapted according to a desired behavior or application of the field-effect transistor structure 110 during operation (e.g., according to a desired capacitance).

In general, the capacitance, C, of a planar capacitor structure may be expressed as, $$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

In some aspects, the gate electrode 116 of the field-effect transistor structure 110 and the electrode of the capacitive memory structure 120 that is connected to the field-effect transistor structure 110 may be spatially separated from one another and electrically connected via a conductive connection, e.g., one or more metal lines. In other aspects, the gate electrode 116 of the field-effect transistor structure 110 and one of the at least two electrodes of the capacitive memory structure 120 may be in direct physical contact with one another or implemented as a single (shared) electrode.

The field-effect transistor structure 110 and the capacitive memory structure 120 form together a field-effect transistor based (e.g., capacitive) memory structure, as exemplarily shown in FIG. 1. A gate 100g of the field-effect transistor based (e.g., capacitive) memory structure may be provided by an electrode 12 of the capacitive memory structure 120. Various configurations of the memory structure 120 are described with reference to FIG. 2A to FIG. 2R.

According to various aspects, the memory structure 100 may provide or may be part of a memory cell. A memory cell may be provided, for example, by coupling a gate of a field-effect transistor structure with a capacitive memory structure, or by integrating a memory structure in the gate structure of a field-effect transistor structure (as shown, in FIG. 1 for the field-effect transistor structure 110 and the capacitive memory structure 120). A memory cell may illustratively include a field-effect transistor structure and a capacitive memory structure coupled to or integrated in the field-effect transistor structure (optionally with one or more additional elements). In such a configuration the functional layer (e.g., a capacitive memory element) may be in a capacitive environment, e.g., disposed between two electrode layers or disposed between a channel of a field-effect transistor and an electrode layer (e.g., a gate electrode of the field-effect transistor). In such a memory cell, the state (e.g., the polarization state) of the memory element influences the threshold voltage of the field-effect transistor structure (e.g., a first state of the memory element may be associated with a first threshold voltage, such as a low threshold voltage, and a second state of the memory element may be associated with a second threshold voltage, such as a high threshold voltage). A memory cell that includes a field-effect transistor structure and a capacitive memory structure may be referred to as field-effect transistor based memory cell or field-effect transistor based capacitive memory cell. It is noted that even though various aspects of a memory cell are described herein with reference to a field-effect transistor based capacitive memory structure (such as a FeFET), other memory structures may be suitable as well.

The field-effect transistor structure 110 and the capacitive memory structure 120 may be coupled (e.g., electrically connected) to one another such that a capacitive voltage divider is provided. The capacitive voltage divider formed by the field-effect transistor structure 110 and the capacitive memory structure 120 may allow adapting the capacitances $C_{FET}$, $C_{CAP}$ of the respective capacitors to allow an efficient programming of the memory cell. The overall gate voltage required for switching the memory cell from one memory state into another memory state (e.g., from high threshold voltage state to low threshold voltage state, as described below), may become smaller in case the voltage distribution across the field-effect transistor structure 110 and the capacitive memory structure 120 is adapted such that more of the applied gate voltage drops across the memory layer of the capacitive memory structure 120 (e.g., across the memory element 124) than across the gate isolation of the field-effect transistor structure 110. The overall write voltage (illustratively, applied via nodes to which the field-effect transistor structure 110 and the capacitive memory structure 120 are connected) may thus be reduced by adapting the capacitive voltage divider. The voltage distribution may be determined by voltage divider calculations for a series connection of the capacitors.

That is, in the case that the capacitance, $C_{FET}$, of the field-effect transistor structure 110 is adapted (e.g., by providing a suitable gate isolation) a predefined fraction of the voltage applied to the series connection may drop across the capacitive memory structure 120. Accordingly, the electric field generated across the gate isolation of the field-effect transistor structure 110 underneath the capacitive memory structure 120 could be reduced if desired. This may lead to a reduced interfacial field stress, which may lead to a reduced wear out of the interface due to, for example, charge injection. Therefore, the reduced electric field generated across the gate isolation may lead to improved endurance characteristics of the memory cell, that is, to an increased amount of possible state reversals until the memory cell may lose or change its memory properties.

In some aspects, the memory element 124 of the capacitive memory structure 120 may include (e.g., may consist of) a spontaneously polarizable layer (e.g., a remanent-polarizable layer). By increasing the capacitance $C_{FET}$ of the field-effect transistor structure 110 (e.g., by providing a gate isolation including a relatively thick layer of material with high dielectric constant), the depolarization field, $E_{Dep}$, of the remanent-polarizable layer may be reduced. The depolarization field may be expressed by the following set of equations, wherein the indices "FET" refer to the capacitor provided by the field-effect transistor structure 110 and the indices "CAP" refer to the capacitor provided by the capacitive memory structure 120, as described herein:

$$V_{FET} + V_{CAP} = 0,$$

$$D = \varepsilon_0 \varepsilon_{FET} = \varepsilon_0 \varepsilon_{CAP} E_{CAP} + P,$$

$$E_{CAP} \equiv E_{Dep} = -P\left(\varepsilon_0 \varepsilon_{CAP}\left(\frac{C_{FET}}{C_{CAP}} + 1\right)\right)^{-1}.$$

The depolarization field $E_{Dep}$ may be detrimental to data retention since, depending on its magnitude, it may depolarize the remanent-polarizable layer. However, the magnitude may be reduced by increasing the capacitance ratio $C_{FET}/C_{CAP}$. Accordingly, in case the capacitance $C_{FET}$ of the field-effect transistor structure 110 is increased, the depolarization field is reduced. This in turn improves the data retention of the memory cell.

According to various aspects, a threshold voltage of a field-effect transistor structure (and in a corresponding manner the threshold voltage of a field-effect transistor based memory cell) may be defined as a constant current threshold voltage (referred to as Vth(ci)). In this case, the constant current threshold voltage, Vth(ci), may be a determined gate source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 μA. In some aspects, the constant current threshold voltage, Vth(ci), may be determined based on the following equation:

$$Vth(ci)=V_{GS}(\text{at } I_D=I_{D0}\cdot W/L).$$

A threshold voltage of a field-effect transistor structure (e.g., of the field-effect transistor structure 110) may be defined by the properties of the field-effect transistor structure (e.g., the materials, the doping, etc.), and it may thus be a (e.g., intrinsic) property of the field-effect transistor structure.

According to various aspects, a memory cell may have at least two distinct memory states associated therewith, for example with two distinct electrical conductivities or two distinct amounts of stored charge that may be determined to determine in which of the at least two distinct states the memory cell is residing in. A memory cell including a field-effect transistor structure may include a first memory state, for example associated with a low threshold voltage state (referred to as LVT associated with the LVT memory state), and a second memory state, for example associated with a high threshold voltage state (referred to as HVT state associated with the HVT memory state). The high threshold voltage state may be, in some aspects, associated with a lower current flow during readout than the low threshold voltage state. The low threshold voltage state may be an electrically conducting state (e.g., associated with a logic memory state "1", also referred to as a memory state or programmed state) and the high threshold voltage state may be an electrically non conducting state or at least less conducting than the low threshold voltage state (e.g., associated with a logic memory state "0", also referred to as a memory state or erased state). However, the definition of the LVT state and the HVT state and/or the definition of a logic "0" and a logic "1" and/or the definition of "programmed state" and "erased state" may be selected arbitrarily. Illustratively, the first memory state may be associated with a first threshold voltage of the FET based memory cell, and the second memory state may be associated with a second threshold voltage of the FET based memory cell.

According to various aspects, the residual polarization of the memory element (e.g., the polarization of a spontaneously-polarizable layer) may define the memory state a memory cell is residing in. According to various aspects, a memory cell may reside in a first memory state in the case that the memory element is in a first polarization state, and the memory cell may reside in a second memory state in the case that the memory element is in a second polarization state (e.g., opposite to the first polarization state). As an example, the polarization state of the memory element may determine the amount of charge stored in the capacitive memory structure. The amount of charge stored in the capacitive memory structure may be used to define a memory state of the memory cell. The threshold voltage of a field-effect transistor structure may be a function of the polarization state of the memory element, e.g., may be a function of the amount and/or polarity of charge stored in the capacitive memory structure. A first threshold voltage, e.g., a low threshold voltage $V_{L-th}$, may be associated with the first polarization state (e.g., with the first amount and/or polarity of stored charge), and a second threshold voltage, e.g., a high threshold voltage $V_{H-th}$, may be associated with the second polarization state (e.g., with the second amount and/or polarity of stored charge). A current flow from nodes to which the field-effect transistor structure and the capacitive memory structure are coupled may be used to determine the memory state in which the memory cell is residing in.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

According to various aspects, a memory element of a memory cell (e.g., the memory element of a capacitive memory structure coupled to or integrated in a field-effect transistor structure, for example the memory element 124) may include or may be made of a polarizable material, e.g., a spontaneously-polarizable material. A spontaneously-polarizable memory element (e.g., a spontaneously-polarizable layer) may show a hysteresis in the (voltage dependent) polarization. The spontaneously-polarizable memory element may show non-remanent spontaneous polarization (e.g., may show anti-ferroelectric properties), e.g., the spontaneously-polarizable memory element may have no or no substantial remanent polarization remaining in the case that no voltage drops over the spontaneously-polarizable memory element. In other aspects, the spontaneously-polarizable memory element may show remanent spontaneous polarization (e.g., may show ferroelectric properties), e.g., the spontaneously-polarizable memory element may have a remanent polarization or a substantial remanent polarization remaining in the case that no voltage drops over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of a material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

According to various aspects, in various types of applications, e.g., in memory technology, a remanent polarization as low as 0 μC/cm$^2$ to 3 μC/cm$^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 μC/cm$^2$ may be regarded as substantial remanent polarization. Such a substantial remanent polarization may allow for storing information as a function of a polarization state of a spontaneously polarizable layer or a spontaneously polarizable material.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials. According to various aspects, an electric coercive field, $E_C$, (also referred to as coercive field) may be or represent the electric field required to depolarize a remanent-polarizable layer.

According to various aspects, a spontaneously-polarizable memory element (e.g., the memory element 124) may include or may consist of a remanent-polarizable material. A remanent-polarizable material may be a material that is remanently polarizable and shows a remanence of the spontaneous polarization, such as a ferroelectric material. In other aspects, remanent-polarizable material may be a material that is spontaneously polarizable and that shows no remanence, e.g., an anti-ferroelectric material under the additional conditions that measures are implemented to generate an internal electric-field within the anti-ferroelectric material. Hence, a non-remanently polarizable material, such as an anti-ferroelectric ("antiferroelectric") material may exhibit remanent polarizable properties within certain structures. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, only as examples. A spontaneously-polarizable memory element including or being made of a remanent-polarizable material may be referred to herein as remanent-polarizable memory element (e.g., as remanent-polarizable layer).

In some aspects, a spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, the spontaneous-polarizable material (e.g., the remanent-polarizable material) may be or may include a ferroelectric material, illustratively a memory element may be ferroelectric memory element (for example a ferroelectric layer). A ferroelectric material may be an example of a material used in a spontaneously-polarizable memory element (e.g., in a remanent-polarizable element). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

In some aspects, the spontaneous-polarizable material may include hafnium oxide (e.g., may consist of hafnium oxide, hafnium zirconium oxide (e.g., $Hf_{0.5}Zr_{0.5}O_2$), hafnium silicon oxide hafnium lanthanum oxide or hafnium lanthanum zirconium oxide), zirconium oxide, and/or aluminum nitride (e.g., may consist of aluminum nitride, aluminum scandium nitride or aluminum boron nitride). In some aspects, the spontaneous-polarizable material may include or may consist of $Hf_{1-x}Zr_xO_2$, $Hf_{1-x}Si_xO_2$, $Hf_{1-x}La_xO_2$, $Hf_{1-x-y}La_xZr_yO_2$, $Al_{1-x}Sc_xN$, or $Al_{1-x}B_xN$.

According to various aspects, a capacitive memory structure (e.g., the capacitive memory structure 120) may be or may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. Illustratively, a memory element of a memory structure (e.g., the memory element 124 of the memory structure 100) may include any type of spontaneously-polarizable material, e.g., a ferroelectric material, an anti-ferroelectric material, an anti-ferroelectric-like material, etc. An information may be stored via at least two remanent polarization states of the capacitive memory structure. The programming of the capacitive memory structure (illustratively the storage of information therein) may be carried out by providing an electric field between to thereby set or change the remanent polarization state of the capacitive memory structure (illustratively, of the memory element). Illustratively, a spontaneous-polarizable material (e.g., a ferroelectric material, e.g., an anti-ferroelectric material) may be used to store data in non-volatile manner in integrated circuits.

It may be understood that, even though various aspects refer to a memory element including or being made of a spontaneously-polarizable material, other memory elements whose state may be altered by an electric field provided across a capacitive memory structure may be used.

According to various aspects, a memory device may include a memory cell and a memory controller to operate (e.g., read and write) the memory cell. According to various aspects, a memory cell arrangement may include a memory cell and a memory controller to operate (e.g., read and write) the memory cell. It is noted that some aspects are described herein with reference to a memory cell of a memory device and/or with reference to a memory cell of memory cell arrangement; it is understood that a memory device and/or a memory cell arrangement may include a plurality of such described memory cells according to various aspects that can be operated in the same way by the memory controller, e.g., at the same time or in a time sequence. A memory cell arrangement may further include respective sets of control lines and voltage supply levels configured to operate the one or more memory cells of the memory device and/or the memory cell arrangement.

It is noted that a memory cell arrangement is usually configured in a matrix-type arrangement, wherein columns and rows define the addressing of the memory cells according to the control lines connecting respectively subsets of memory cells of the memory cell arrangement along the rows and columns of the matrix-type arrangement. However, other arrangements may be suitable as well.

The memory cell or the memory cell arrangement described herein may be used in connection with any type of suitable memory controller, e.g., a memory controller that may generate only two or only three different voltage levels for writing the memory cell (e.g., for writing one or more memory cells of a memory cell arrangement). However, in other aspects, more than four different voltage levels may be used for operating (e.g., for reading) the memory cell or for operating one or more memory cells of a memory cell arrangement.

According to various aspects, the memory cell and the memory cell arrangement described herein may be configured complementary metal oxide semiconductor (CMOS) compatible, e.g., including standard CMOS-materials only and may require no special integration considerations (e.g., no special thermal budget which may avoid diffusion and/or contamination during manufacturing). CMOS compatible spontaneously polarizable materials may be used to implement the one or more memory cell based on, for example, $HfO_2$ and/or $ZrO_2$. Doped $HfO_2$ (e.g., $Si:HfO_2$ or $Al:HfO_2$) or other suitable spontaneously-polarizable materials may allow for an integration of the spontaneously polarizable layer via known integration schemes.

According to various aspects, a memory controller may be configured to provide one or more sets of voltage levels to operate a memory cell arrangement. According to various aspects, a writing operation may be provided based on only two voltage levels (e.g., a first supply voltage level VPP and a second supply voltage level VNN). In the case that the CMOS technology provides electrical access to the bulk, all bulks may be connected to VNN or a voltage significantly similar to VNN but such that no diode from bulk to any source/drain region is forward biased.

Figure 2A:
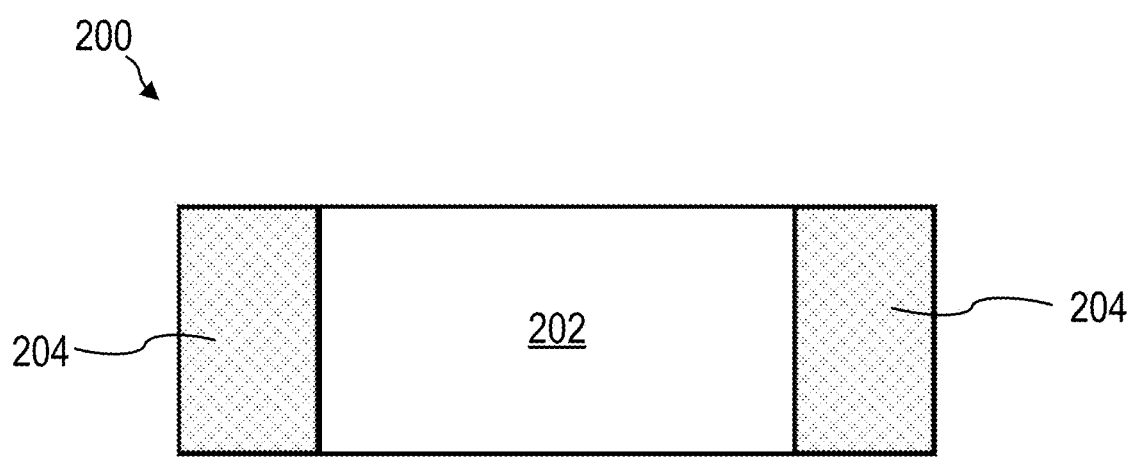
FIG. 2A to FIG. 2R each show an exemplary structure of a memory cell including a spontaneously polarizable capacitor structure according to various aspects.

Various aspects relate to the integration of memory cells that include a spontaneously polarizable memory element 104. FIG. 2A to FIG. 2R each show an exemplary structure of a memory cell 200 including a spontaneously polarizable capacitor structure, SPOC, 202 according to various aspects. The SPOC structure 202 may be configured as or may be the capacitive memory structure 120. A memory cell arrangement may include one or more memory cells configured in accordance with the memory cell 200.

The SPOC structure 202 may be disposed at least partially within an embedding structure 204. The embedding structure 204 may be a common embedding structure for one or more (e.g., each) of a plurality of memory cells. For example, each of the plurality of memory cells may be disposed at least partially within the embedding structure 204. The embedding structure 204 may include one or more layers. The embedding structure 204 may include or may consists of an insulator material, such as a porous low-k dielectric material, (dense) silicon oxide, etc.

The SPOC structure 202 may include a spontaneously polarizable memory element 124. For illustration, the spontaneously polarizable memory element 124 is, in the following, described as including or consisting of a spontaneously polarizable material (e.g., a ferroelectric or antiferroelectric material). It is noted that the spontaneously polarizable memory element 124 may include or may consist of another material and the spontaneously polarizable properties may (at least in part) result from one or more other elements (e.g., structures) of the SPOC structure 202. For example, an encapsulation structure may introduce compressive stress or tensile stress onto the memory element 124 and the material of the stress memory element may establish the spontaneously polarizable properties due to the stress.

Figure 3A:
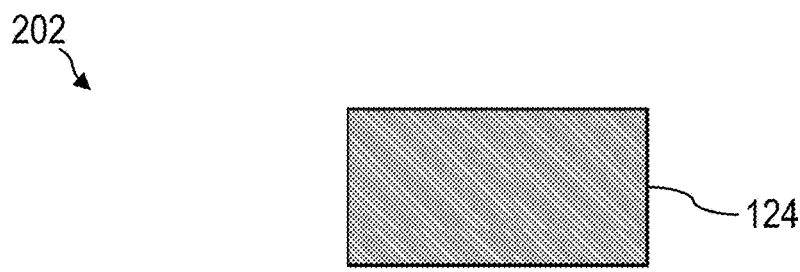
FIG. 3A to FIG. 3N each show a spontaneously polarizable capacitor structure according to various aspects.
Figure 3B:
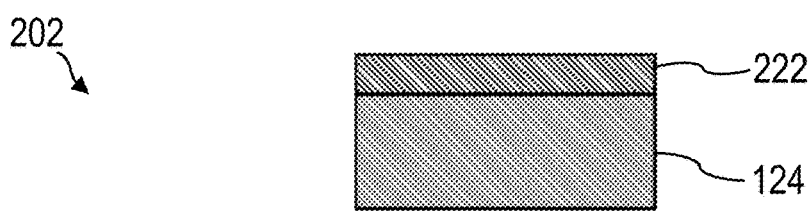
Figure 3C:
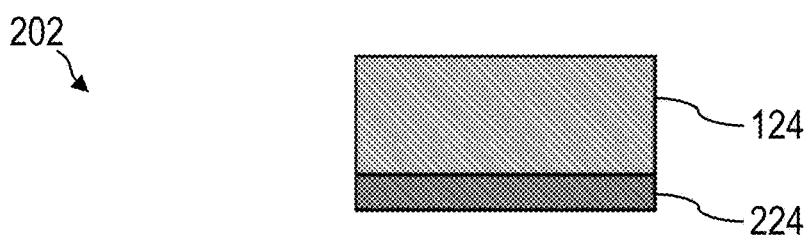
Figure 3D:
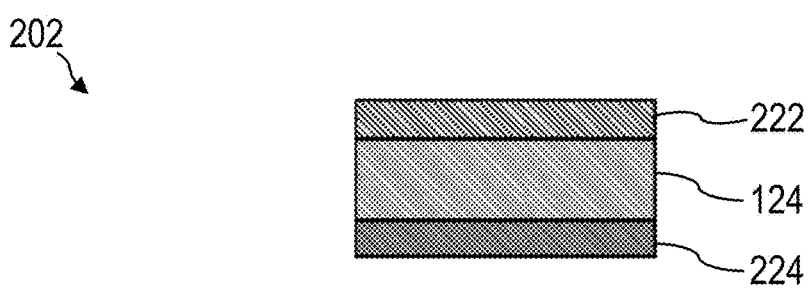
Figure 3E:
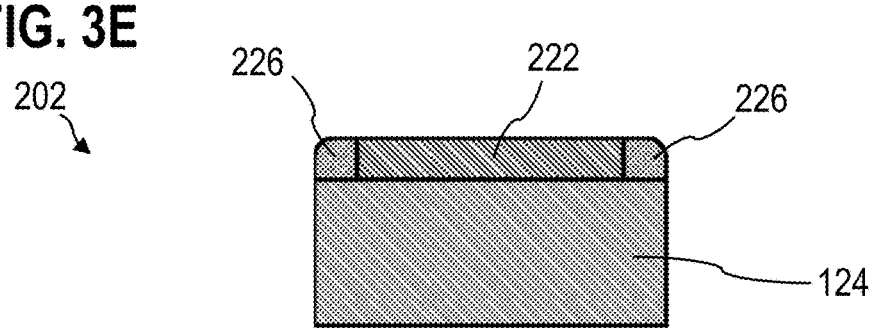
Figure 3F:
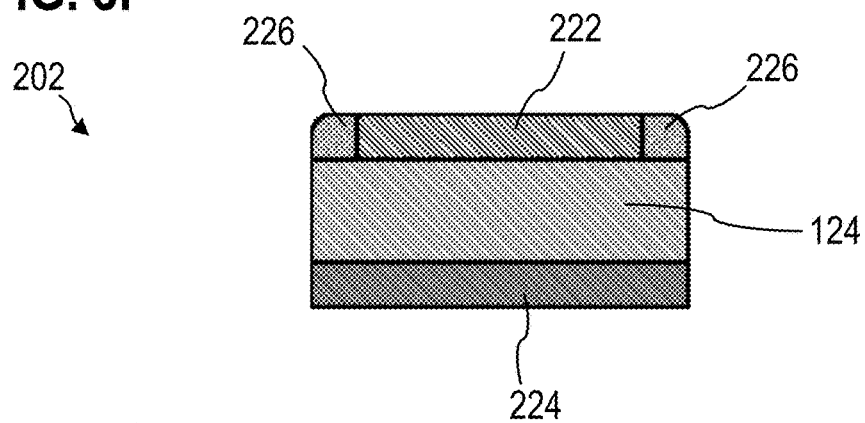
Figure 3G:
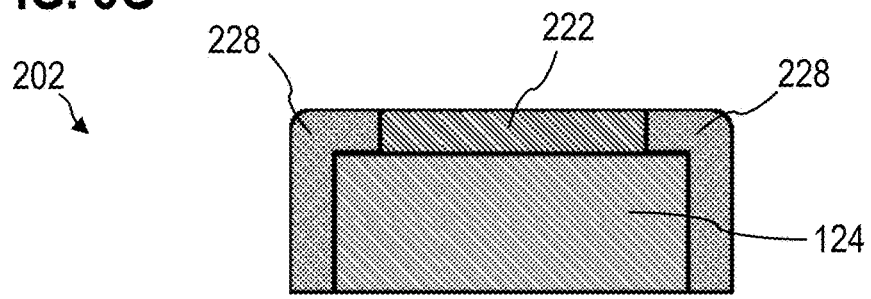
Figure 3H:
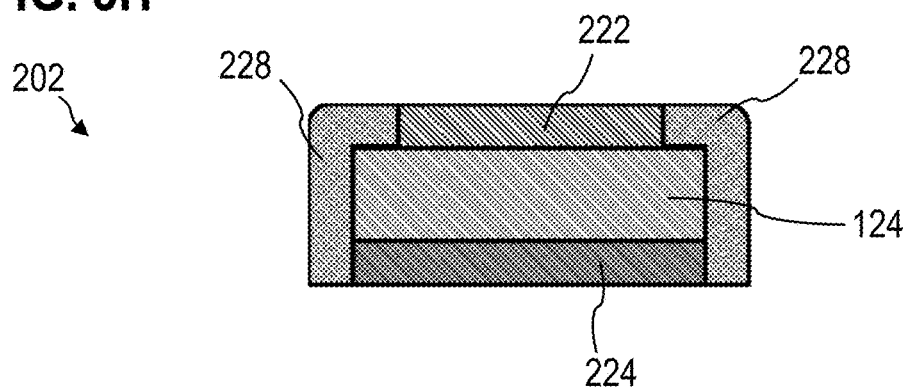
Figure 3I:
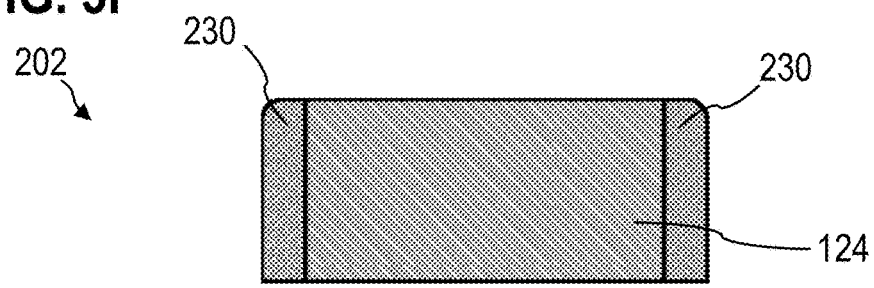
Figure 3J:
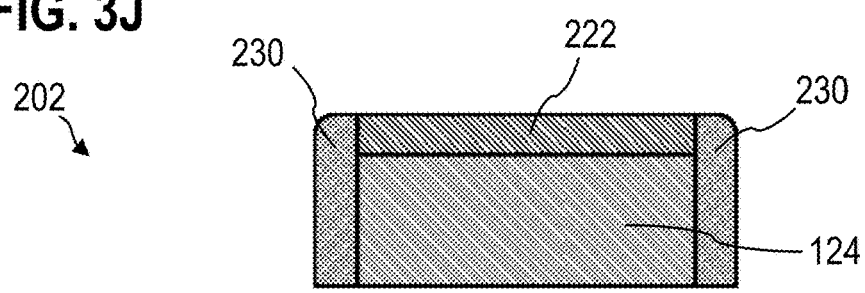
Figure 3K:
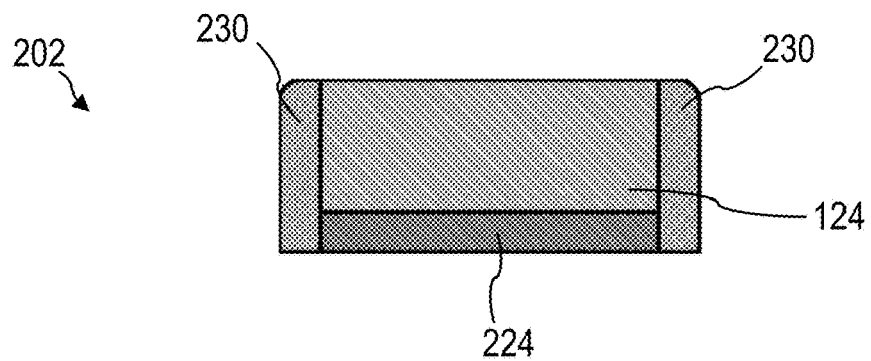
Figure 3L:
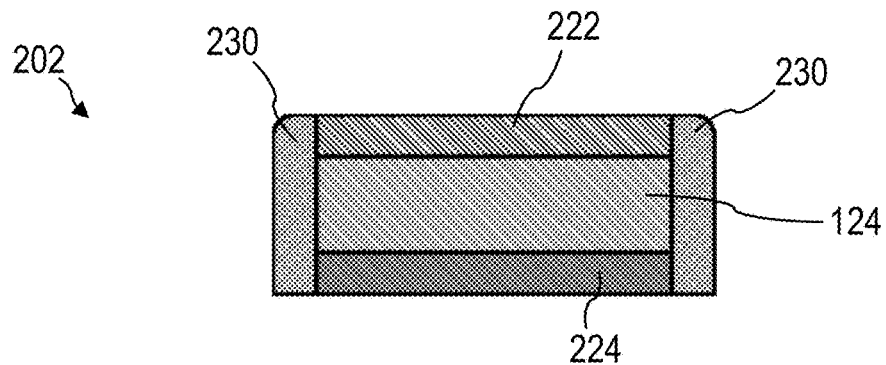
Figure 3M:
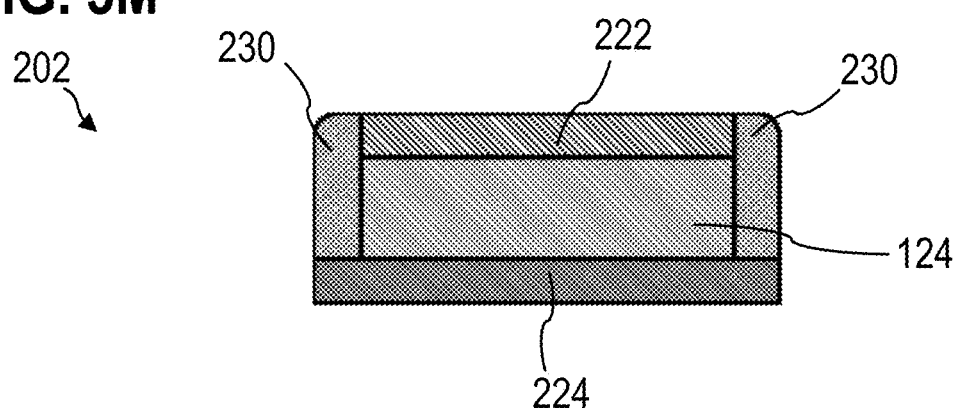
Figure 3N:
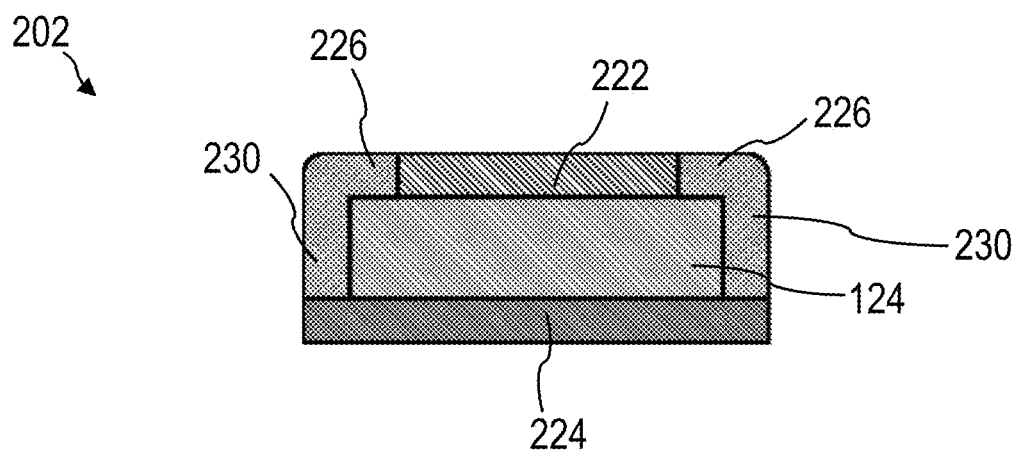
Figure 4A:
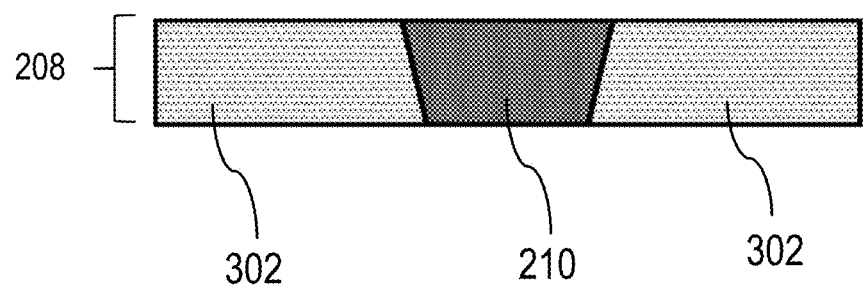
FIG. 4A to FIG. 4D each show a configuration of an insulating layer according to various aspects.
Figure 4B:
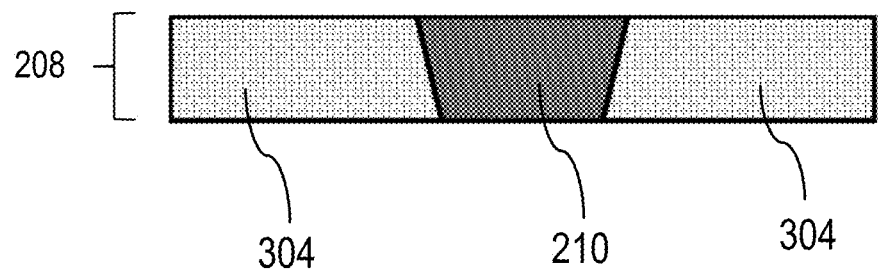
Figure 4C:
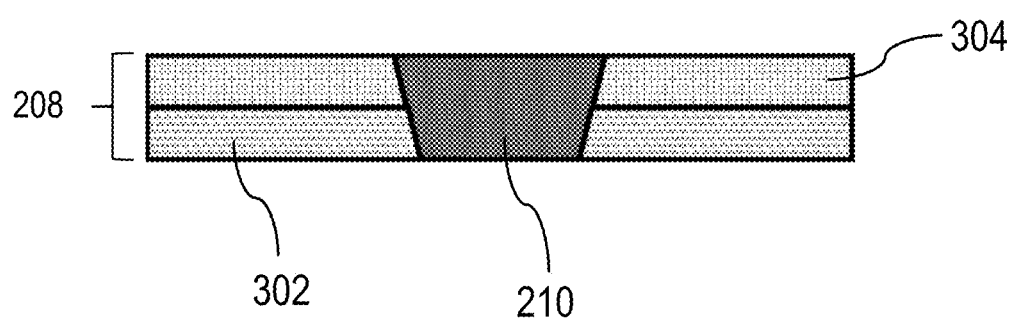
Figure 4D:
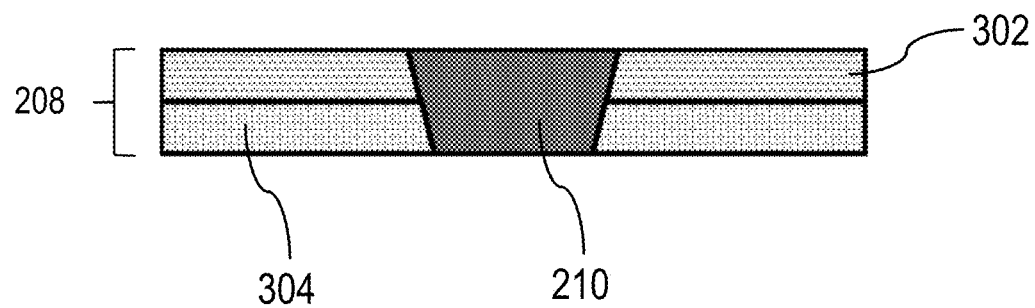
Figure 5A:
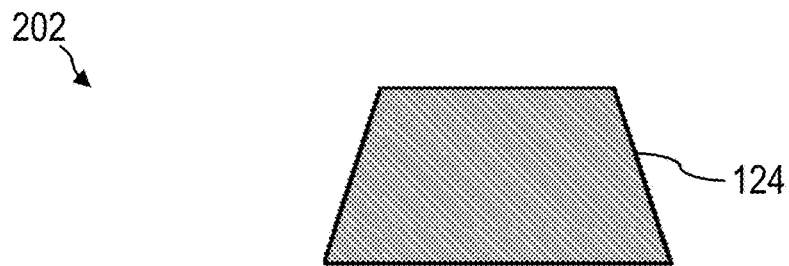
FIG. 5A to FIG. 5H each show a spontaneously polarizable capacitor structure according to various aspects.
Figure 5B:
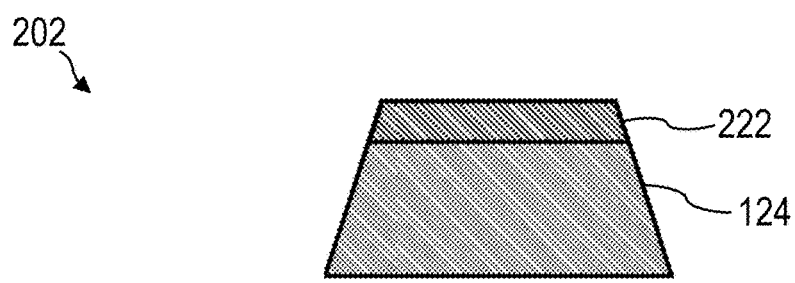
Figure 5C:
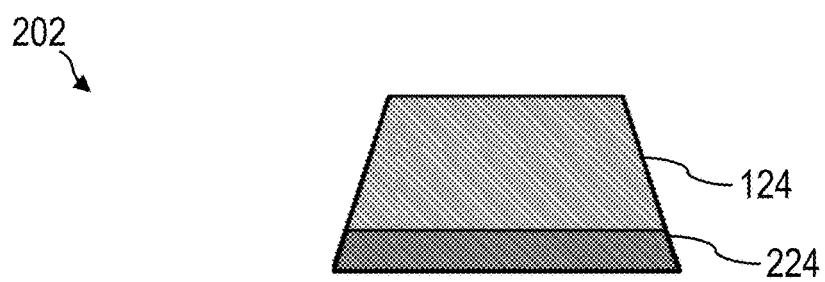
Figure 5D:
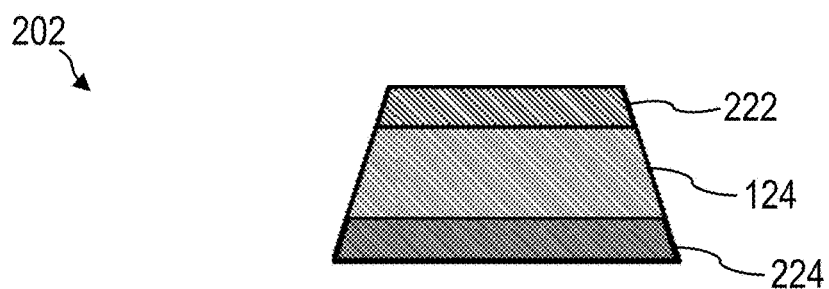
Figure 5E:
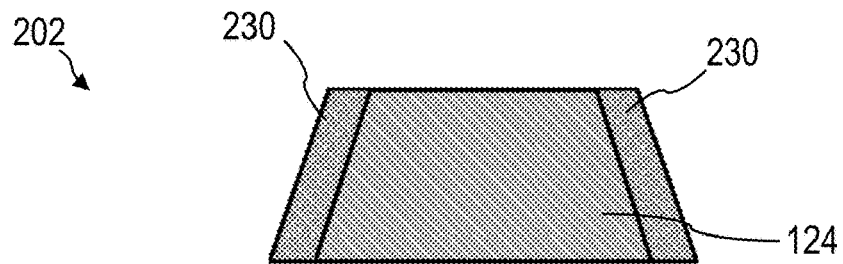
Figure 5F:
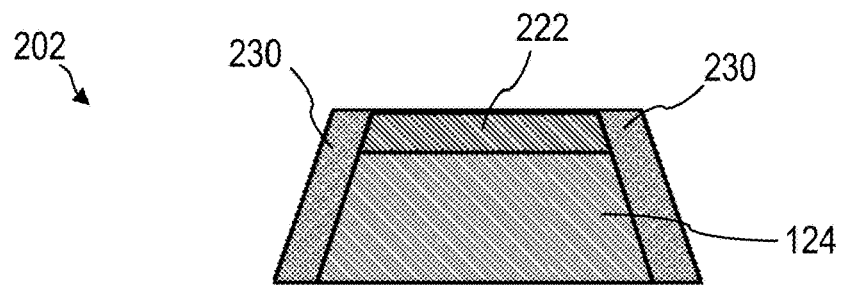
Figure 5G:
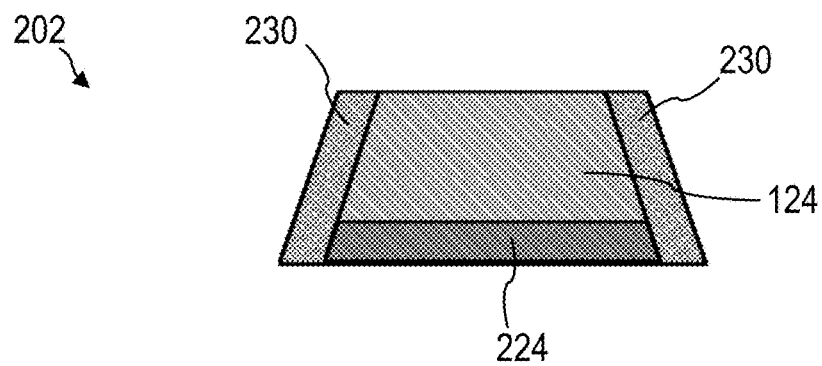
Figure 5H:
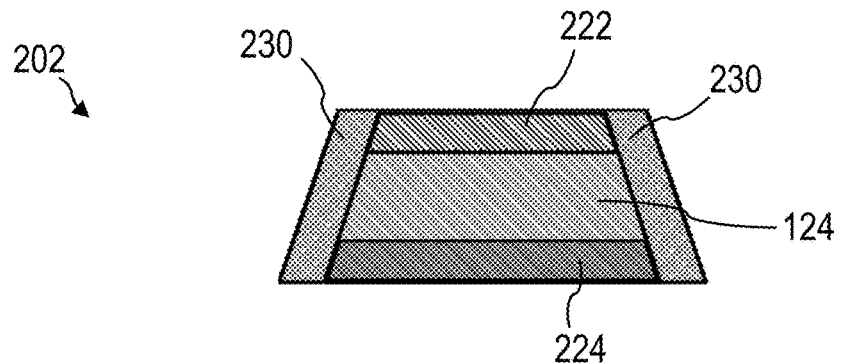

Various configurations of the spontaneously polarizable capacitor structure 202 are shown in FIG. 3A to FIG. 3N according to various aspects. As shown in FIG. 3A, the SPOC structure 202 may consist of the memory element 124. Hence, the memory element 124 may provide the SPOC structure 202. The SPOC structure 202 may include at least one electrode (e.g., an electrode layer). For illustration, the configurations of the SPOC structure 202 are exemplarily shown for a planar configuration with planar layers. It is noted that other shapes may be suitable as well, such as curved shapes, angled shapes, coaxially aligned shapes, as examples. In this case, any layer described herein may have a non-planar (e.g., curved) structure.

The SPOC structure 202 may include a first electrode layer 222 (see, for example FIGS. 3B, 3D to 3H, 3J, 3L, 3M, and 3N). The first electrode layer 222 (in some aspects referred to as top electrode layer) may be configured as top electrode. The first electrode layer 222 may be disposed over the memory element 124. For example, during manufacturing, the first electrode layer 222 may be formed after forming the memory element 124. The first electrode layer 222 may be disposed in direct contact with the memory element 124 (e.g., may be in direct physical contact with the memory element).

The SPOC structure 202 may include a second electrode layer 224 (see, for example FIGS. 3C, 3D, 3F, 3H, 3K, 3L, 3M, and 3N). The second electrode layer 224 (in some aspects referred to as bottom electrode layer) may be configured as bottom electrode or a floating gate. The second electrode layer 224 may be disposed below the memory element 124. For example, during manufacturing, the second electrode layer 224 may be formed prior to forming the memory element 124. The second electrode layer 224 may be disposed in direct contact with the memory element 124 (e.g., may be in direct physical contact with the memory element).

The first electrode layer 222 and/or the second electrode layer 224 may include or may consist of a metal, such as ruthenium (Ru), iridium (Ir), platinum (Pt), palladium (Pd), molybdenum (Mo), etc.

The first electrode layer 222 and/or the second electrode layer 224 may include or may consist of a metal nitride. The metal nitride may be, for example, a titanium-based alloy (e.g., TiN, e.g., Ti—C—N, e.g., Ti—Al—N, e.g., TiN—TaN) or tantalum-based alloy (e.g., TaN, e.g., Ta—C—N, e.g., TaN—TiN). According to various aspects, using metal nitride electrode(s) may increase a stability of a ferroelectric phase or antiferroelectric phase of the spontaneously polarizable material of the memory element 124, may reduce a leakage current, and/or may reduce a wake-up reduction of the SPOC structure 202.

The first electrode layer 222 and/or the second electrode layer 224 may include or may consist of an oxidation resistant metal (e.g., a noble metal). The oxidation resistant metal may have an electronegativity greater than 1.85 on the Pauling scale. The oxidation resistant metal may have a melting temperature greater than 1450° C. This may reduce an oxidation of the interface of the respective electrode (the first electrode layer 222 and/or the second electrode layer 224) and the memory element 124. The reduced interface oxidation may lead to (and/or may support a formation of) the predefined crystallographic texture of the spontaneously polarizable material. The oxidation resistant metal may include (e.g., consist of), for example, tungsten, platinum, iridium, ruthenium, palladium, osmium, rhodium, molybdenum, cobalt, rhenium, or nickel. According to various aspects, the first electrode layer 222 and/or the second electrode layer 224 may have a workfunction of the oxidation resistant metal equal to or greater than 5 eV. According to various aspects, using oxidation resistant metal electrode(s) in combination with a spontaneously polarizable material which includes transition-metal-oxides (e.g., as a high-k capacitor dielectric) may suppress a charge injection due to the workfunction equal to or greater than 5 eV and a comparatively high band-offset. The band-offset may be a conduction band-offset for electrons (between Fermi-level of the electrode and the conduction band of the dielectric layers) or a valance band offset for holes (between Fermi-level of the electrode and the valence band of the dielectric layers).

The first electrode layer 222 and/or the second electrode layer 224 may include or may consist of a metal oxide. According to various aspects, this may prohibit an oxidation scavenging from the spontaneously polarizable material of the memory element 124 to the electrode(s). Hence, this may prohibit an increase of the oxygen vacancy density of the spontaneously polarizable material in an interface region. According to various aspects, the metal oxide electrode(s) may provide oxygen to the spontaneously polarizable material (e.g., including one or more transition-metal-oxides) such that a stoichiometry of the spontaneously polarizable material is maintained. Illustratively, using a metal oxide as an electrode material may serve as an oxygen reservoir for the spontaneously polarizable material. The metal oxide may include (e.g., consist of), for example, iridium oxide, ruthenium oxide, osmium oxide, molybdenum oxide, indium tin oxide, strontium ruthenium oxide, strontium titanate, and/or lanthanum strontium manganite.

According to various aspects, the first electrode layer 222 and/or the second electrode layer 224 may consist of an electrode stack including two or more electrode layers. Each of the two or more electrode layers may include or may consist of a metal nitride, an oxidation resistant metal, or a metal oxide. As an example, the first electrode layer 222 may include a first layer and a second layer. The first layer may consist of an oxidation resistant metal at the interface to the memory element suppress a charge injection. The second layer may be disposed over the first layer (e.g., in direct contact with the first layer or one or more other layers may be disposed between the first layer and the second layer) and may consist of a metal nitride. The metal nitride may, during manufacturing the memory cell arrangement, serve as an etch stop and may also increase a stability of a ferroelectric phase or antiferroelectric phase of the spontaneously polarizable material and/or may reduce a leakage current of the SPOC structure 202. As exemplarily described for the first electrode layer 222, the first electrode layer 222 and/or the second electrode layer 224 may consist of more than one electrode material combined such that various effects are achieved. The second electrode layer 224 may have a first side directly contacting the memory element 124 and a second side opposite to the first side. According to various aspects, the second electrode layer 224 may include a diffusion barrier disposed over the second side. The diffusion barrier may be configured to reduce (e.g., prohibit) a diffusion of one or more metals from an underlying contact (e.g., the bottom electrode contact described herein, a contact pad, or any other kind of metal contact) into the second electrode layer 224. For example, the second electrode layer 224 may include a platinum layer configured as diffusion barrier.

According to various aspects, at an interface between the second electrode layer 224 and the memory element 124, the second electrode layer 224 may include an electrode material having a predefined crystallographic texture (e.g., a (001)-texture or a (111)-texture). Hence, a textured layer may be disposed at the interface. The electrode may be polycrystalline including a plurality of crystallites and the crystallites may have the predefined crystallographic texture. As an example, a majority of the crystallites (e.g., at least 50%, e.g., at least 75%, e.g., at least 90% of the crystallites) may be oriented along the same direction and therefore define a crystallographic texture. The term "texture", as used herein, may describe a crystallographic texture as a property of a material or of a layer including a material. The crystallographic texture may be related to a distribution of crystallographic orientations of crystallites of a polycrystalline material. The crystallographic texture may be described by an orientation distribution function (ODF). A crystallographic texture of a layer, as referred to herein, may describe a preferred orientation of the crystallites of a polycrystalline material with reference to a surface of the layer. A crystallographic texture of a layer, as referred to herein, may describe a preferred orientation of the crystallites of a polycrystalline material with reference a direction of an external electric field caused by a voltage applied to electrodes contacting the layer. In other words, a material or layer consisting of crystallites may have no texture in the case that the orientations of the crystallites are randomly distributed. The material or layer may be regarded as a textured material or layer in the case that the orientations of the crystallites show one or more preferred directions. Using a second electrode layer 224 including a textured electrode layer (e.g., as a seed layer) at the interface to the spontaneously polarizable material may, during manufacturing, allow to generate a texture of the spontaneously polarizable material and, thus, a memory element 124 with a predefined crystallographic texture. The generating of the predefined crystallographic texture of the spontaneously polarizable material allows for an efficient polarization behavior of the spontaneously polarizable material. An electrode layer having a predefined texture may allow for an efficient electrical behavior (e.g., a lower resistance, a higher conductivity, an enhanced barrier property to reduce diffusion of other atoms through the electrode layer, as examples, compared to a similar but untextured electrode layer).

According to various aspects, the electrode material (e.g., of the first electrode layer 222 and/or the second electrode layer 224) may be configured to induce stress or strain (e.g., compressive stress or tensile stress) into the memory element 124. This may, for example, allow to control the predefined crystallographic texture of the spontaneously polarizable material. Therefore, the coefficient of thermal expansion of the respective electrode layer may be different from the coefficient of thermal expansion of the memory element 124. During a manufacturing of the memory cell arrangement, the SPOC structure 202 may be thermally annealed at elevated temperatures (e.g., higher than 400° C.) and subsequently cooled. In an example, the first electrode layer 222 and/or the second electrode layer 224 may include or may consist of an electrode material having a coefficient of thermal expansion, a, smaller than a coefficient of thermal expansion of the spontaneously polarizable material which may induce tensile stress in the spontaneously polarizable material during cooling the spontaneously polarizable material. In another example, the first electrode layer 222 and/or the second electrode layer 224 may include or may consist of an electrode material having a coefficient of thermal expansion, a, greater than a coefficient of thermal expansion of the spontaneously polarizable material which may induce compressive stress in the spontaneously polarizable material during cooling the spontaneously polarizable material. According to various aspects, the stress or strain induced into the memory element 124 may be controlled by the thickness of the respective electrode layer. According to various aspects, the thickness of the second electrode layer 224 may be substantially equal to the thickness of the first electrode layer 222 to induce a symmetric stress profile of the memory element 124.

The spontaneously polarizable capacitor structure 202 may include the first electrode layer 222 and the second electrode layer 224. The first electrode layer 222 may be disposed on a first side of the memory element 124 and the second electrode layer 224 may be disposed on a second side of the memory element 124 opposite to the first side. The first electrode layer 222 and the second electrode layer 224 may consist of the same electrode material or may consist of different electrode materials (e.g., selected from the electrode materials listed above).

According to various aspects, one or more interlayers (not shown) may be disposed within the memory element 124. For example, the one or more interlayers may be disposed between (e.g., in direct contact with) layers of the spontaneously polarizable material. Thus, two spontaneously polarizable layers consisting of spontaneously polarizable material may be separated from one another by at least one of the one or more interlayers. Each interlayer of the one or more interlayer may have a thickness of 1 nm or less (e.g., in the range from about 0.2 nm to about 1 nm). According to various aspects, at least one of the one or more interlayers may be an insulating layer. The insulating layer may include or may consist of aluminum oxide (e.g., may consist of aluminum oxide or a compound including aluminum oxide, such as $TaO_x$—$Al_2O_3$, $NbO_x$—$Al_2O_3$, or $TaO_x$—$NbO_z$—$Al_2O_3$). The insulating layer may include or may consist of dielectric hafnium oxide. In an example, the spontaneously polarizable material may include or may consist of ferroelectric or antiferroelectric hafnium oxide and an insulating layer consisting of dielectric hafnium oxide may be disposed between two layers of ferroelectric or antiferroelectric hafnium oxide. For example, variations of the stoichiometry of the hafnium oxide may generate the ferroelectric or antiferroelectric hafnium oxide layers and the dielectric hafnium oxide layer(s). According to various aspects, a band-gap of the insulating layers may be greater than a band-gap of the spontaneously polarizable material. This may reduce (e.g., prevent) a movement of electrons and/or holes when injected to the conduction band or valence band. The insulating layers may prevent a growth of grain boundaries from the first electrode layer 222 to the second electrode layer 224. This may support the formation of the memory element 124 having a predefined texture of the spontaneously polarizable material.

According to various aspects, a lateral extension of the first electrode layer 222 may be less than a lateral extension of the memory element 124, as shown in FIGS. 3A to 3H. The first electrode layer 222 and the memory element 124 may be in direct contact with each other and a contact plane may correspond to the plane in which the first electrode layer 222 and the memory element 124 are contacting each other. The extension of the first electrode layer 222 in a direction parallel to the contact plane may be less than the extension of the memory element 124 in the direction parallel to the contact plane. The contact plane may be substantially parallel to a surface of a wafer on which the memory cell arrangement is formed. As described herein, the memory element 124 and the first electrode layer 222 (and the second electrode layer 224) may have any suitable shape (e.g., may be curved); hence, in this case, the contact plane may also be curved. The SPOC structure 202 may have a trapezoidal shape. The trapezoidal shape may directly result in a first electrode layer 222 having a smaller lateral extension than the memory element 124. Various configurations of the spontaneously polarizable capacitor structure 202 having a trapezoidal shape are shown in FIG. 5A to FIG. 5H according to various aspects (e.g., having except for the trapezoidal shape similar configurations as the spontaneously polarizable capacitor structures 202 shown in FIG. 3A to FIG. 3N).

According to various aspects, the lateral extension of the first electrode layer 222 may be smaller than the lateral extension in the second electrode layer 224 (in the direction parallel to the contact plane). When, in operation, a voltage is applied to the first electrode layer 222 and the second electrode layer 224, the smaller extension of the first electrode layer 222 may result in an electric field within a smaller portion of the spontaneously polarizable material of the memory element 124. Hence, the volume to be polarized is smaller as compared to electrodes having the same lateral extension. This may, for example, reduce an amount of charge stored in the memory element 124. For example, in the case that the memory element 124 consists of hafnium oxide, zirconium oxide or hafnium zirconium oxide, reducing the amount of stored charge may improve the electric properties of the memory cell (e.g., reducing a leakage current) and the reduced amount may still be sufficient to read the memory cell.

According to various aspects, the SPOC structure 202 may include one or more encapsulation structures. The SPOC structure 202 may include a first encapsulation structure 226. As shown in FIGS. 3E and 3F, due to the smaller extension of the first electrode layer 222, a portion of the memory element 124 may not be in direct contact with the first electrode layer 222. The first encapsulation structure 226 (in some aspects referred to as top spacer) may be disposed over and in direct contact with this portion of the memory element 124. The SPOC structure 202 may include a second encapsulation structure 230 (in some aspects referred to as sidewall spacer). The second encapsulation structure 230 may be disposed to laterally surround the memory element 124 (and optionally the first electrode layer 222 and/or the second electrode layer 224), as shown in FIG. 3I to FIG. 3N. Exemplary configurations in which the second encapsulation structure 230 laterally surrounds the memory element 124 and the first electrode layer 222, but not the second electrode layer 224 is shown in FIG. 3M and FIG. 3N. FIG. 3N shows an exemplary configuration in which the first encapsulation structure 226 laterally surrounds the first electrode layer 222 and the second encapsulation structure 230 laterally surrounds the memory element 124 and the first encapsulation structure 226, but not the second electrode layer 224. The SPOC structure 202 may include a third encapsulation structure 228. The third encapsulation structure 228 may be a combination of the first encapsulation structure 226 and the second encapsulation structure 230, as shown in FIG. 3G and FIG. 3H. The second encapsulation structure 230 and/or the third encapsulation structure 228 may be disposed such that there is no direct contact between the memory element 124 and the embedding structure 204. Various configurations of the one or more encapsulation structures are described with reference to FIG. 2G to FIG. 2I.

Figure 2B:
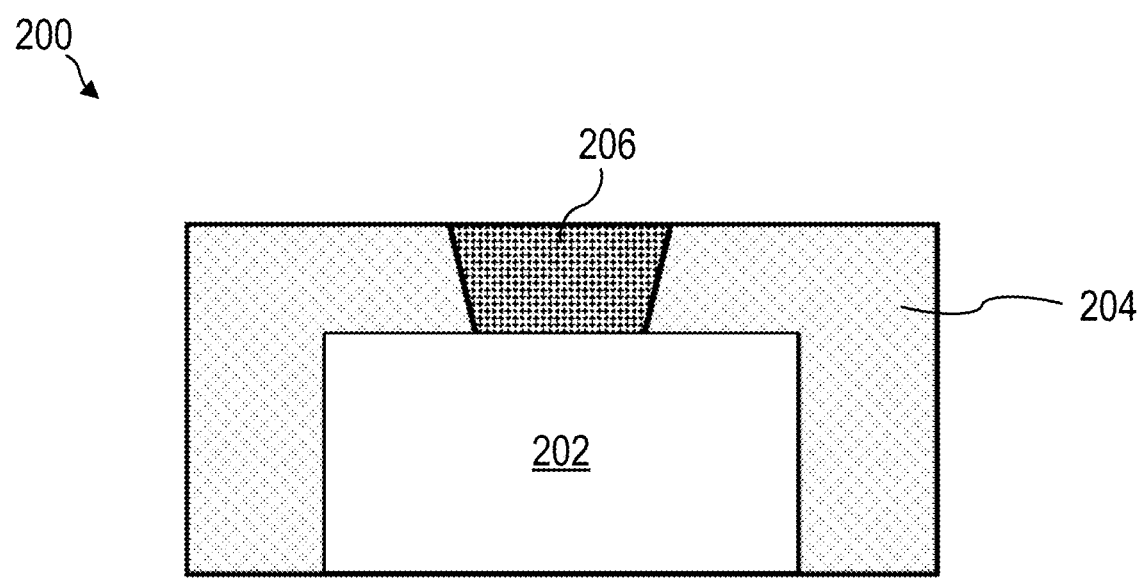

With reference to FIG. 2B, the memory cell 200 may further include a first electrode contact 206 (in some aspects referred to as top electrode contact). The first electrode contact 206 may be disposed at least partially within the embedding structure 204. The first electrode contact 206 may be electrically conductively connected to the SPOC structure 202. As an example, the SPOC structure 202 may include the first electrode layer 222 and the first electrode contact 206 may be electrically conductively connected to the first electrode layer 222 (e.g., may be in direct contact with the first electrode layer 222). In this case, the first electrode contact 206 and the first electrode layer 222 may provide a first capacitor electrode of the SPOC structure 202. As another example, the SPOC structure 202 may not include the first electrode layer 222 and the first electrode contact 206 may be electrically conductively connected to the memory element 124 (e.g., may be in direct contact with the memory element 124). In this case, the first electrode contact 206 may provide a second capacitor electrode of the SPOC structure 202. The first electrode contact 206 may include more than one layer (e.g., the electrode material and a seed layer disposed between the electrode material and the memory element 124). As described herein, the memory cell 200 may be integrated between subsequent metallization layers (e.g. 402B and 402D, 402E). According to some aspects, the first electrode contact 206 may be part of (e.g., manufactured jointly with) the subsequent metallization layer (e.g. 402D). In this case, the first electrode contact 206 may, for example, consist of copper (Cu). According to other aspects, the first electrode contact 206 may be manufactured prior to the subsequent metallization layer (e.g. 402D). In this case, the first electrode contact 206 may, for example, include or consists of another material than copper, such as tungsten or titanium nitride.

Figure 2C:
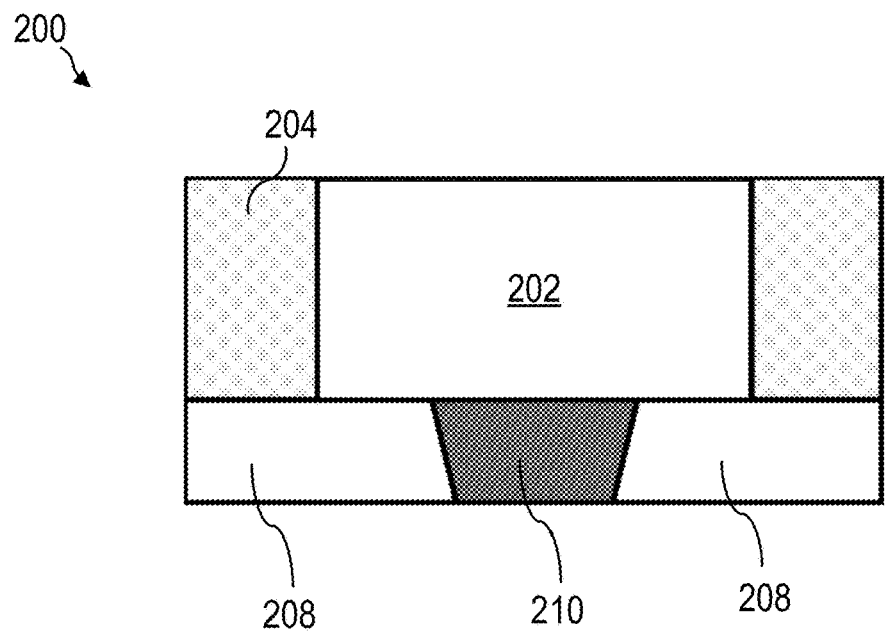

With reference to FIG. 2C, the memory cell 200 may include second electrode contact 210 (in some aspects referred to as bottom electrode contact). The second electrode contact 210 may be electrically conductively connected to the SPOC structure 202. As an example, the SPOC structure 202 may include the second electrode layer 224 and the second electrode contact 210 may be electrically conductively connected to the second electrode layer 224 (e.g., may be in direct contact with the second electrode layer 224). In this case, the second electrode contact 210 and the second electrode layer 224 may provide a second capacitor electrode of the SPOC structure 202. As another example, the SPOC structure 202 may not include the second electrode layer 224 and the second electrode contact 210 may be electrically conductively connected to the memory element 124 (e.g., may be in direct contact with the memory element 124). In this case, the second electrode contact 210 may provide the second capacitor electrode of the SPOC structure 202. According to some aspects, the second electrode contact 210 may be part of (e.g., manufactured jointly with) the preceding metallization layer 402B. In this case, the second electrode contact 210 may, for example, consist of copper (Cu). According to other aspects, the second electrode contact 210 may be manufactured after the preceding metallization layer 402B. In this case, the second electrode contact 210 may, for example, include or consists of another material than copper, such as tungsten or titanium nitride.

Figure 2D:
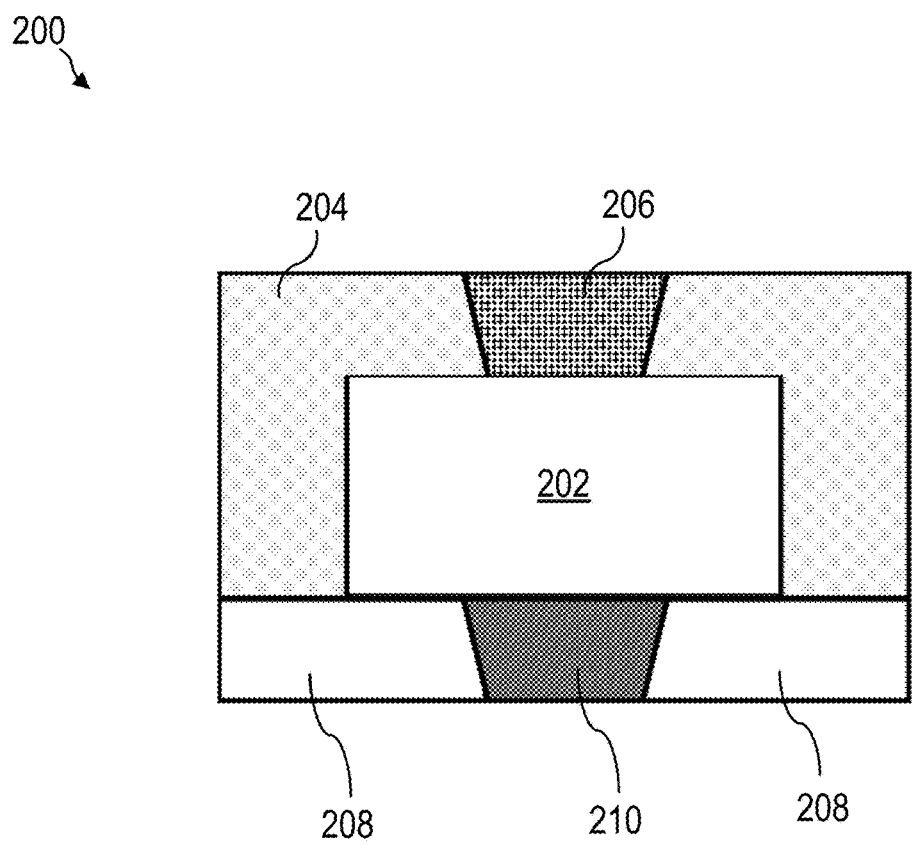

According to various aspects, the memory cell 200 may include the first electrode contact 206 and the second electrode contact 210 (see, for example, FIG. 2D). The first electrode contact 206 may be disposed on a first side of (e.g., in direct contact with) the SPOC structure 202 and the second electrode contact 210 may be disposed on a second side of (e.g., in direct contact with) the SPOC structure 202 opposite to the first side.

The memory cell 200 may include an insulating layer 208. The insulating layer 208 may be disposed below the SPOC structure 202. For example, the insulating layer 208 may be disposed between the SPOC structure 202 and the preceding metallization layer 402B. The insulating layer 208 may be disposed between the embedding structure 204 and the preceding metallization layer 402B. During manufacturing, the insulating layer 208 may be formed prior to forming the SPOC structure 202 and/or prior to forming the embedding structure 204. The second electrode contact 210 may be disposed at least partially within the insulating layer 208.

Various configurations of the insulating layer 208 are shown in FIG. 4A to FIG. 4D according to various aspects.

According to various aspects, the insulating layer 208 may be (see, for example, FIG. 4A) or may include (see, for example, FIG. 4C or FIG. 4D) an electrically insulating layer 302. The electrically insulating layer 302 may consist of a material configured to reduce a leakage current from the second electrode contact 210 into the electrically insulating layer 302. For example, the electrically insulating layer 302 may include or may consist of a high-k dielectric material, such as silicon oxynitride (SiON).

According to various aspects, a part of the insulating layer 208 (see, for example, FIG. 4B) or the complete insulating layer 208 (see, for example, FIG. 4C or FIG. 4D) may be configured as a heat barrier 304 (in some aspects referred to as heat barrier layer or thermal barrier or thermally insulating layer). The heat barrier 304 may be configured as a heat barrier to reduce a heat transfer between portions of a memory cell arrangement disposed on opposite sides of the heat barrier 304. For example, the heat barrier 304 may be configured to reduce a heat transfer from the SPOC structure 202 to the underlying one or more metallization layers (e.g., 402A, 402B). The heat barrier 304 may be a thermally insulating layer. The heat barrier 304 may be configured to reduce a heat transfer (e.g., a transfer of thermal energy between structures of differing temperature) between the SPOC structure 202 disposed on a first side of the heat barrier 304 and the structures disposed on a second side of the heat barrier 304 opposite the first side. The heat barrier 304 may be configured to reduce a heat transfer between the SPOC structure 202 and the structures disposed below the heat barrier 304 as compared to a heat transfer occurring without the heat barrier 304. Hence, the heat barrier 304 may be configured to reduce a thermal conduction between the SPOC structure 202 and the one or more metallization layers disposed below the heat barrier 304. For example, the heat barrier 3044 may include or may consist of a material having at 25° C. a thermal conductivity of less than 1 $W \cdot m^{-1} \cdot K^{-1}$. The heat barrier 304 may include or may consist a porous material. The porous material may have a porosity greater than 60% (e.g., greater than 70%, e.g., greater than 80%, e.g., greater than 90%). According to various aspects, the heat barrier 304 may include or may consist of an aerogel and/or a (e.g., porous) low-k dielectric material. It is understood by those skilled in the art that (dense) polycrystalline films are not suitable heat barriers. Thus, it is noted that, for example, polycrystalline silicon (poly-Si), epitaxial silicon, and/or dense silicon films are not suitable materials for the heat barrier 304. Hence, according to various aspects, the heat barrier 304 may consist of a porous material. The higher the porosity the lower the thermal conductivity may be.

According to various aspects, the heat barrier 304 may have a thermal conductivity less than the thermal conductivity of silicon oxide and/or silicon nitride. According to some aspects, the insulating layer 208 may include the electrically insulating layer 302 and the thermally insulating layer configured as heat barrier 304 (see, for example FIG. 4C and FIG. 4D). The thermally insulating layer may have a thermal conductivity less than a thermal conductivity of the electrically insulating layer (e.g., a thermal conductivity less than the thermal conductivity of a high-k dielectric material).

Figure 2E:
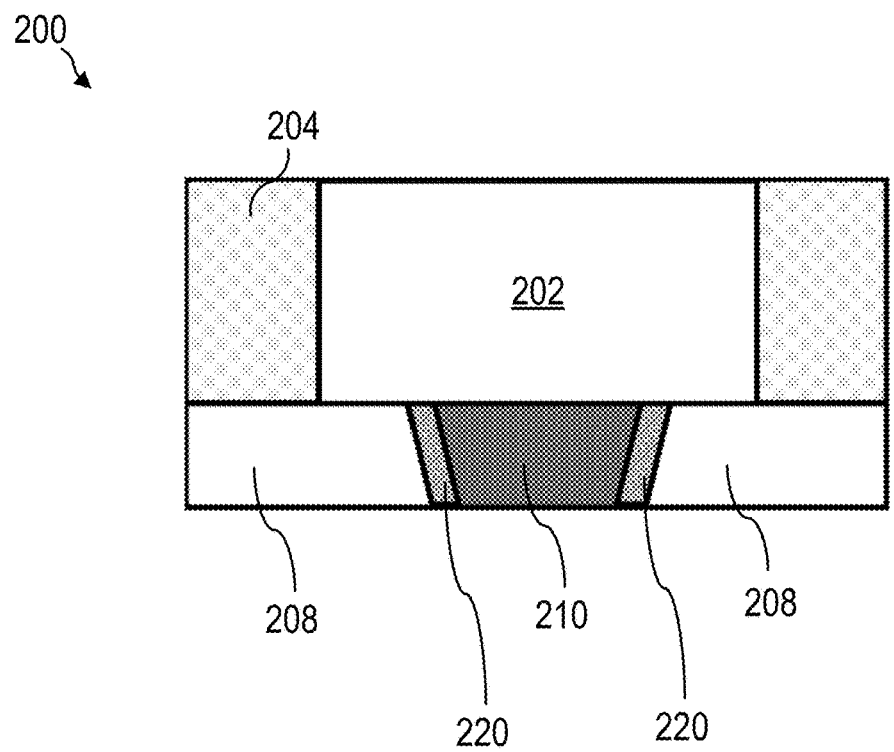
Figure 2F:
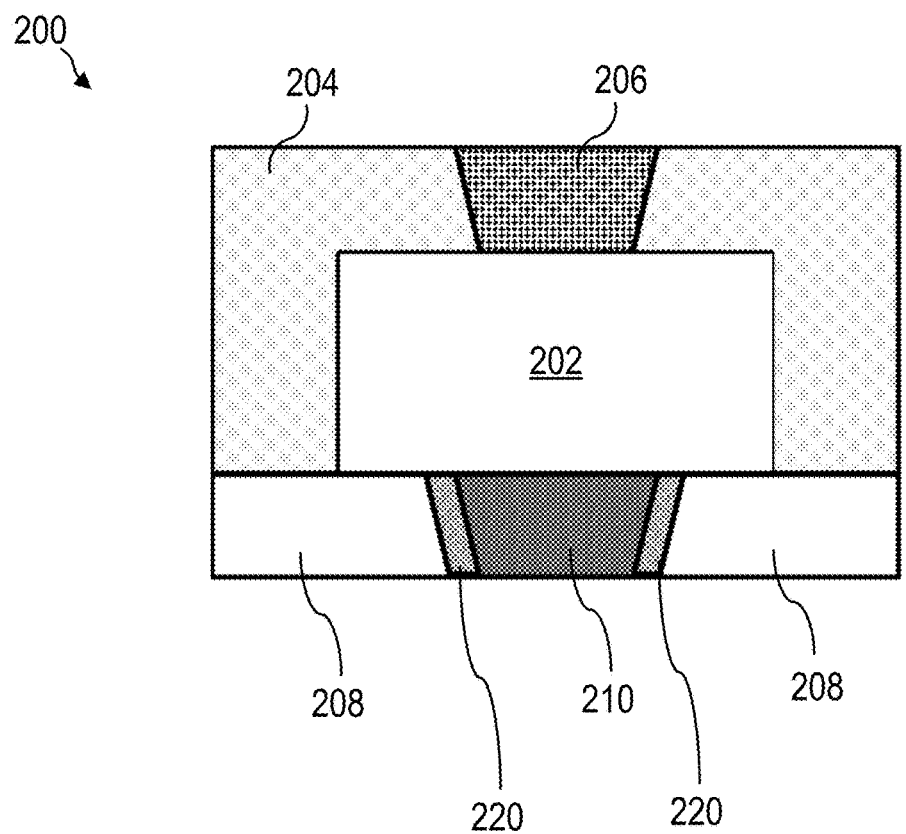

According to some aspects, the insulating layer 208 (e.g., the electrically insulating layer 302 and/or the heat barrier 304) may be disposed in direct contact with the second electrode contact 210 (see, for example, FIG. 2C and FIG. 2D). According to other aspects, an encapsulation structure, such as a fourth encapsulation structure 220, may be disposed in a gap between the second electrode contact 210 and the insulating layer 208 (see, for example, FIG. 2E and FIG. 2F). For example, the fourth encapsulation structure 220 (in some aspects referred to as bottom electrode encapsulation) may laterally surround (e.g., completely laterally surround) the second electrode contact 210 such that there is no direct contact between the second electrode contact 210 and the insulating layer 208. The fourth encapsulation structure 220 may include or may consist of a high-k dielectric material for electrically insulating the second electrode contact 210. This may reduce an amount of leakage currents flowing from or to the second electrode contact 210. In the case that the fourth encapsulation structure 220 is not provided, it may be required that the insulating layer 208 includes or consists of a high-k dielectric material in order to reduce leakage currents. However, in the case that the fourth encapsulation structure 220 is provided (e.g., as a high-k dielectric barrier), the fourth encapsulation structure 220 reduces potential leakage currents and the insulating layer 208 may include or may consist of a low-k dielectric material (e.g., serving as the electrically insulating layer and/or the thermally insulating layer). Using a low-k dielectric material instead of a high-k dielectric material may reduce the manufacturing costs significantly. The low-k dielectric material may have a comparatively low thermal conductivity. This may allow the heat barrier 304 to have a thickness less than 50 nm (e.g., a thickness in the range from about 5 nm to about 30 nm). This may, for example, reduce the manufacturing costs.

Figure 2G:
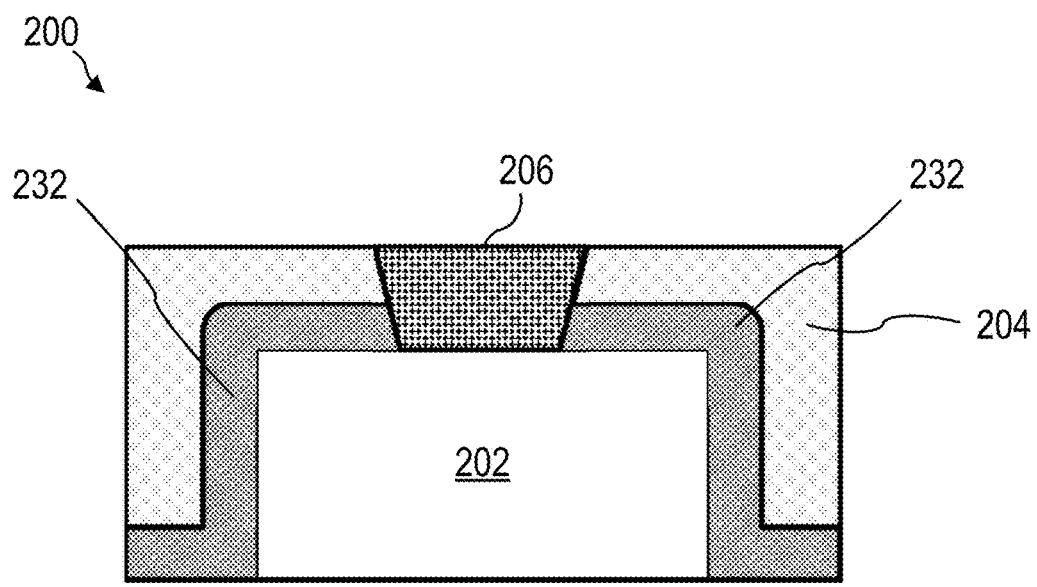
Figure 2H:
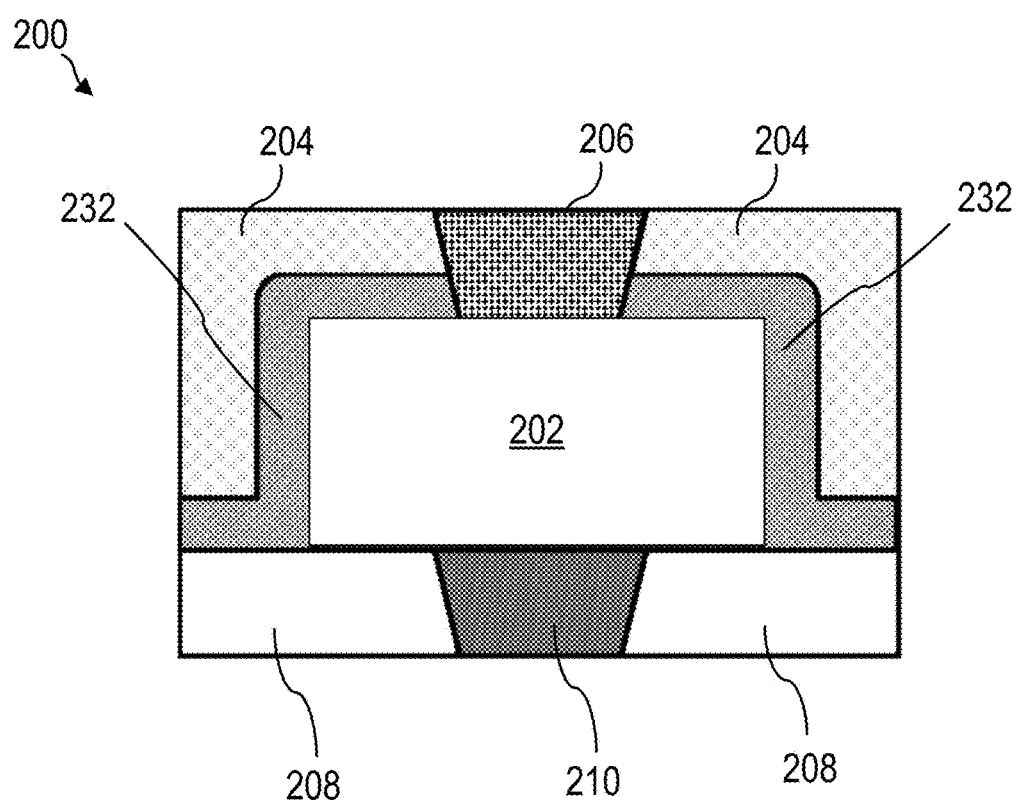
Figure 2I:
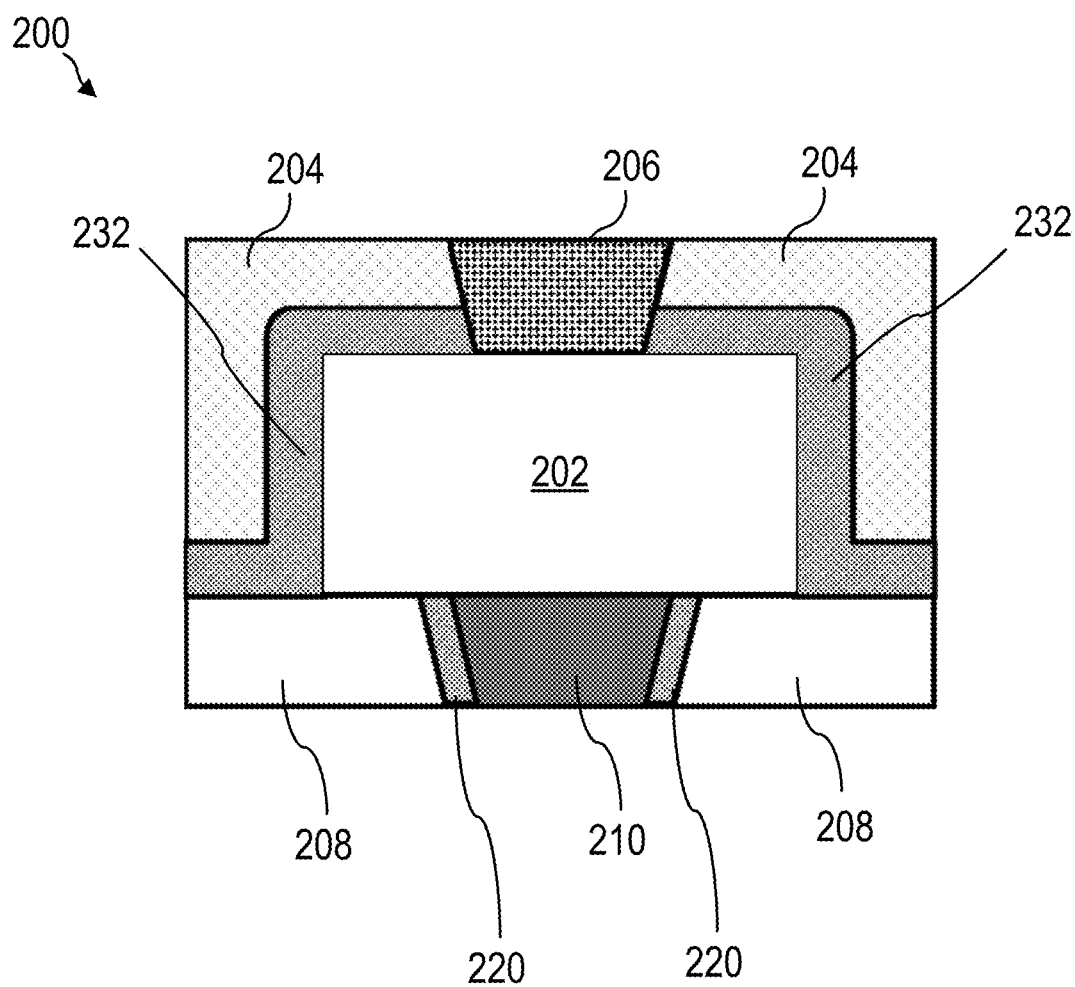
Figure 2J:
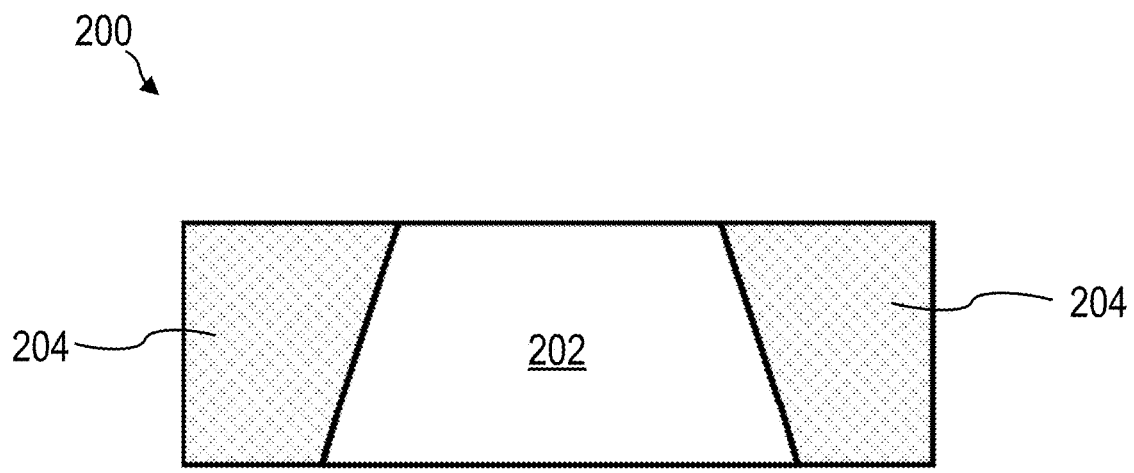
Figure 2K:
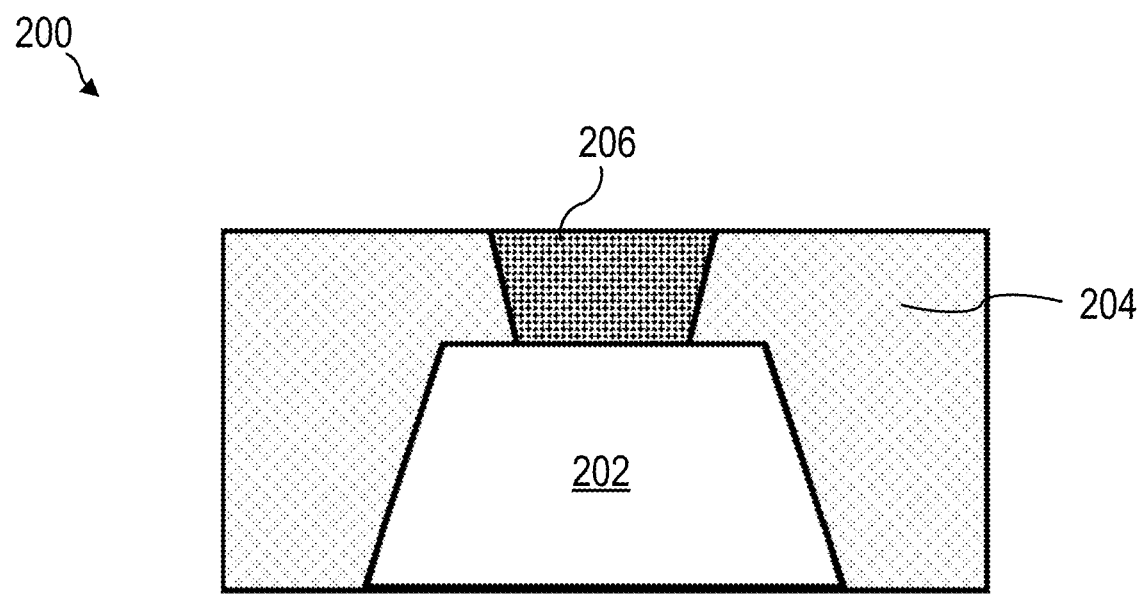
Figure 2L:
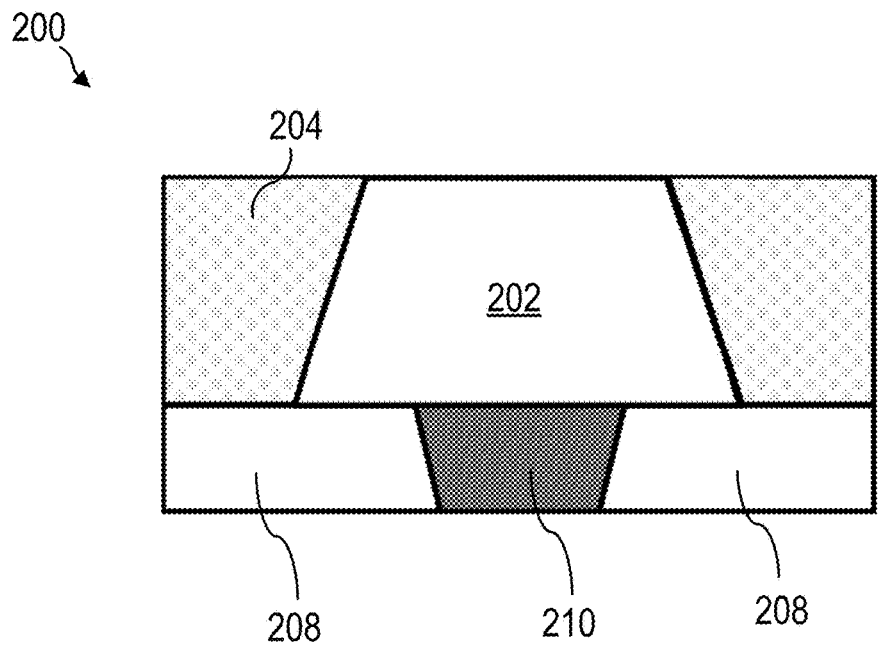
Figure 2M:
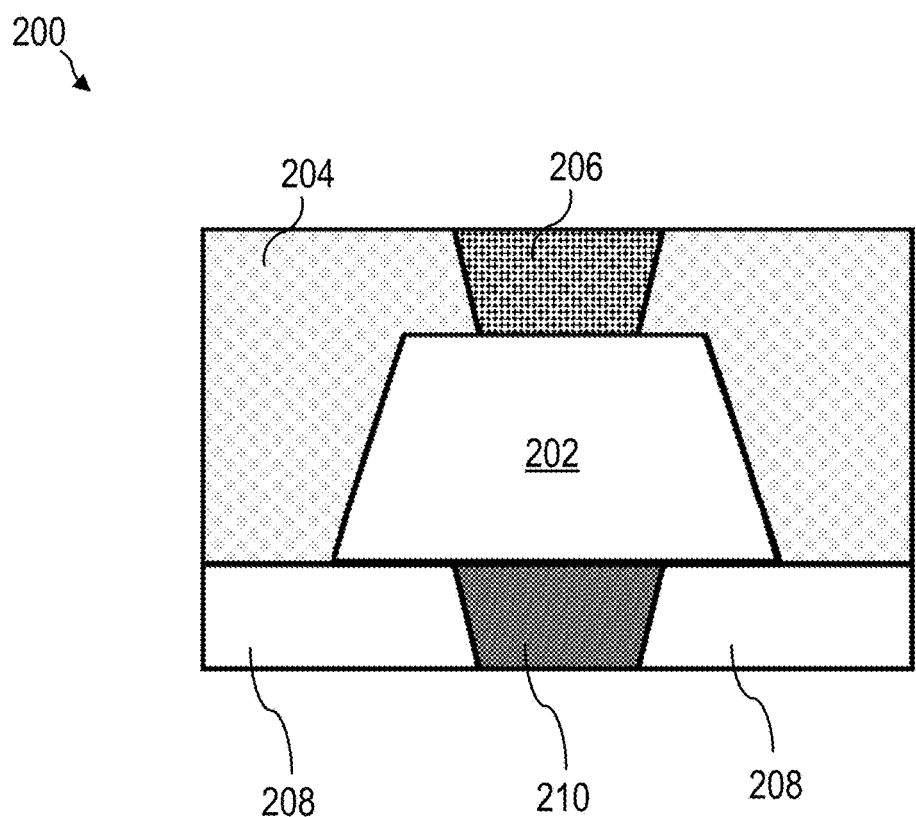
Figure 2N:
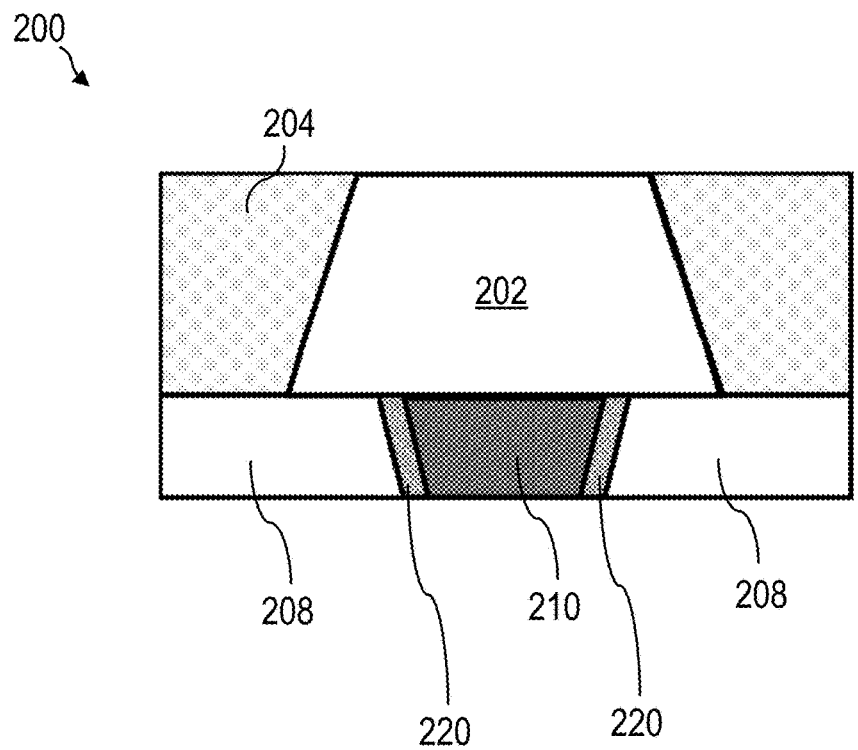
Figure 2O:
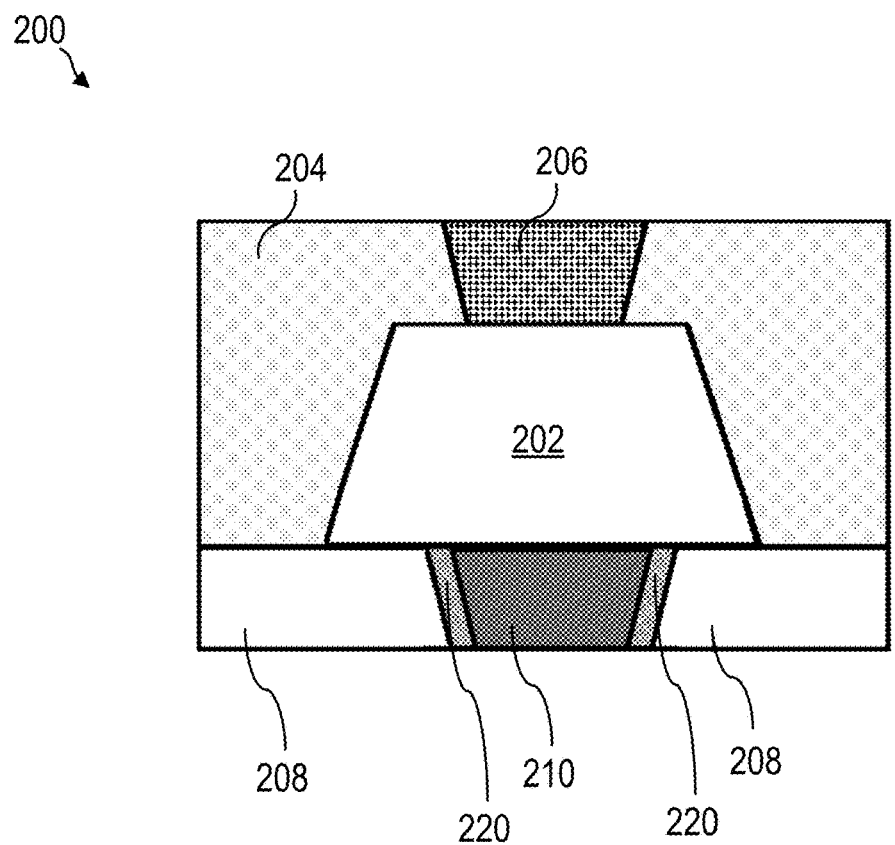
Figure 2P:
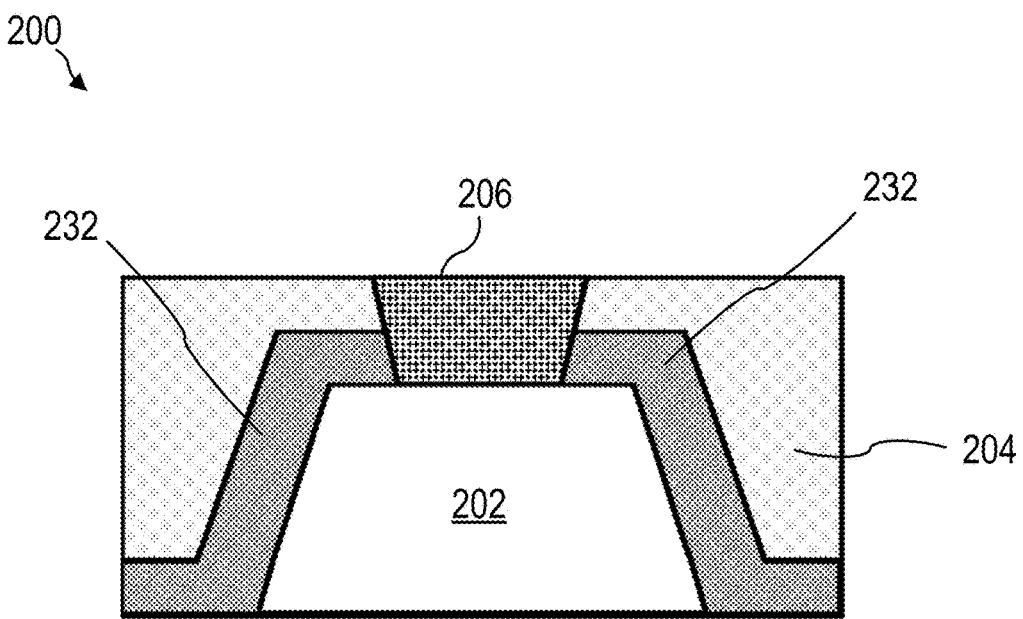
Figure 2Q:
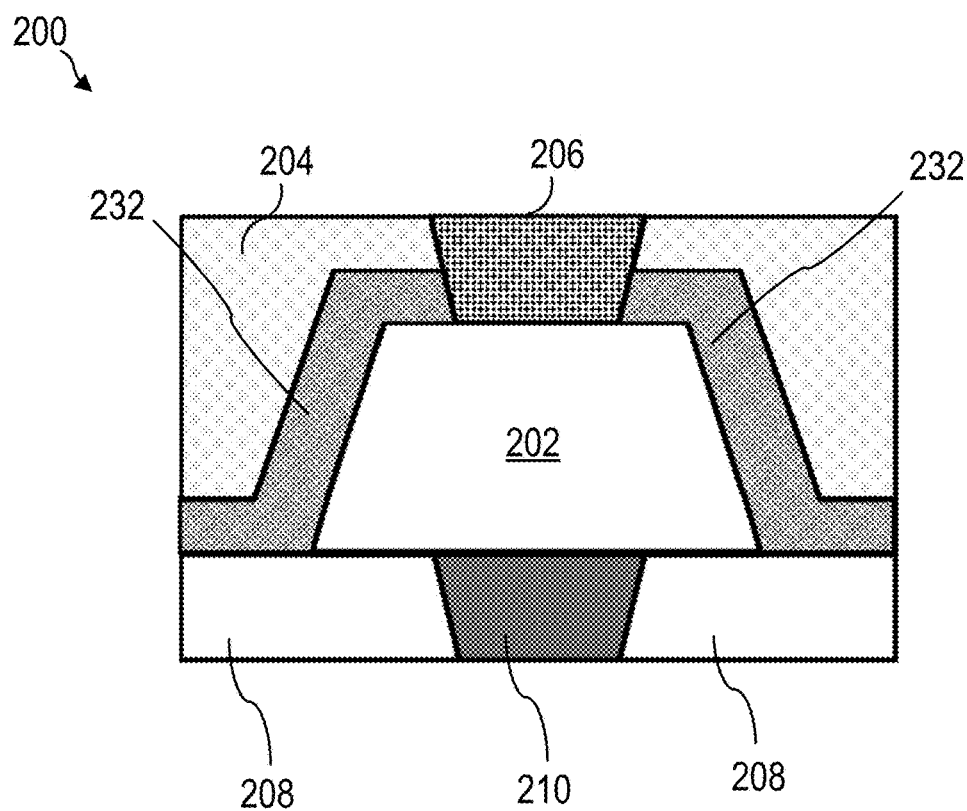
Figure 2R:
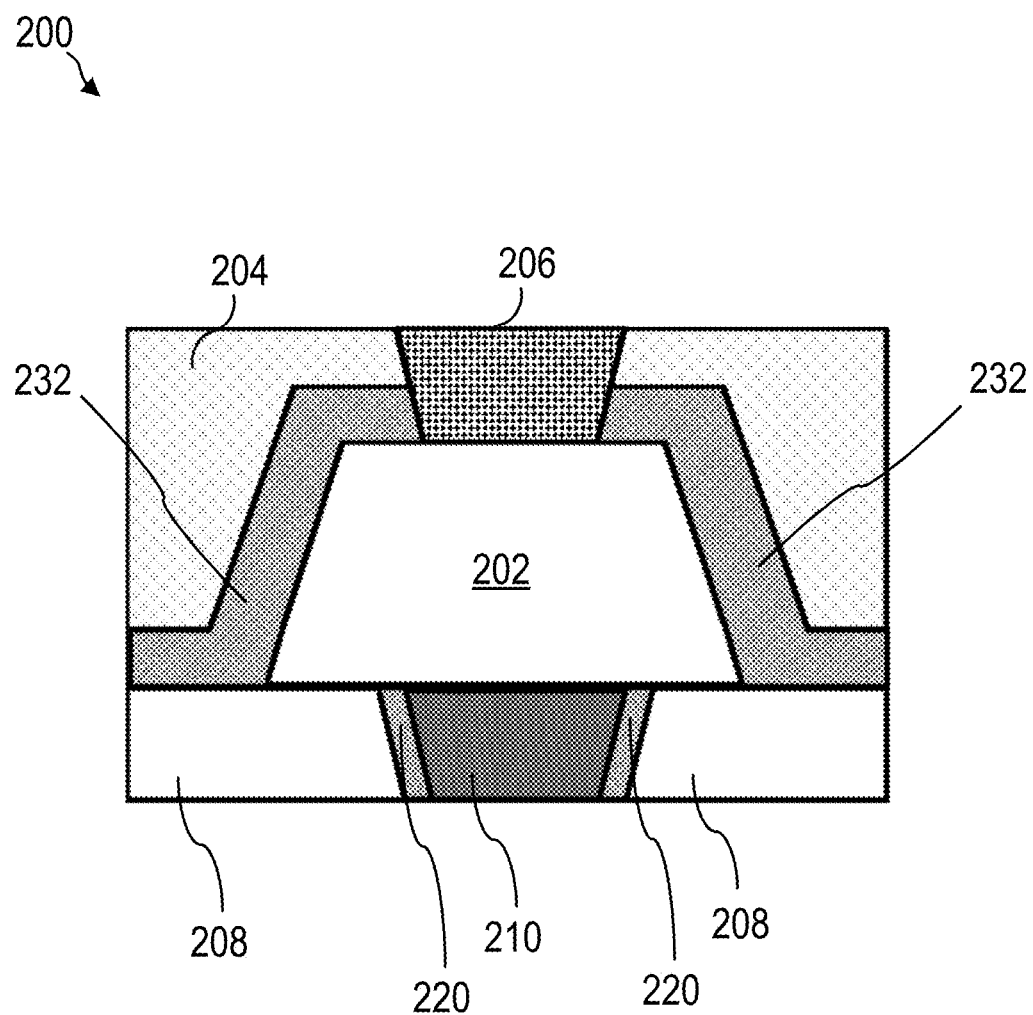

With reference to FIG. 2G to FIG. 2I, the memory cell 200 may include a fifth encapsulation structure 232. The fifth encapsulation structure 232 may be disposed in a gap between the SPOC structure 202 and the embedding structure 204 (e.g., such that there is no direct contact between the SPOC structure 202 and the embedding structure 204. According to some aspects, the SPOC structure 202 may not include the second encapsulation structure 230 and the third encapsulation structure 228 and only the fifth encapsulation structure 232 may be disposed in a gap between the memory element 124 and the embedding structure 204. According to other aspects, the SPOC structure 202 may include the second encapsulation structure 230 or the third encapsulation structure 228. In this case, the second encapsulation structure 230 or the third encapsulation structure 228 (e.g., serving as an inner spacer) and the fifth encapsulation structure 232 (e.g., serving as an outer spacer) may be disposed in the gap between the memory element 124 and the embedding structure 204. Illustratively, a double spacer structure may be provided between the memory element 124 and the embedding structure 204.

Each of the encapsulation structures described herein (e.g., the first encapsulation structure 226, the second encapsulation structure 230, the third encapsulation structure 228, the fourth encapsulation structure 220, and/or the fifth encapsulation structure 232) may include one or more layers. Each of the one or more layers may be configured to provide dedicated properties or functions. A layer (e.g., a hydrogen barrier layer) of the one or more layers may be configured as a hydrogen barrier to reduce a hydrogen diffusion between the memory element 124 (and optionally the first electrode layer 222 and/or the second electrode layer 224) and the embedding structure 204. For example, the layer configured as hydrogen barrier may include or may consist of aluminum oxide. A layer of the one or more layers may be an electrically insulating layer to reduce a leakage current between the memory element 124 (and optionally the first electrode layer 222 and/or the second electrode layer 224) and the embedding structure 204. The electrically insulating layer may include or may consist of silicon dioxide. The electrically insulating layer may include or may consist of a high-k dielectric material. This may reduce an amount of leakage currents flowing from or to the SPOC structure 202. In the case that the electrically insulating layer is not provided, it may be required that the embedding structure 204 includes or consists of a high-k dielectric material in order to reduce leakage currents. However, in the case that the electrically insulating layer is provided (e.g., as a high-k dielectric barrier), the embedding structure 204 may include or may consist of a low-k dielectric material. Using a low-k dielectric material instead of a high-k dielectric material may reduce the manufacturing costs significantly. A layer of the one or more layers may be configured to induce compressive stress or tensile stress into the memory element 124. For example, the layer may include or may consist of (e.g., compressive or tensile) silicon nitride. The advantages of introducing compressive stress or tensile stress are described with respect to the electrode material(s). As an example, the fifth encapsulation structure 232 may include a strain/stress layer and a hydrogen barrier layer or the fifth encapsulation structure 232 may include the hydrogen barrier layer and the second encapsulation structure 230 may include the strain/stress layer, etc.

According to various aspects, the SPOC structure 202 may have a trapezoidal shape. Exemplary configurations of a SPOC structure 202 having a trapezoidal shape are shown in FIG. 5A to FIG. 5H and exemplary configurations of the memory cell 200 including the SPOC structure 202 having the trapezoidal shape are shown in FIG. 2J to FIG. 2R.

The spontaneously polarizable material of the memory element 124 may consist of lead zirconate titanate (Pb[$Zr_xTi_{1-x}$]$O_3$, PZT) or strontium bismuth tantalate ($Sr_2Bi_2TaO_9$, SBT). However, there are several disadvantages for integrating PCT and SBT in complementary metal-oxide-semiconductor (CMOS):

Polycrystalline PZT or SBT films may require a thickness of more than 70 nm in order to ensure that the complete film is ferroelectric. However, the lateral dimension in CMOS integration may not be scalable such that the thick films lead to huge height difference between the SPOC structure 202 and the logic area forming below the interlayer metallization.

PZT and SBT require four elements and cannot be deposited using atomic layer deposition (ALD). Hence, PZT and SBT cannot be used for a 3D-integration of the SPOC structure 202, but merely for planar structures.

PZT and SBT include elements which may contaminate CMOS facilities. PZT even includes lead (Pb) which is considered toxic. This may require a special encapsulation of the whole SPOC structure 202. Further, dedicated tools may be required for depositing the toxic elements.

PZT and SBT require crystallization temperature higher than 500° C. (e.g., 600° C. in the case of PZT) in order to form the ferroelectric phase. However, the maximum thermal budget for integrating the SPOC structure 202 as part of the interlayer metallization is 400° C. due to the diffusion of copper (Cu) and nickel silicide (NiSi) (see also description below). Thus, it may not be possible to integrate SPOC structures including PZT or SBT as part of the interlayer metallization.

PZT and SBT have a very weak bond strength to oxygen. Therefore, in order to keep a stable stoichiometry, metal oxide electrodes are required which do not scavenge oxygen from the PZT or SBT during the lifetime of the device operation. Furthermore, additional hydrogen barriers may be required in order to prevent hydrogen damage of the SPOC structure.

PZT and SBT have a comparatively small band gap (e.g., 3.0 to 3.5 eV for PZT). Hence, PZT and SBT cannot be used for devices that require low leakage currents through the SPOC structure.

According to various aspects, the spontaneously polarizable material of the memory element 124 may consist of hafnium zirconium oxide ($Hf_{1-x}Zr_xO$, HZO) with $0 \leq x \leq 1$ (i.e., consisting of hafnium oxide in the case of x=0 and consisting of zirconium oxide in the case of x=1). There are several advantages of HZO for CMOS integration:

HZO films are ferroelectric or antiferroelectric down to a thickness of 1 nm. Hence, the integration of the SPOC structure 202 in lateral dimension is scalable to a maximum degree.

HZO films can be deposited using ALD. This allows to manufacture SPOC structure 202 having curved structures and allow a 3D-integration of the SPOC structure 202.

HZO films are CMOS compatible and do not include any toxic elements. Hence, an encapsulation of the SPOC structure 202 may be optional and the standard CMOS equipment can be used.

It may be possible to crystallize the HZO into the ferroelectric phase by annealing at temperatures in a range from about 300° C. to about 400° C. (see also description of the heat barrier 304/heat barrier layer). This allows an integration of the SPOC structure 202 as part of the interlayer metallization.

The bond between hafnium and oxygen and the bond between zirconium and oxygen is very strong such that metal oxide electrodes are optional and other electrode materials, such as metal nitrides may be used. Further, hydrogen barriers may be optional and not required.

HZO films have a large band gap (e.g., 5.8 eV for hafnium oxide). Thus, HZO can be used for devices that require a low leakage current.

As described herein, the memory cell 200 may be disposed between metallization layers and, thus, may be formed as part of the interlayer metallization. The interlayer metallization may be part of a back-end-of-line process. According to various aspects, the transistors, the contact metallization, and at least the first metallization layer 402A, 402B may be formed prior to forming the SPOC structure 202. Forming the SPOC structure 202 may be carried out after a front-end-of-line process as part of the back-end-of-line process. The prior formed structures may be associated with a maximum thermal budget. The maximum thermal budget may define a temperature below which no components are expected to break. Illustratively, one or more components associated the prior formed structures may break in the case of a temperature treatment having a higher temperature than the temperature defined by the maximum thermal budget.

The spontaneously polarizable material (e.g., HZO) of the memory element 124 may exhibit the spontaneously polarizable properties only in the crystalline phase (i.e., after crystallization). According to various aspects, the spontaneously polarizable material (e.g., HZO) of the memory element 124 may be crystallized by annealing (e.g., thermally annealing). The annealing may include a furnace annealing, a flash-lamp annealing, and/or a laser annealing. The annealing may be carried out in an inert gas atmosphere (e.g., nitrogen, e.g., argon) at any suitable pressure, e.g., at atmospheric pressure, at a pressure below atmospheric pressure, or at a pressure above atmospheric pressure. In some aspects, the annealing may be carried out in a vacuum. A vacuum in a processing chamber (e.g., for depositing a material and/or for annealing a material) may be provided in a pressure range below 50 mbar. According to various aspects, the memory element 124 may be annealed using a laser annealing and/or a flash-lamp annealing with local temperatures in the range from about 1500° C. to about 1850° C. The local temperatures in the range from about 1500° C. to about 1850° C. may result in homologous temperature, $T_H$, of the capacitive memory structure given by a temperature, T, over a melting temperature of the one or more transition-metal-oxides, $T_{melt}$, in the range from about 0.6 to about 0.7 or greater than 0.7.

It may be required that the thermal energy required to crystallize the spontaneously polarizable material as represented by the crystallization temperature is below the maximum thermal budget. According to various aspects, doping the spontaneously polarizable material may reduce the crystallization temperature. The dopants may include at least one element of the following elements: gadolinium, yttrium, scandium, and/or ytterbium. The maximum thermal budget may be defined by the material used for the contact metallization and the material used for the metallization layers (at least the first metallization layer). For example, nickel silicide (NiSi) may be used for contact pads of the contact metallization and copper (Cu) may be used for the metallization layer(s) of the interlayer metallization. The diffusion of Cu and NiSi may lead to a break of the device structures and should, therefore, be prohibited. Thus, the maximum thermal budget may be about 400° C.

According to various aspects, the prior formed structures may be protected from thermally induced damage using the heat barrier 304. The heat barrier 304 may allow to use higher temperatures than the maximum thermal budget. Illustratively, the heat barrier 304 may increase the maximum thermal budget.

Figure 6A:
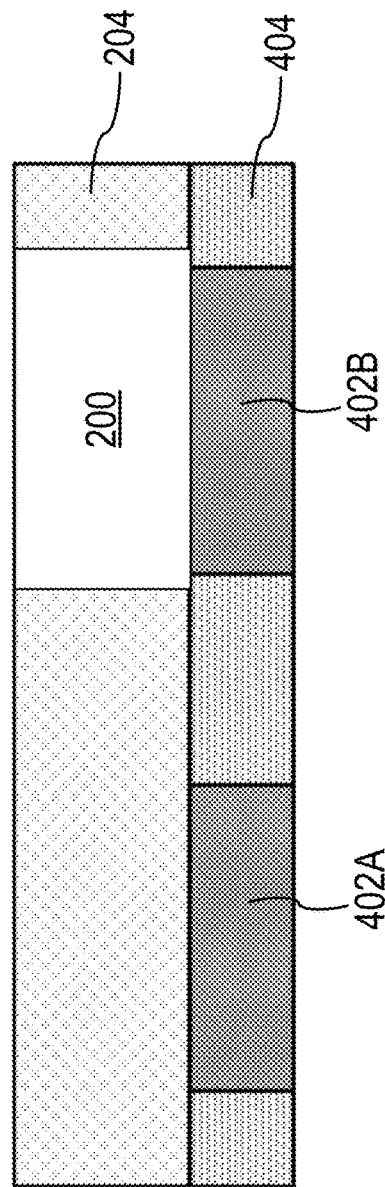
FIG. 6A to FIG. 6O each show an exemplary intermediate structure during manufacturing a memory cell arrangement which may be annealed according to various aspects.

Various configurations of an intermediate structure 400 during manufacturing a memory cell arrangement in which the annealing may take place are shown in FIG. 6A to FIG. 6O. The intermediate structure 400 may include the structures of the memory cell arrangement formed prior to the memory cell 200, such as the transistors, the contact metallization and one or more metallization layers of the interlayer metallization. The memory cell 200 may be formed between two consecutive metallization layers (e.g. 402B and 402D) such that the structures formed prior to the memory cell 200 may include the one or more metallization layers 402A, 402B. The metallization layer may include one or more metallization lines (e.g., consisting of Cu) disposed within an interlayer dielectric (ILD) 404. The ILD 404 may include or may consist of a low-k dielectric material. The metallization layer may include at least a first portion 402A and a second portion 402B. To implement a ferroelectric capacitor (FeCAP) or an anti-ferroelectric capacitor (AFeCAP) in accordance with FIG. 1, second portion 402B may be electrically conductively connected to (e.g., in direct contact with) a gate contact of a transistor associated with the FeCAP or AFeCAP.

Figure 6B:
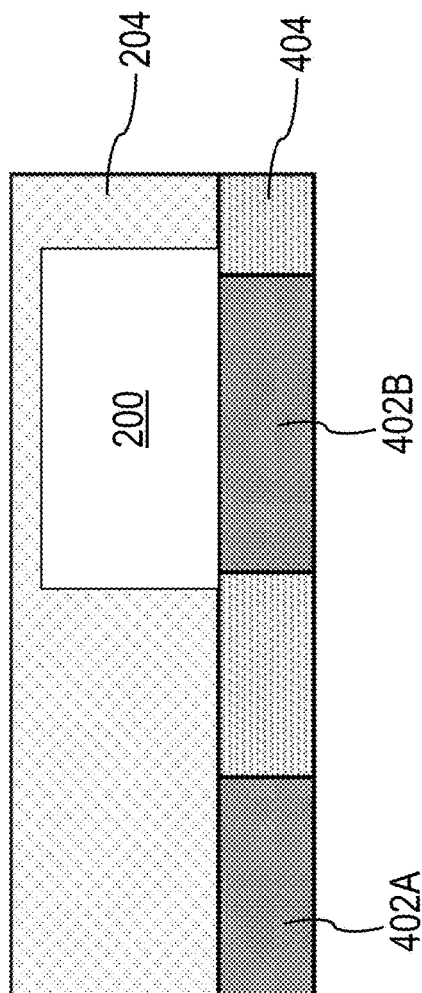
Figure 6C:
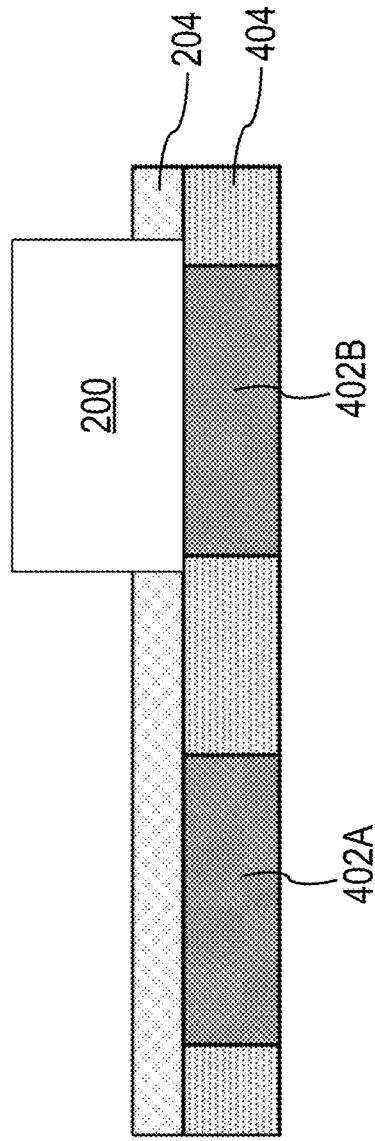
Figure 6D:
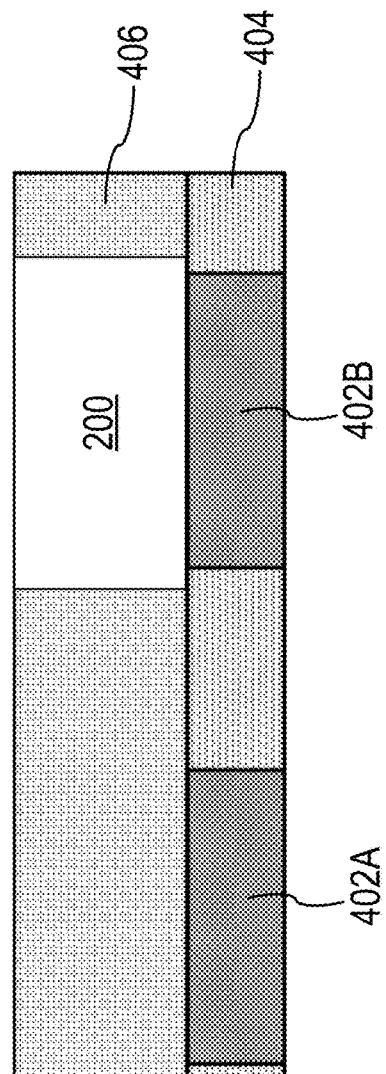
Figure 6E:
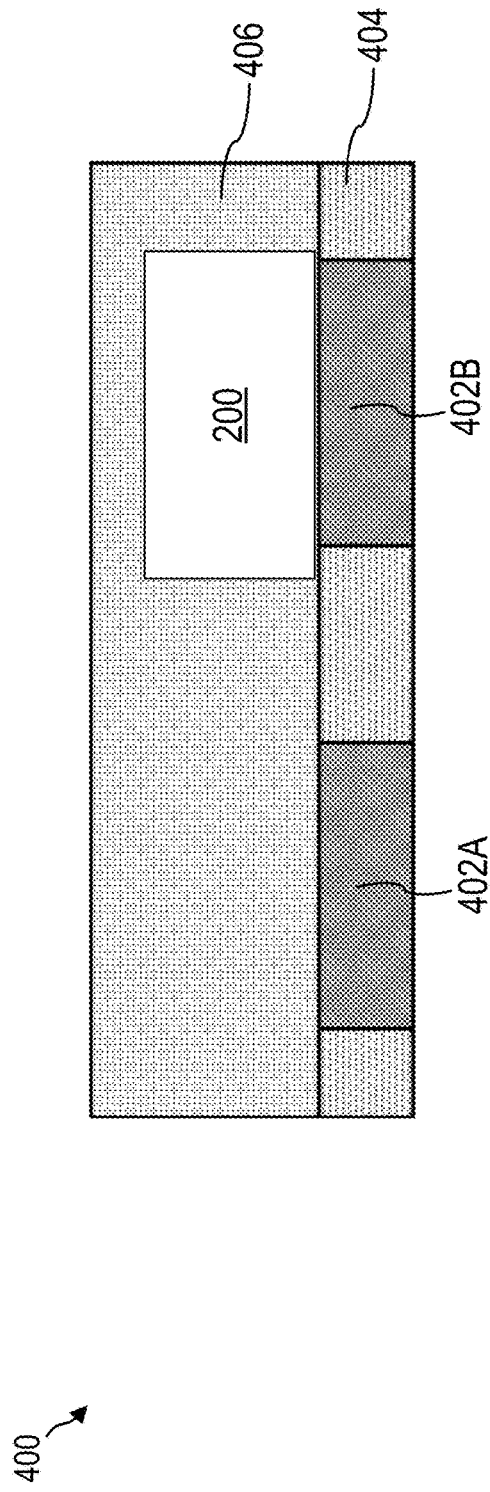
Figure 6F:
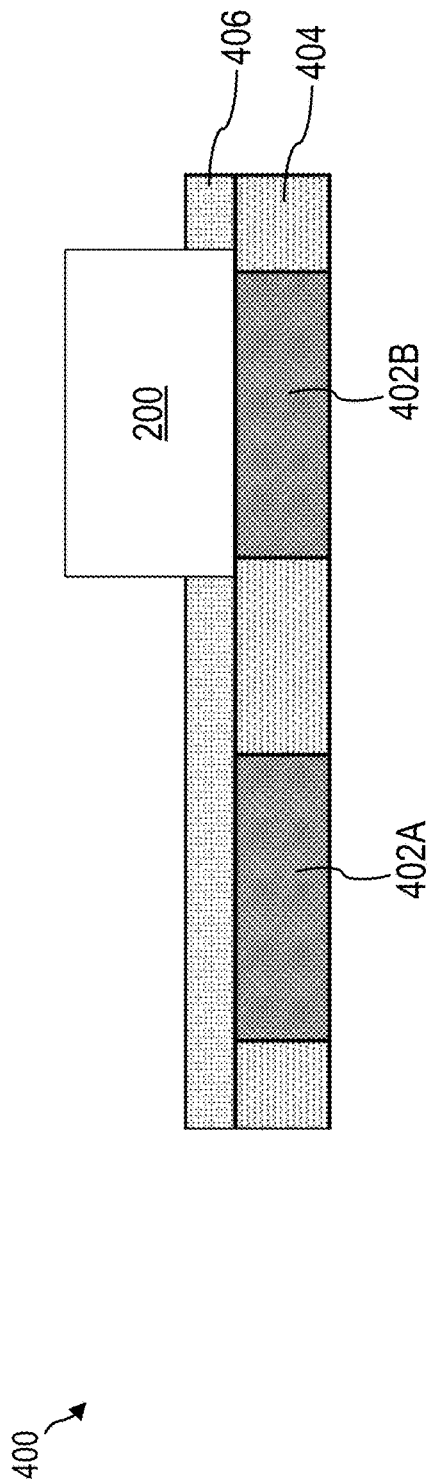
Figure 6G:
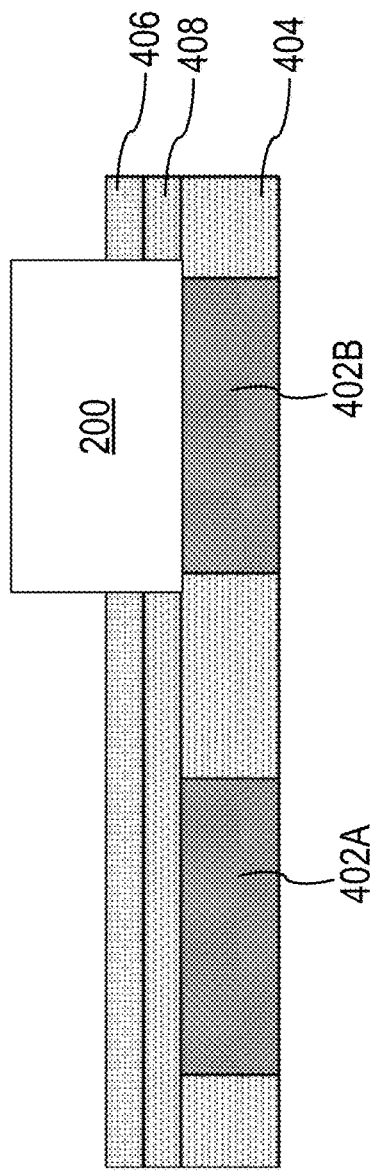
Figure 6H:
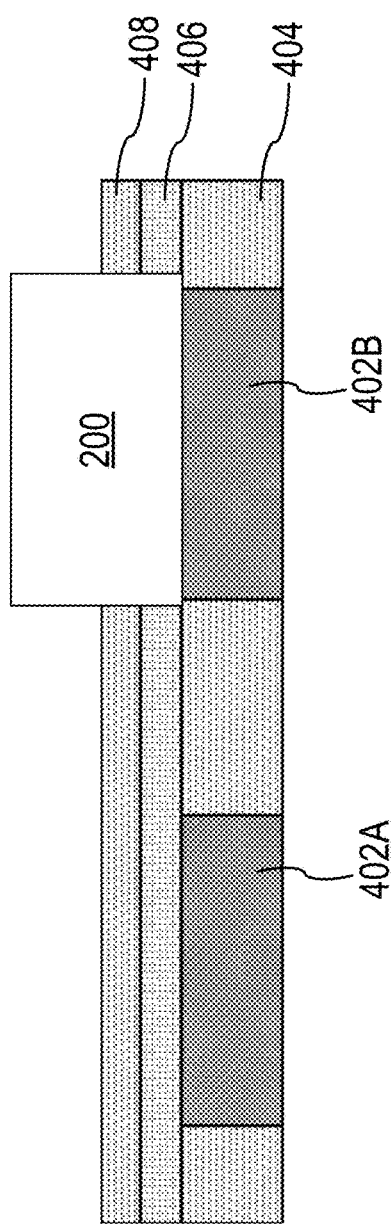
Figure 6I:
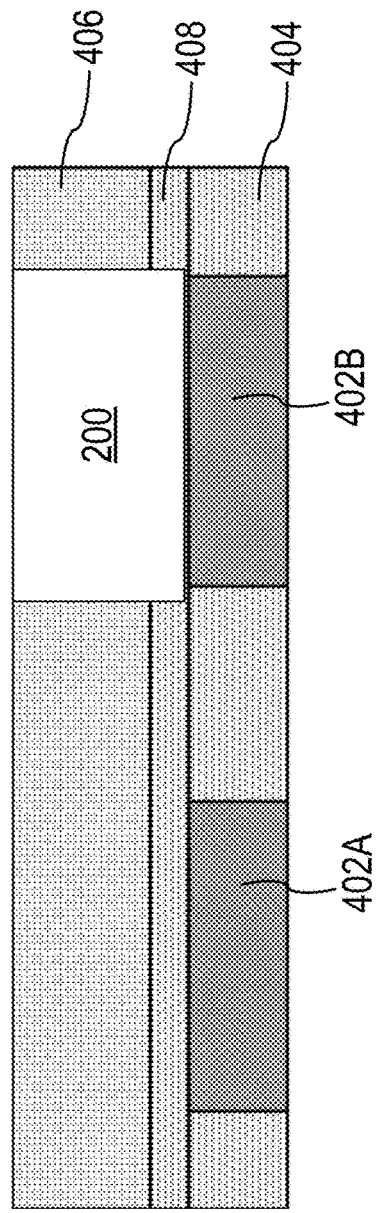
Figure 6J:
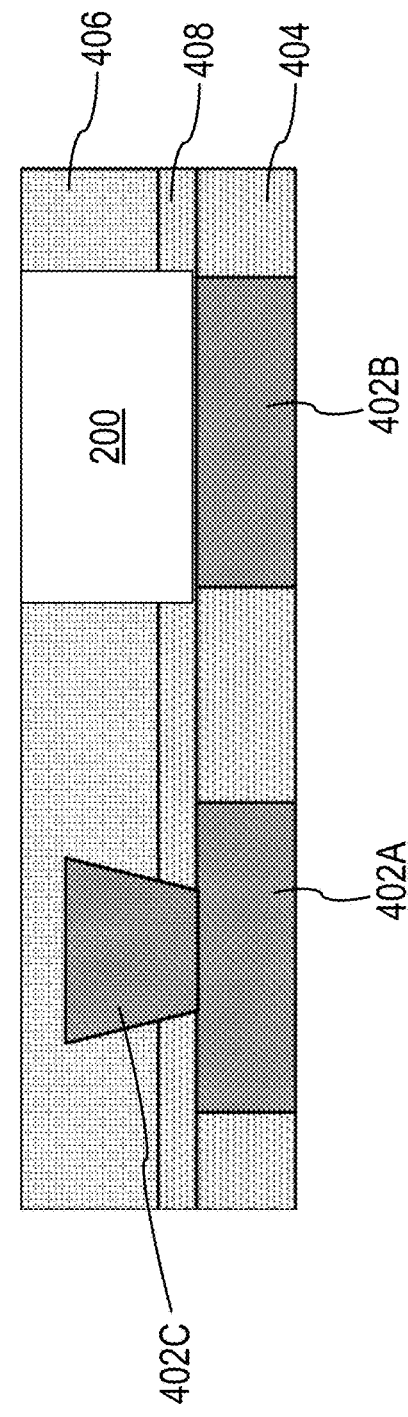
Figure 6K:
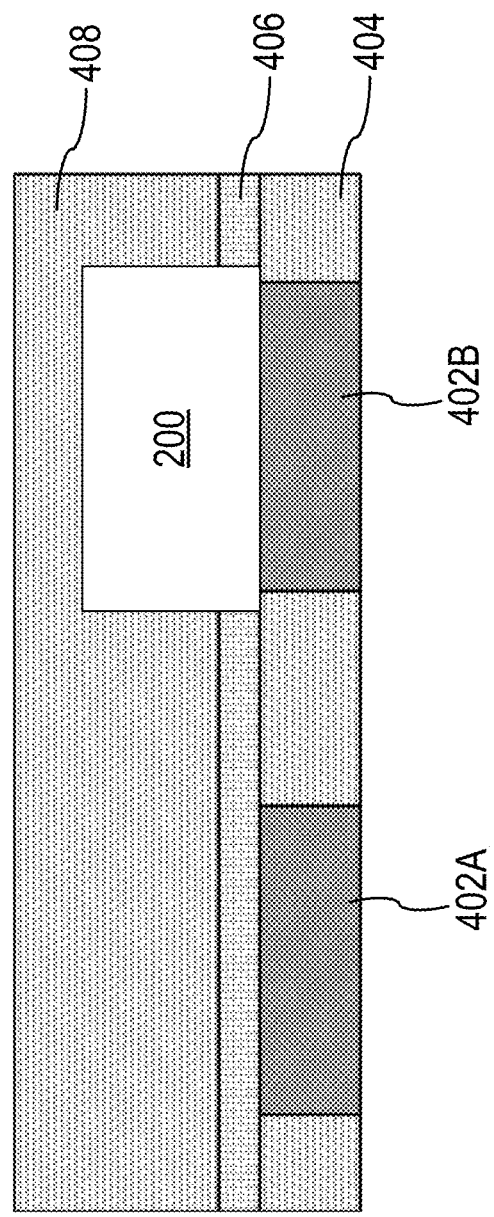

FIG. 6A to FIG. 6C show various configurations in which the first portion 402A is covered by the embedding structure 204. At least a part of (e.g., a part of or the complete) the embedding structure 204 may be configured as heat barrier 406, as shown in FIG. 6D to FIG. 6K. According to various aspects, the heat barrier 406 may include the heat barrier 304. Optionally, the embedding structure 204 may include an electrically insulating layer 408 (e.g., including or consisting of a low-k dielectric (e.g., in combination with the encapsulation structure described herein) or a high-k-dielectric), as shown in FIG. 6G to FIG. 6K. According to various aspects, the metallization layer e.g. 402A, 402B, may be covered by embedding structure 204 including the heat barrier 406. For example, at least each metallization portion (e.g., the first portion 402A and/or the second portion 402B) not covered by the memory cell 200 may be covered by embedding structure 204 including the heat barrier 406. This may protect the metallization layer as well as the structures disposed below the metallization layer, Ma, during annealing the memory element 124. As shown in FIG. 6J, contacts 402C to the metallization layer 402A, 402B may be formed prior to the annealing as long as the contacts 402C are covered by the heat barrier 406.

According to various aspects, the spontaneously polarizable material may be annealed prior to structuring the spontaneously polarizable material to a plurality of memory cells (which may be configured in accordance with memory cell 200, e.g., having a planar or trapezoidal SPOC structure 202 as shown in FIG. 2A to FIG. 2R or a 3D-integrated SPOC structure as described herein). FIG. 6L to FIG. 6O show various configurations of the intermediate structure 400 in which the annealing of the spontaneously polarizable material may take place (e.g., prior to structuring the memory cells 200). In each configuration of the intermediate structure 400 according to FIG. 6L to FIG. 6O, the insulating layer 208 may be formed over the metallization layer and the ILD 404 the metallization layer may be disposed in. Further, for each memory cell 200 of the plurality of memory cells the spontaneously polarizable material may be structured into after annealing, the second electrode contact 210 of the memory cell 200 may be disposed within the insulating layer 208. The fourth encapsulation structure 220 (not shown in FIG. 6L to FIG. 6O) may be disposed in a gap between the second electrode contact 210 and the insulating layer 208. According to various aspects, the insulating layer 208 may include the heat barrier 304. Optionally, the insulating layer 208 may include the electrically insulating layer 302. For example, the insulating layer 208 may be configured in accordance with any configuration shown in FIG. 4B to FIG. 4D. The heat barrier 304 may, during annealing, reduce a heat transfer to structured disposed below the heat barrier 304 (e.g., the structures formed prior to the heat barrier 304).

With reference to FIG. 6L, the annealing may take place after forming a memory layer including the memory element(s) 124 over the insulating layer 208. Optionally, the first electrode layer 222 may be formed over (e.g., in direct contact with) the memory layer after annealing the memory layer. After structuring into the plurality of memory cells, the intermediate structure 400 shown in FIG. 6L may result in memory cells configured in accordance with the memory cell 200 having a SPOC structure 202 shown in FIG. 3A, FIG. 3B, FIG. 3E, FIG. 3G, FIG. 3I, or FIG. 3J.

With reference to FIG. 6M, the annealing may take place after forming the second electrode layer 224 over the insulating layer 208 and after forming the memory layer including the memory element(s) 124 over the second electrode layer 224. Optionally, the first electrode layer 222 may be formed over (e.g., in direct contact with) the memory layer after annealing the memory layer. After structuring into the plurality of memory cells, the intermediate structure 400 shown in FIG. 6M may result in memory cells configured in accordance with the memory cell 200 having a SPOC structure 202 shown in FIG. 3C, FIG. 3D, FIG. 3F, FIG. 3H, FIG. 3K, FIG. 3L, FIG. 3M, or FIG. 3N.

With reference to FIG. 6N, the annealing may take place after forming the memory layer including the memory element(s) 124 over the insulating layer 208 and after forming the first electrode layer 222 over the memory layer. After structuring into the plurality of memory cells, the intermediate structure 400 shown in FIG. 6N may result in memory cells configured in accordance with the memory cell 200 having a SPOC structure 202 shown in FIG. 3B, FIG. 3E, FIG. 3G, or FIG. 3J.

With reference to FIG. 6O, the annealing may take place after forming the second electrode layer 224 over the insulating layer 208, after forming the memory layer including the memory element(s) 124 over the second electrode layer 224 and after forming the first electrode layer 222 over the memory layer. After structuring into the plurality of memory cells, the intermediate structure 400 shown in FIG. 6N may result in memory cells configured in accordance with the memory cell 200 having a SPOC structure 202 shown in FIG. 3D, FIG. 3F, FIG. 3H, FIG. 3L, FIG. 3M, FIG. 3N.

As illustratively shown in FIG. 6A to FIG. 6O, the annealing of the memory element 124 may take place at different points of manufacturing a memory cell arrangement as long as the heat barrier 304 protects the underlying structure from thermal damage by reducing a heat transfer to the underlying structure.

FIG. 7A to FIG. 7F each show an intermediate structure 500 during manufacturing a memory cell arrangement including vertical interconnect accesses (Via) 402D formed after annealing the memory element 124 according to various aspects (e.g., after annealing any of the intermediate structures 400).

The intermediate structure 500 may include the electrically insulating layer 408 (e.g., formed after structuring the memory cell 200 and prior to or after annealing the memory element 124). The electrically insulating layer 408 may include or may consist of a low-k dielectric (e.g., in combination with the encapsulation structure described herein). The intermediate structure 500 may include the metallization layer 402E subsequent to the metallization layer (402A, 402B). The intermediate structure 500 may include at least two vertical interconnect accesses (Vias) 402D. A first Via of the two Vias 402D may be in direct contact with and electrically conductively connected to the metallization layer (402A, 402B) formed prior to the memory cell 200 and the metallization layer 402E formed subsequent to the metallization layer (402A, 402B). A second Via of the two Vias 402D may be in direct contact with and electrically conductively connected to the SPOC structure 202 (e.g., to the memory element 124, to the first electrode layer 222, or to the first electrode contact 206). The subsequent metallization layer 402E and the at least two Vias may be formed using a dual damascene process.

Figure 7A:
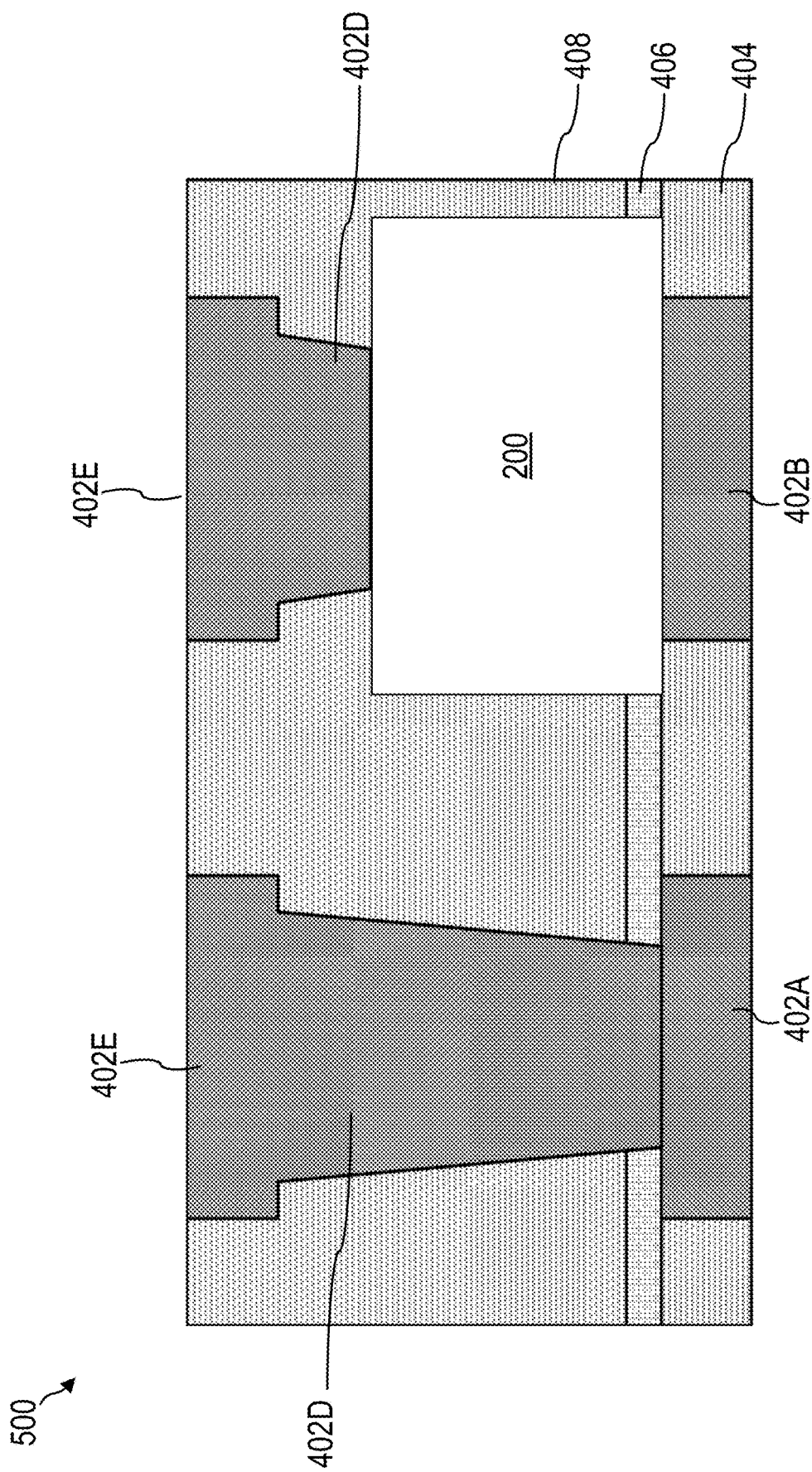
Figure 7C:
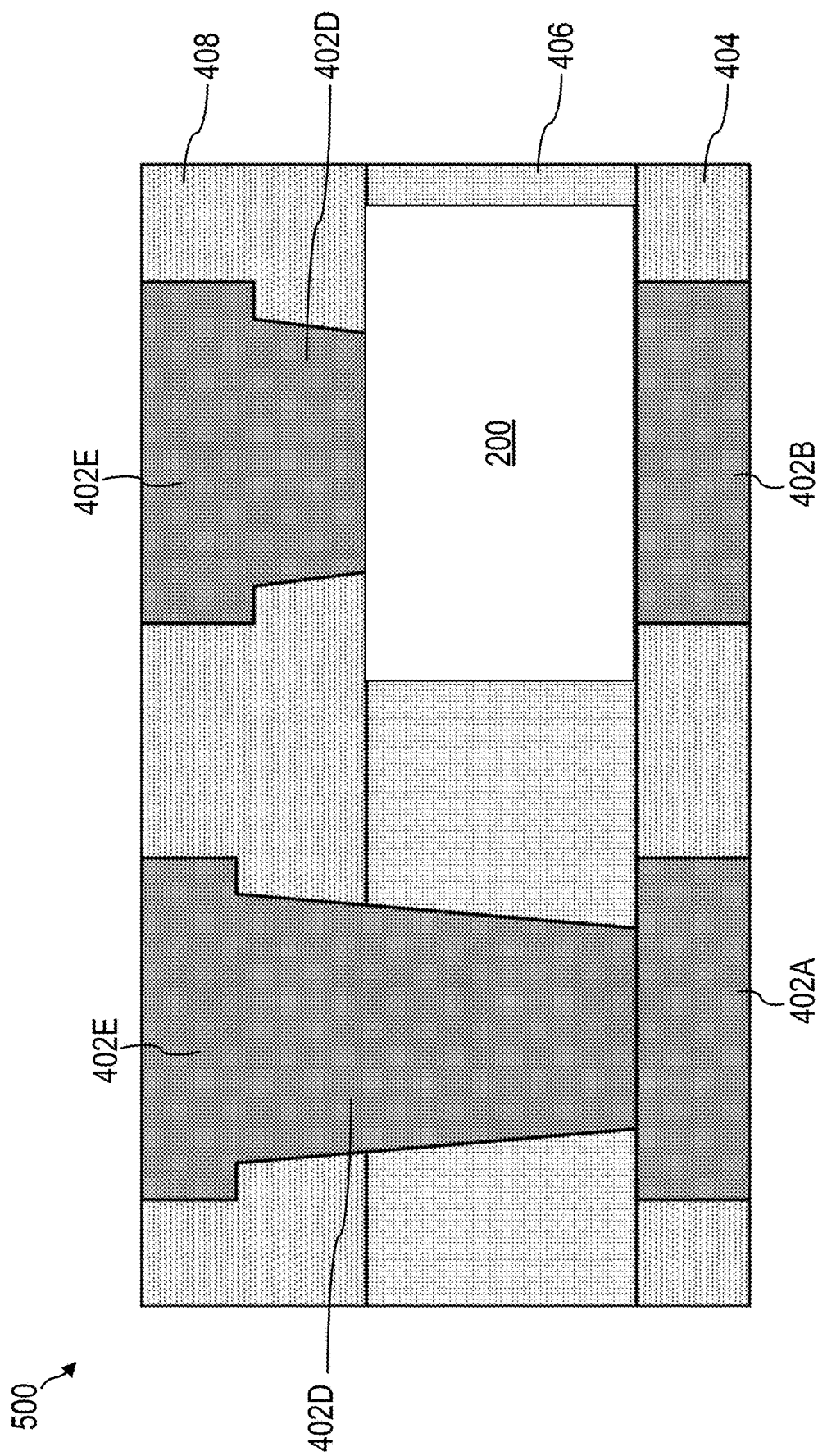
Figure 7E:
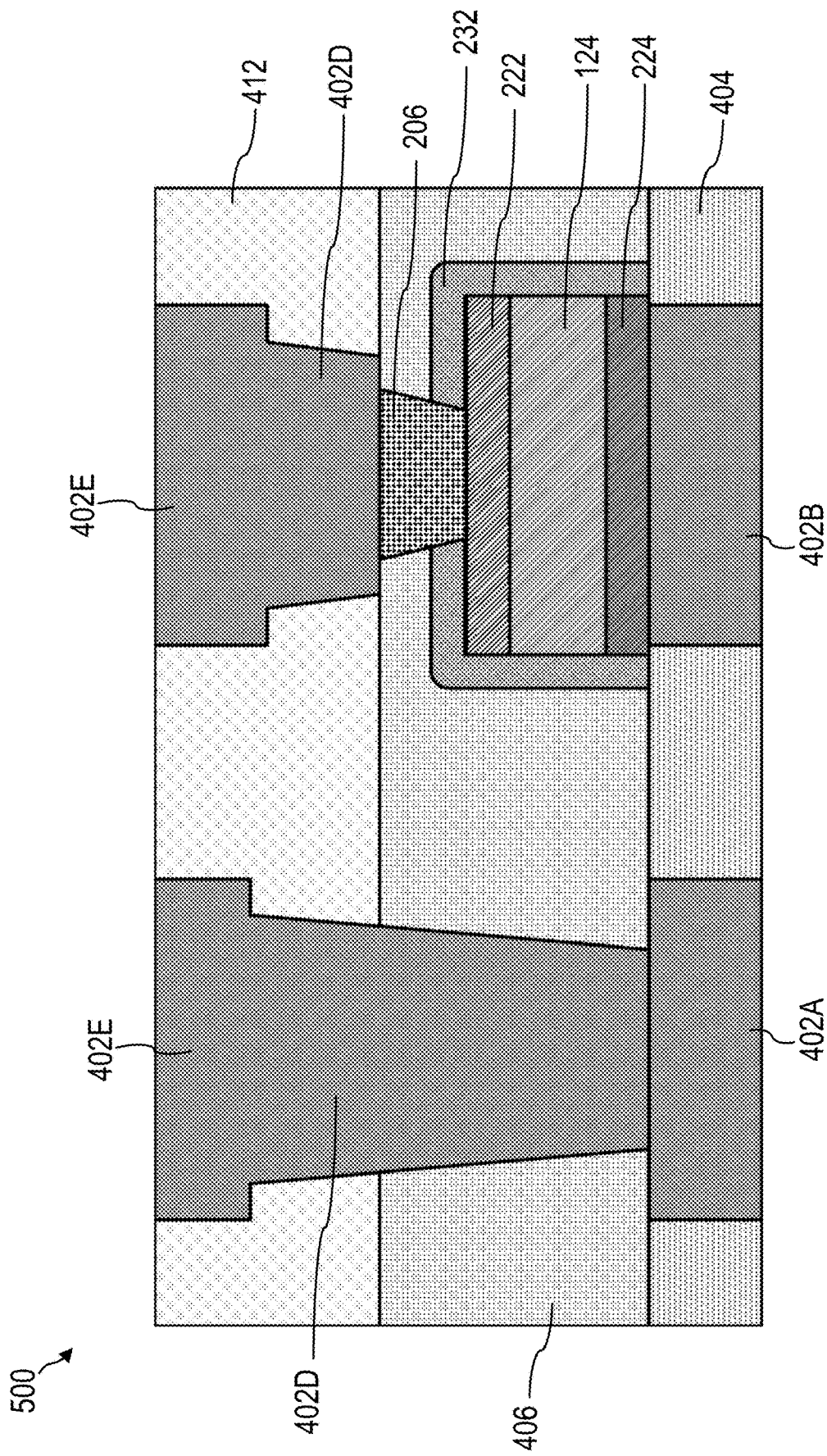
Figure 7F:
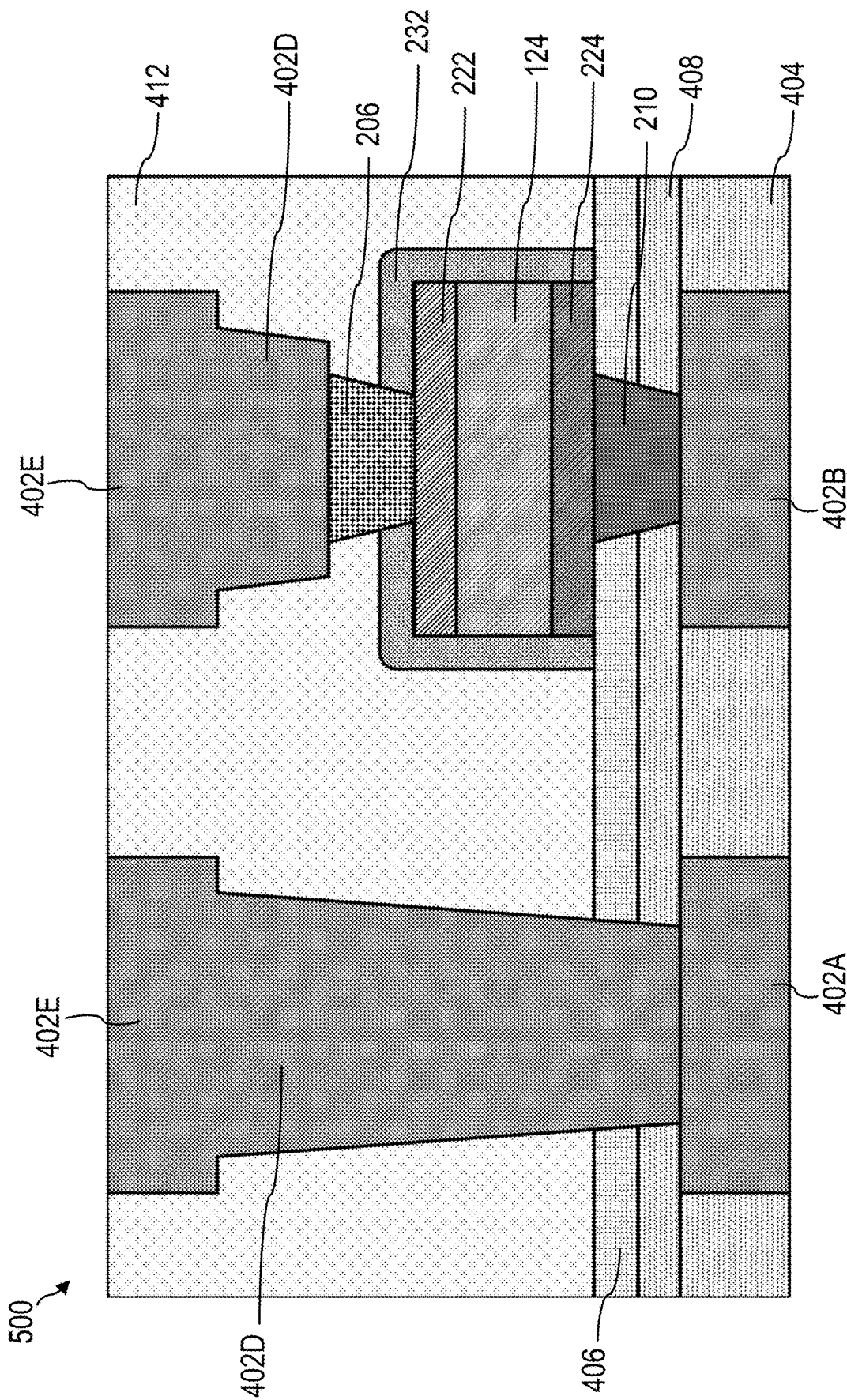

The memory cell 200 may have any configuration described herein. An exemplary configuration of the memory cell 200 and the SPOC structure 202 of the memory cell 200 is shown in FIG. 7E in which the memory cell 200 does not include the heat barrier 304 disposed between the SPOC structure 202 and the metallization layer but the memory cell 200 is embedded within the heat barrier 406. Illustratively, the embedding structure 204 may consist of the heat barrier 406. Using this configuration in accordance with FIG. 7E allows to integrate a memory cell arrangement including a plurality of memory cells 200 with only two additional lithography steps (e.g., including a first lithography step for forming the SPOC structure 202 and a second lithography step for forming the first electrode contact 206 (if provided)) as compared to having no memory cell arrangement. As described herein, the first electrode contact 206 may serve as an etch stop during forming the at least two Vias 402D (e.g., using a dual damascene process). Another exemplary configuration of the memory cell 200 and the SPOC structure 202 of the memory cell 200 is shown in FIG. 7F in which the heat barrier 304 is disposed between the SPOC structure 202 and the metallization layer. Using this configuration in accordance with FIG. 7F allows to integrate a memory cell arrangement including a plurality of memory cells 200 with only three additional lithography steps (e.g., including a first lithography step for forming the second electrode contact 210 (if provided), a second lithography step for forming the SPOC structure 202, and a third lithography step for forming the first electrode contact 206 (if provided)) as compared to having no memory cell arrangement.

FIG. 8A, FIG. 8B, FIG. 8C, FIG. 8D, FIG. 8E, FIG. 8F and FIG. 8G each show a flow diagram of a respective method 800A, 800B, 800C, 800D, 800E, 800F, 800G for manufacturing a memory cell arrangement. The memory cell arrangement may include one or more memory cells. Each of the one or more memory cells may be configured in accordance with the memory cell 200.

Each of the methods 800A, 800B, 800C, 800D, 800E, 800F, 800G may include forming one or more metallization layers at least one of over or in a substrate (in 802). In some aspects, the substrate may include or may be a silicon substrate e.g., with or without a (e.g., native) $SiO_2$ surface layer, or any other suitable semiconductor substrate. In other aspects, the substrate may include or may be an electrically non-conductive substrate, e.g., a glass substrate. In still other aspects, the substrate may include or may be an electrically conductive substrate, e.g., a metal substrate. As described herein, the one or more metallization layers may correspond to the interlayer metallization and may include at least the first metallization layer e.g. 402A, 402B. Hence, the transistors and the contact metallization may be formed prior to the one or more metallization layers of the interlayer metallization.

Each of the methods 800A, 800B, 800C, 800D, 800E, 800F, 800G may include forming a heat barrier layer over the one or more metallization layers (in 804). The heat barrier layer may be configured as a heat barrier to the one or more metallization layers. The heat barrier layer may allow a higher annealing temperature as compared to having no heat barrier layer. The reduced heat transfer to the one or more metallization layers may reduce a thermal damage of the one or more metallization layers (and the transistors and the contact metallization formed prior to the one or more metallization layers).

Figure 8A:
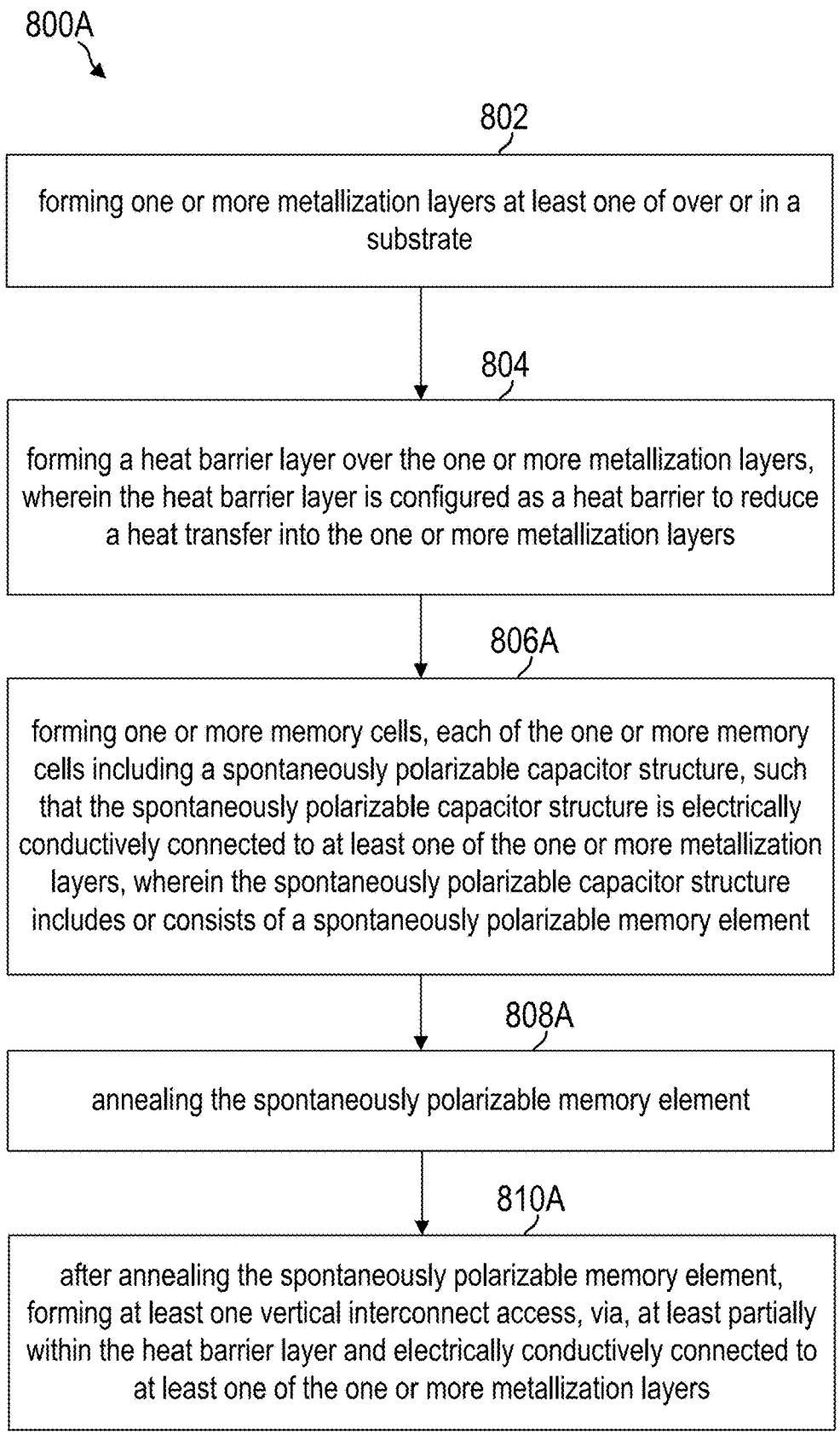

With reference to FIG. 8A, the method 800A may include forming one or more memory cells (in 806A). Each of the one or more memory cells may include a spontaneously polarizable capacitor structure. The spontaneously polarizable capacitor structure may include or may consist of a memory element consisting of a spontaneously polarizable material. Each of the one or more memory cells may be formed such that the spontaneously polarizable capacitor structure is electrically conductively connected to at least one of the one or more metallization layers. The one or more memory cells may be formed prior to forming the heat barrier layer or after forming the heat barrier layer (in 804). According to various aspects, forming the one or more memory cells (in 806A) may result in a configuration of the intermediate structure 400 as shown in FIG. 6A to FIG. 6K.

The method 800A may include annealing (e.g., thermally annealing) the memory element(s) of the one or more memory cells (in 808A). The annealing may be carried out at a temperature higher than 400° C. (e.g., for 1 hour). Without the heat barrier layer, an annealing at a temperature higher than 400° C. would (due to diffusion of Cu and/or NiSi) result in damaging the one or more metallization layers and/or the contact metallization.

The method 800A may include, after annealing the memory element(s), forming at least one vertical interconnect access at least partially within the heat barrier layer and electrically conductively connected to at least one of the one or more metallization layers (in 810A). According to various aspects, forming the at least one vertical interconnect access (in 810A) may result in a configuration of the intermediate structure 500 as shown in FIG. 7A to FIG. 7E.

With reference to FIG. 8B, the method 800B may include forming at least one electrode contact at least partially within the heat barrier layer and in direct contact with at least one of the one or more metallization layers (in 806B).

The method 800B may include forming at least one memory cell (in 808B). The at least one memory cell may include a spontaneously polarizable capacitor structure. The spontaneously polarizable capacitor structure may include or may consist of a memory element consisting of a spontaneously polarizable material. The at least one memory cell may be formed such that the spontaneously polarizable capacitor structure is electrically conductively connected to (e.g., in direct contact with) with the at least one electrode contact. According to various aspects, forming the at least one memory cell (in 808B) may result in a configuration of the intermediate structure 400 as shown in FIG. 6A to FIG. 6K in which the memory cell 200 includes the second electrode contact 210 (e.g., as the at least one electrode contact).

The method 800B may include annealing (e.g., thermally annealing) the memory element (in 810B). The annealing may be carried out at a temperature higher than 400° C. (e.g., for 1 hour). Without the heat barrier layer, an annealing at a temperature higher than 400° C. would (due to diffusion of Cu and/or NiSi) result in damaging the one or more metallization layers and/or the contact metallization.

The method 800B may include, after annealing the memory element, forming at least one vertical interconnect access at least partially within the heat barrier layer and electrically conductively connected to at least one of the one or more metallization layers (in 812B). According to various aspects, forming the at least one vertical interconnect access (in 810B) may result in a configuration of the intermediate structure 500 as shown in FIG. 7A to FIG. 7D or FIG. 7F.

According to some aspects, forming a memory cell in accordance with method 800A and/or method 800B may include forming a memory layer consisting of the memory element(s) over the one or more metallization layers electrically conductively connected to the at least one of the one or more metallization layers and structuring the memory layer to form the spontaneously polarizable capacitor structure(s) (e.g., the SPOC structure being configured in accordance with FIG. 3A, FIG. 3I, FIG. 5A, or FIG. 5I). According to other aspects, forming a memory cell in accordance with method 800A and/or method 800B may include forming the memory layer consisting of the memory element(s) over the one or more metallization layers electrically conductively connected to the at least one of the one or more metallization layers, forming an electrode layer (e.g., a top electrode layer) over and in direct contact with the memory layer (e.g., at a temperature lower than 50° C.), and structuring the memory layer and the electrode layer to form the spontaneously polarizable capacitor structure(s) (e.g., the SPOC structure being configured in accordance with FIG. 3B, FIG. 3E, FIG. 3G, FIG. 3J, FIG. 5B, or FIG. 5F). According to even other aspects, forming a memory cell in accordance with method 800A and/or method 800B may include forming an electrode layer (e.g., a bottom electrode layer) over the one or more metallization layers electrically conductively connected to the at least one of the one or more metallization layers (e.g., at a temperature lower than 50° C.), forming the memory layer consisting of the memory element(s) over and in direct contact with the electrode layer, and structuring the memory layer and the electrode layer to form the spontaneously polarizable capacitor structure(s) (e.g., the SPOC structure being configured in accordance with FIG. 3C, FIG. 3K, FIG. 5C, or FIG. 5G). According to even other aspects, forming a memory cell in accordance with method 800A and/or method 800B may include forming a first electrode layer (e.g., a bottom electrode layer) over the one or more metallization layers electrically conductively connected to the at least one of the one or more metallization layers, forming the memory layer over and in direct contact with the first electrode layer, forming a second electrode layer (e.g., a top electrode layer) over and in direct contact with the memory layer (e.g., at a temperature lower than 50° C.), and structuring first electrode layer, the memory element and the second electrode layer to form the spontaneously polarizable capacitor structure(s) of the memory cell(s) (e.g., the SPOC structure being configured in accordance with FIG. 3D, FIG. 3F, FIG. 3H, FIG. 3L, FIG. 3M, FIG. 3N, FIG. 5D, or FIG. 5H).

Figure 8C:
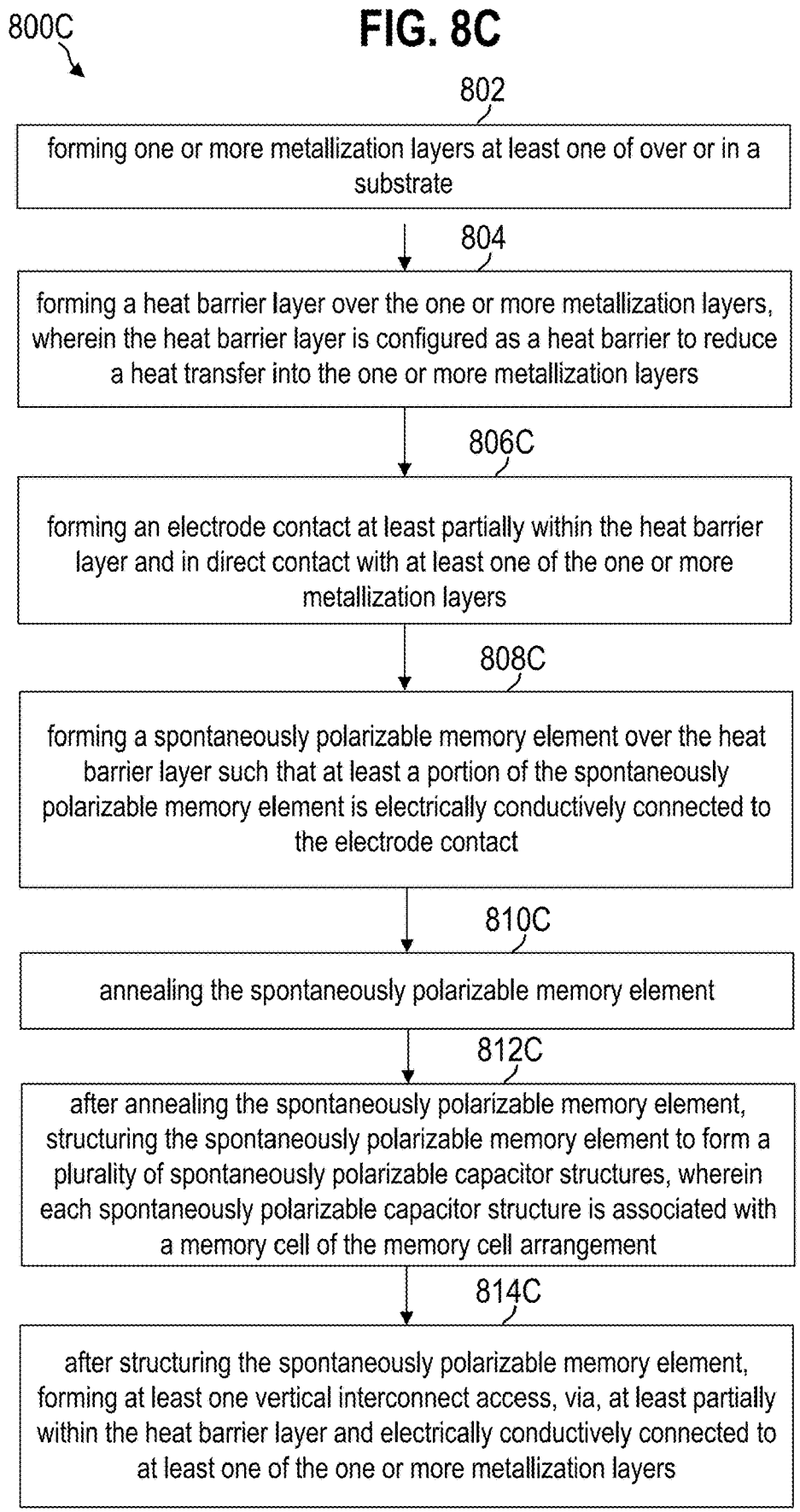
Figure 8D:
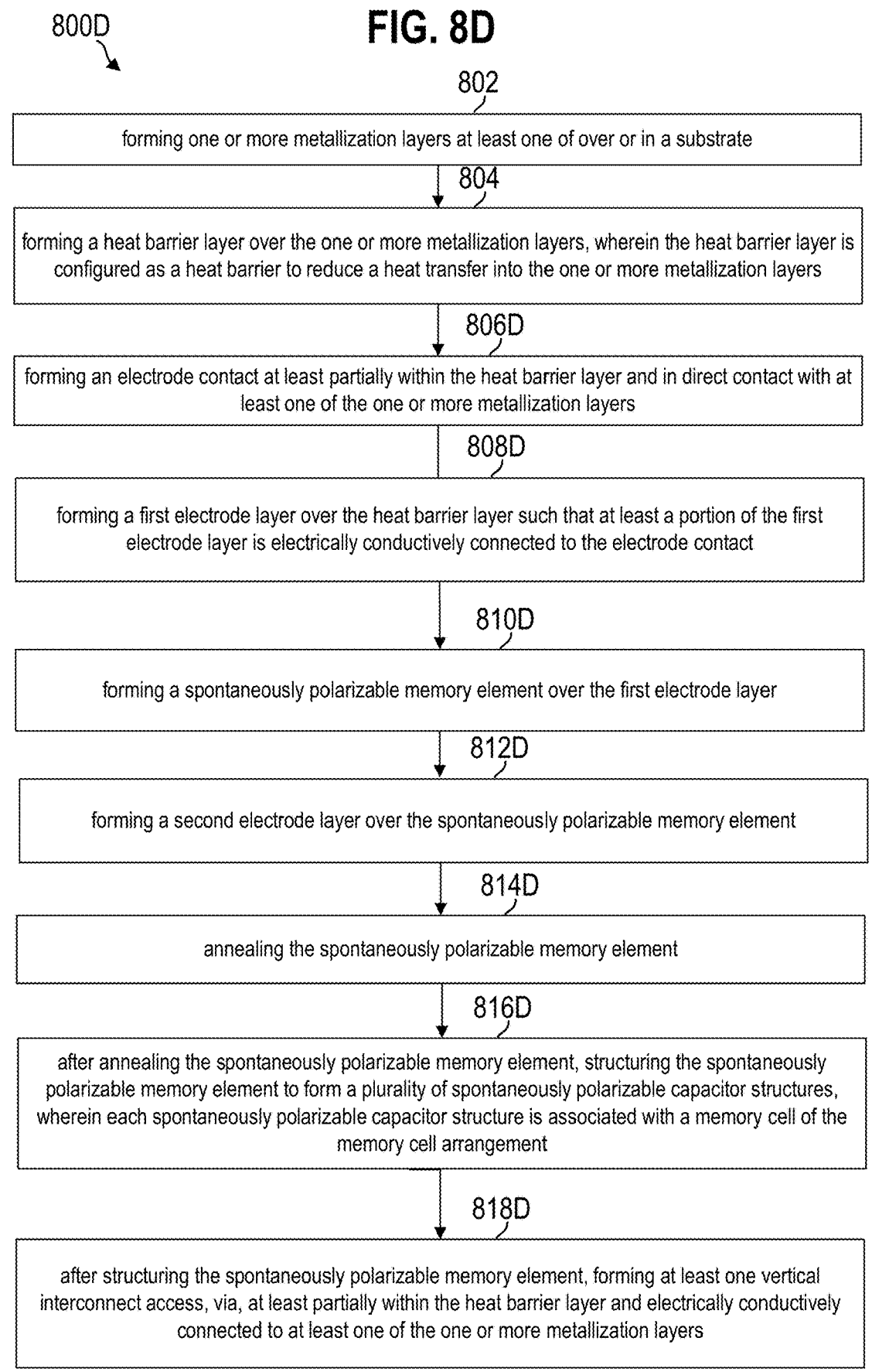
Figure 8E:
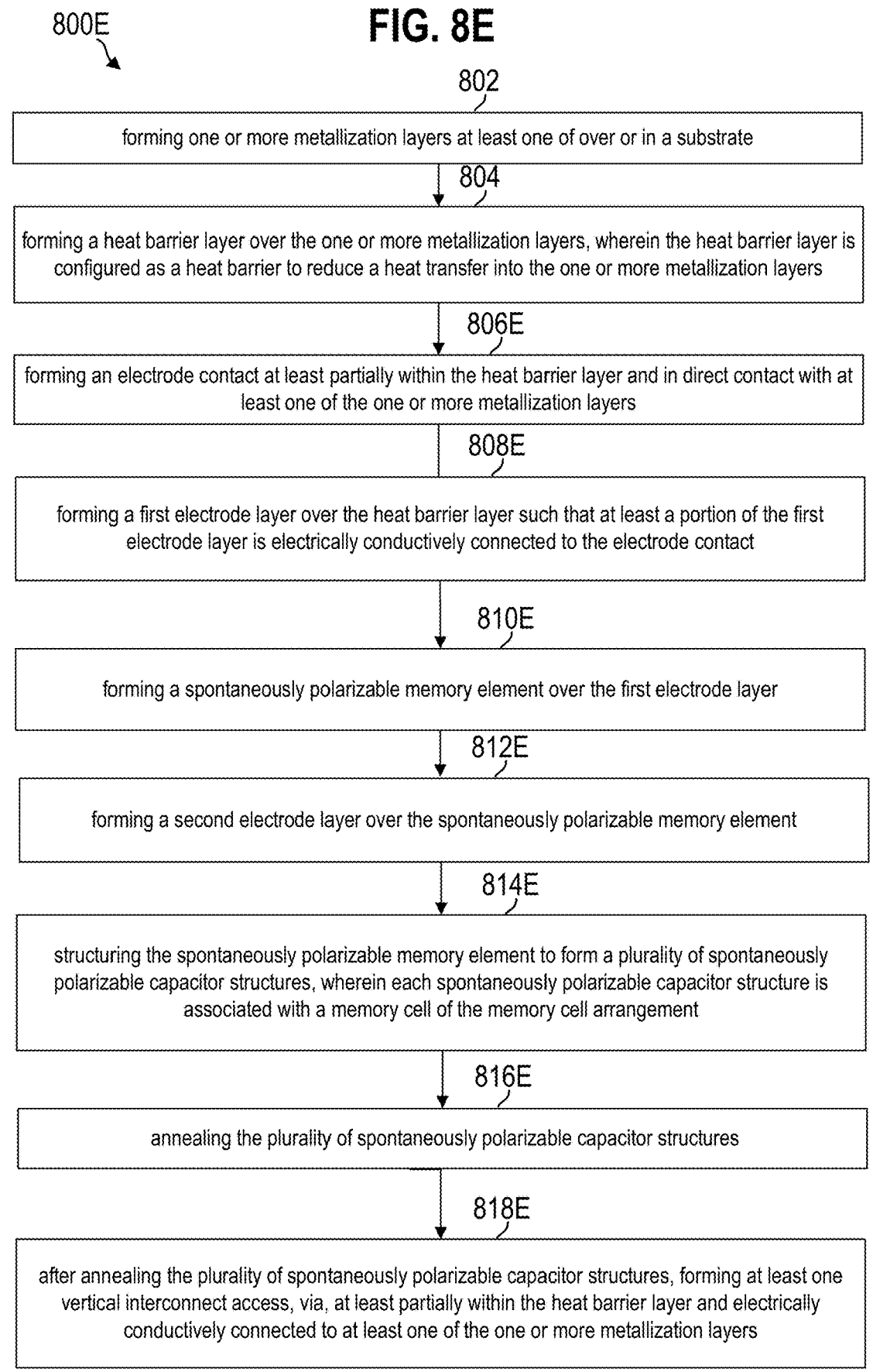
Figure 8F:
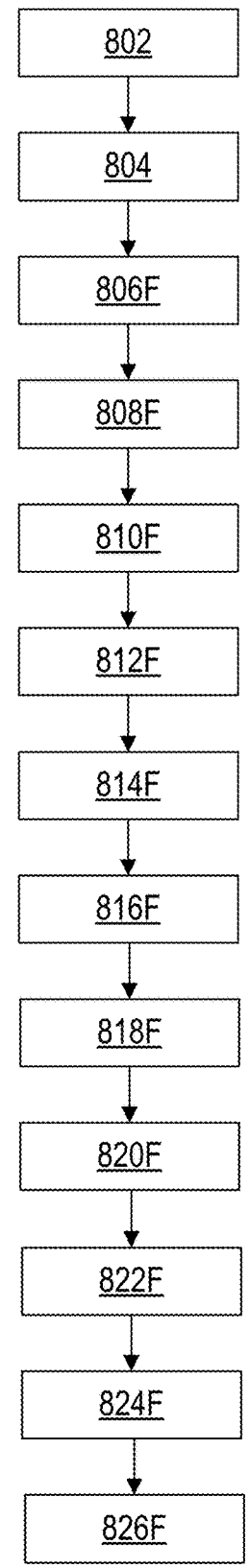
Figure 8G:
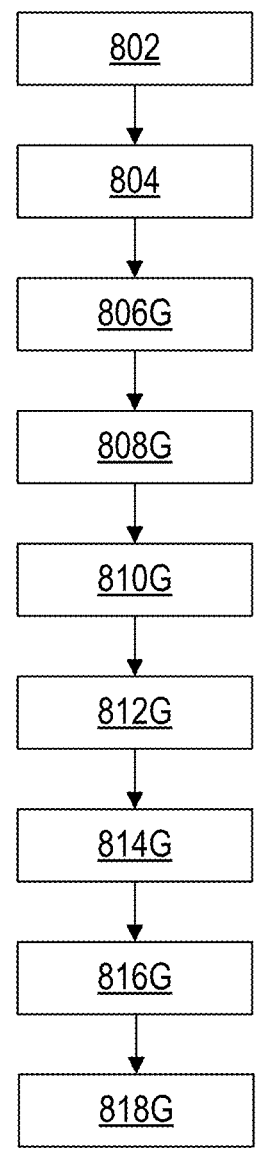

With reference to FIG. 8C, the method 800C may include forming an electrode contact at least partially within the heat barrier layer and in direct contact with at least one of the one or more metallization layers (in 806C).

The method 800C may include forming a memory layer over the heat barrier layer such that at least a portion of the memory layer is electrically conductively connected to the electrode contact, wherein the memory element consists of a spontaneously polarizable material (in 808C). Optionally, the method 800C may include forming an electrode layer (e.g., a bottom electrode layer) prior to forming the memory layer.

The method 800C may include annealing (e.g., thermally annealing) the memory element (in 810C). The annealing may be carried out at a temperature higher than 400° C. (e.g., for 1 hour). Without the heat barrier layer, an annealing at a temperature higher than 400° C. would (due to diffusion of Cu and/or NiSi) result in damaging the one or more metallization layers and/or the contact metallization. Optionally, the method 800C may include forming an electrode layer (e.g., a top electrode layer) over the memory layer prior to annealing the memory layer or after annealing the memory layer (e.g., prior to structuring the memory layer).

The method 800C may include, after annealing the memory layer, structuring the memory layer to form a plurality of spontaneously polarizable capacitor structures (in 812C). Each spontaneously polarizable capacitor structure may be associated with a memory cell (e.g., memory cell 200) of the memory cell arrangement.

The method 800C may include, after structuring the memory layer, forming at least one vertical interconnect access, via, at least partially within the heat barrier layer and electrically conductively connected to at least one of the one or more metallization layers (in 814C).

Even though the annealing of the memory layer in method 800C is described as being carried out after forming the memory layer, it is noted that the memory layer may be formed (e.g., deposited) at elevated temperatures. Illustratively, the annealing may be carried out substantially in parallel to the deposition of the spontaneously polarizable material of the memory layer.

According to various aspects, any of the methods 800A, 800B, 800C may include forming a first electrode layer (e.g., a bottom electrode layer) prior to forming the memory layer or memory element and/or forming a second electrode layer (e.g., a top electrode layer) after forming the memory layer (see, for example, methods 800D, 800E). The respective electrode layer may include or may consist of metal nitride. The electrode layer may be formed by physical vapor deposition of (e.g., sputtering) the metal nitride or atomic layer deposition of the metal nitride. For example, the metal nitride may be deposited at a temperature below 50° C. (e.g., at room temperature such as 25° C.). According to various aspects, the respective method 800A, 800B, 800C may include a surface treatment to reduce surface roughness, to change chemical composition at the interface, and/or to induce a predefined crystallographic texture at the surface (e.g., to generate a memory element 124 having a predefined crystallographic texture of the spontaneously polarizable material). As an example, the respective method 800A, 800B, 800C may include a surface treatment of the first electrode layer which may be a plasma treatment using a nitrogen-based compound (e.g., $N_2O$, e.g., $N_2$, e.g., $NH_3$). This may remove a Ti—O(—N) or Ta—O(—N) layer on the surface of the first electrode layer reducing defects in the SPOC structure (e.g., reducing dead layer effects at an interface of the first electrode layer and the memory element, e.g., reducing trapping sited at the interface of the first electrode layer and the memory element). According to various aspects, metal nitride electrodes may exhibit a scavenging behavior (e.g., an oxygen scavenging behavior). According to various aspects, the surface treatment of the first electrode layer may reduce the scavenging behavior of the first electrode. As another example, the respective method 800A, 800B, 800C may include a surface treatment of the memory element or memory layer. This surface treatment may be a plasma treatment using a nitrogen-based compound (e.g., $N_2O$, e.g., $NH_3$). This may also reduce dead layer effects at an interface to the memory element (e.g., reducing trapping sited at the interface). The surface treatment of the memory element may form a stable barrier towards the second electrode layer (e.g., the top electrode layer) to suppress a scavenging behavior of the second electrode layer. The second electrode layer may be formed at a temperature below 50° C. (e.g., at room temperature such as 25° C.). This may reduce (e.g., prohibit) a nucleation and/or crystallization of the spontaneously polarizable material during forming of the second electrode layer. This may allow for a formation of the spontaneously polarizable material of the memory element with a predefined texture. According to various aspects, a surface roughness of the first electrode layer and/or the memory layer may be reduced using the surface treatment. The surface roughness may be an arithmetical mean deviation (e.g., given by a roughness value Ra) and/or a root mean squared (RMS) surface roughness (e.g., given by an RMS roughness value Rq). The surface roughness may be reduced to be less than 1 nm (e.g., less than 0.3 nm). According to various aspects, a layer consisting of an oxidation resistant metal (e.g., Pt) may be formed prior to forming the second electrode layer.

Methods 800D, 800E, 800F, 800G may each include forming the first electrode layer (e.g., a bottom electrode layer) prior to forming the memory layer or memory element and forming the second electrode layer (e.g., a top electrode layer) after forming the memory layer or memory element.

Figure 9A:
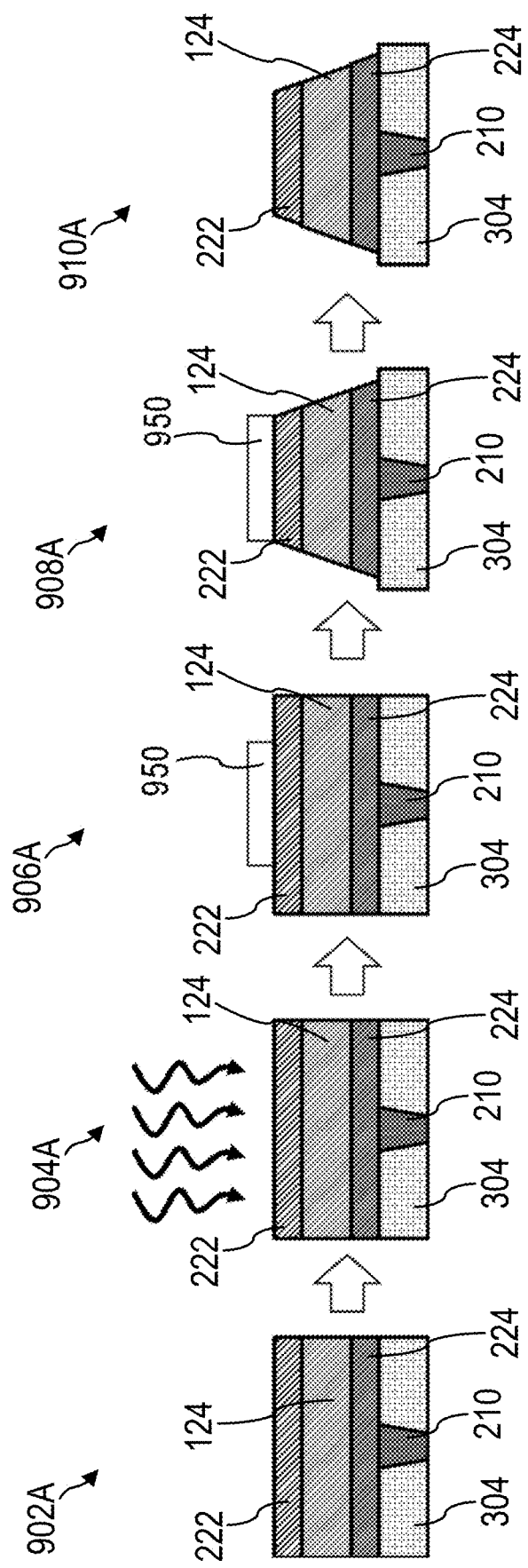

FIG. 9A shows at least parts of an exemplary manufacturing of a memory cell in accordance with method 800D. Method 800D may include (in 806D) forming an electrode contact at least partially within the heat barrier layer and in direct contact with at least one of the one or more metallization layers. The method 800D may include (in 808D) forming a first electrode layer over the heat barrier layer such that at least a portion of the first electrode layer is electrically conductively connected to the electrode contact. The method 800D may include (in 810D) forming a spontaneously polarizable memory element over the first electrode layer. The method 800D may include (in 812D) forming a second electrode layer over the spontaneously polarizable memory element (see, for example 902A in FIG. 9A). The method 800D may include (in 814D) annealing the spontaneously polarizable memory element (and hence the first electrode layer and the second electrode layer) (see, for example 904A in FIG. 9A in which the arrows indicate the temperature treatment). The method 800D may include (in 816D), after annealing the spontaneously polarizable memory element, structuring the spontaneously polarizable memory element to form a plurality of spontaneously polarizable capacitor structures. Each spontaneously polarizable capacitor structure may be associated with a memory cell (e.g., memory cell 200) of the memory cell arrangement. Structuring the spontaneously polarizable memory element to form the plurality of spontaneously polarizable capacitor structures may include depositing a mask material (e.g., a hard mask) (see, for example 950 in FIG. 9A) over the second electrode layer (see, for example 906A in FIG. 9A), etching (e.g., via reactive ion etching, such as selective reactive ion etching) the second electrode layer, the spontaneously polarizable memory element, and the first electrode layer to form the plurality of spontaneously polarizable capacitor structures (see, for example 908A in FIG. 9A), and removing the mask material (see, for example 910A in FIG. 9A). The method 800D may include (in 818D), after structuring the spontaneously polarizable memory element, forming at least one vertical interconnect access, via, at least partially within the heat barrier layer and electrically conductively connected to at least one of the one or more metallization layers.

Figure 9B:
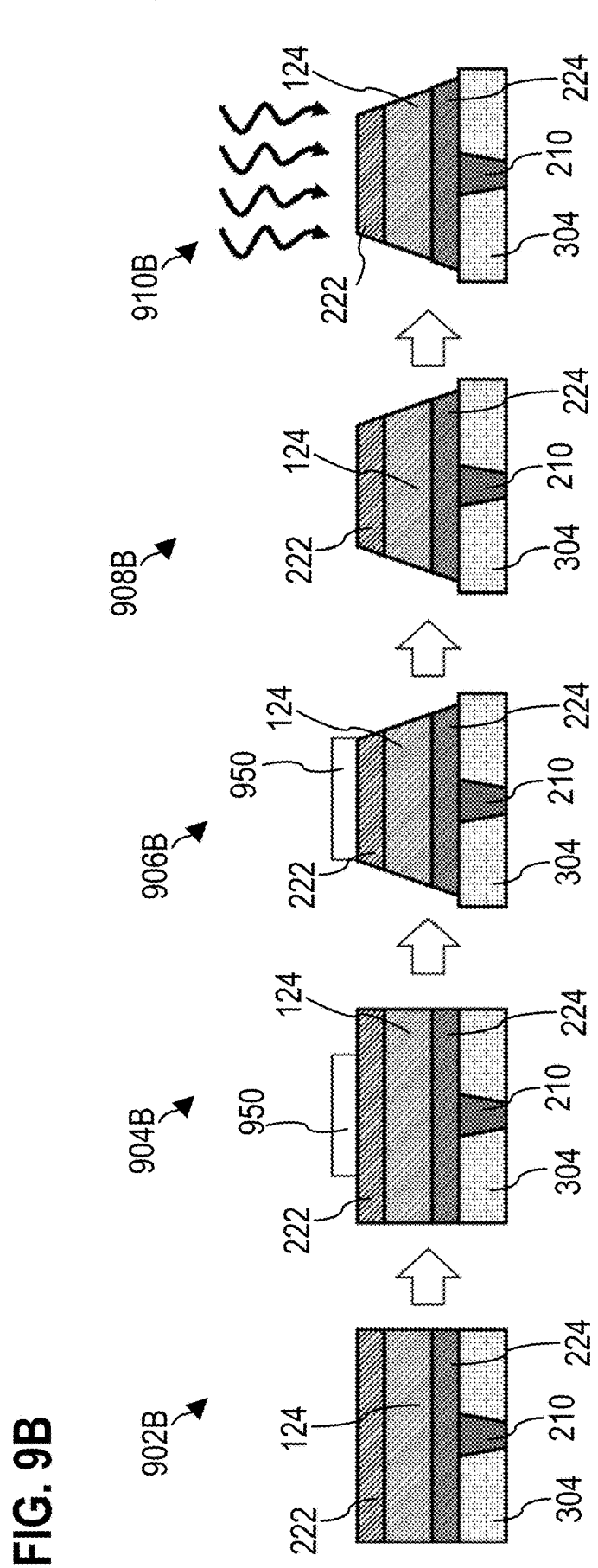

FIG. 9B shows at least parts of an exemplary manufacturing of a memory cell in accordance with method 800E. Method 800E may include (in 806E) forming an electrode contact at least partially within the heat barrier layer and in direct contact with at least one of the one or more metallization layers. The method 800E may include (in 808E) forming a first electrode layer over the heat barrier layer such that at least a portion of the first electrode layer is electrically conductively connected to the electrode contact. The method 800E may include (in 810E) forming a spontaneously polarizable memory element over the first electrode layer. The method 800E may include (in 812E) forming a second electrode layer over the spontaneously polarizable memory element (see, for example 902B in FIG. 9B). The method 800E may include (in 814E), structuring the spontaneously polarizable memory element to form a plurality of spontaneously polarizable capacitor structures. Each spontaneously polarizable capacitor structure may be associated with a memory cell (e.g., memory cell 200) of the memory cell arrangement. Structuring the spontaneously polarizable memory element to form the plurality of spontaneously polarizable capacitor structures may include depositing a mask material (e.g., a hard mask) over the second electrode layer (see, for example 904B in FIG. 9B), etching the second electrode layer, the spontaneously polarizable memory element, and the first electrode layer to form the plurality of spontaneously polarizable capacitor structures (see, for example 906B in FIG. 9B), and removing the mask material (see, for example 908B in FIG. 9B). The method 800E may include (in 816E) annealing the spontaneously polarizable capacitor structures (see, for example 910B in FIG. 9B in which the arrows indicate the temperature treatment). According to various aspects, the amorphous material of the memory element may be easier to etch than the crystalline state (after annealing). The method 800E may include (in 818E), after annealing the spontaneously polarizable capacitor structures, forming at least one vertical interconnect access, via, at least partially within the heat barrier layer and electrically conductively connected to at least one of the one or more metallization layers.

Figure 9C:
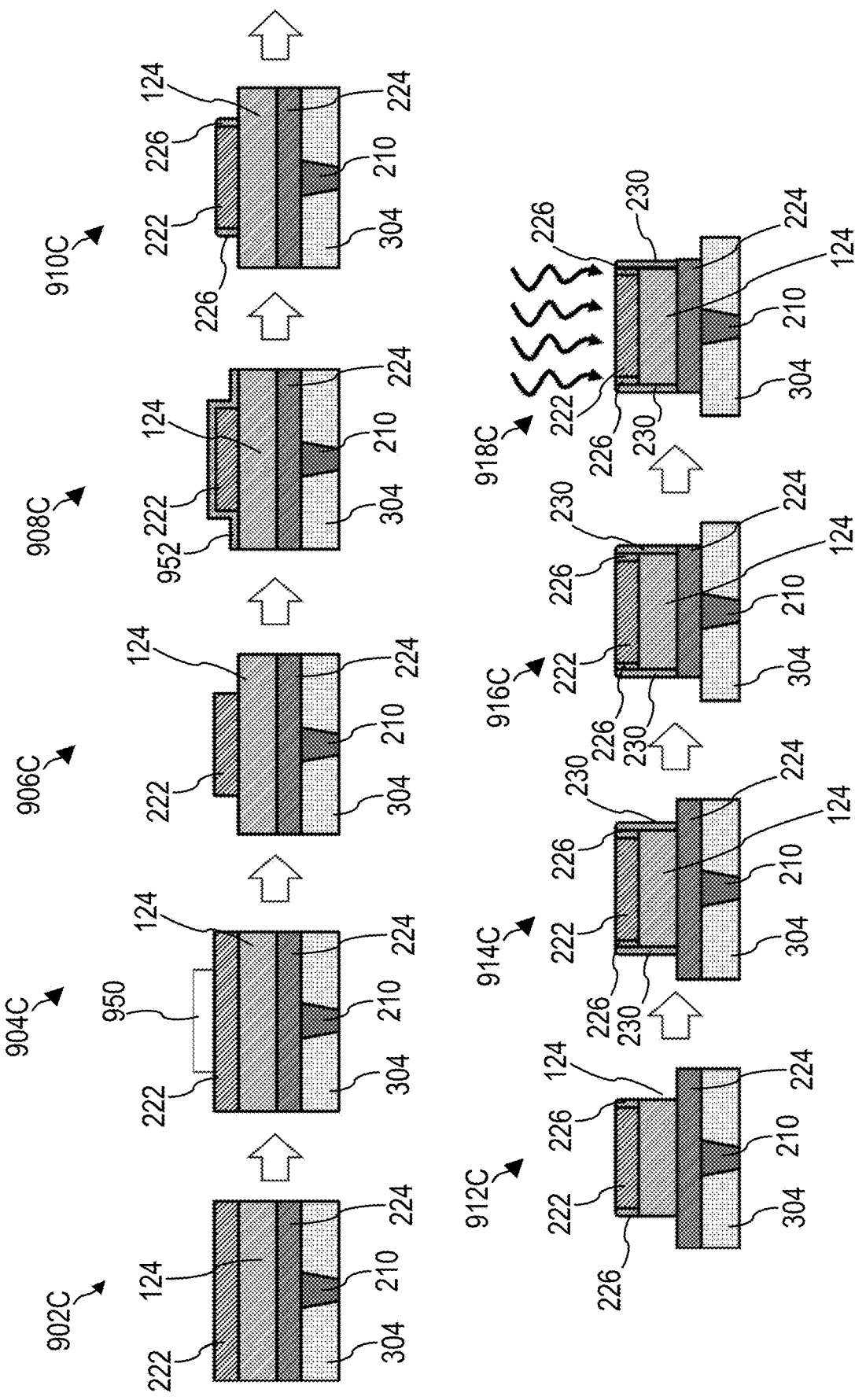

FIG. 9C shows at least parts of an exemplary manufacturing of a memory cell in accordance with method 800F. Method 800F may include (in 806F) forming an electrode contact at least partially within the heat barrier layer and in direct contact with at least one of the one or more metallization layers. The method 800F may include (in 808F) forming a first electrode layer over the heat barrier layer such that at least a portion of the first electrode layer is electrically conductively connected to the electrode contact. The method 800F may include (in 810F) forming a spontaneously polarizable memory element over the first electrode layer. The method 800F may include (in 812F) forming a second electrode layer over the spontaneously polarizable memory element (see, for example 902C in FIG. 9C). The method 800F may include (in 814F), structuring the second electrode layer to form a plurality of second electrodes. Each second electrode may be associated with a memory cell (e.g., memory cell 200) of the memory cell arrangement. Structuring the second electrode layer to form the plurality of second electrodes may include depositing a mask material (e.g., a hard mask) over the second electrode layer (see, for example 904C in FIG. 9C), etching the second electrode layer to form the plurality of second electrodes (see, for example 906C in FIG. 9C), and removing the mask material. The method 800F may include (in 816F) forming, for each of the plurality of second electrodes, a spacer (e.g., the first encapsulation structure 226) laterally surrounding the respective second electrode. Forming the spacer may include depositing a spacer layer 952 (see, for example 908C in FIG. 9C) and etching the spacer layer to form the spacers (see, for example 910C in FIG. 9C). The method 800F may include (in 818F), structuring the spontaneously polarizable memory element to form a plurality of spontaneously polarizable capacitor elements, wherein each of the spontaneously polarizable capacitor elements is associated with a second electrode of the plurality of second electrodes (see, for example 912C in FIG. 9C). The method 800F may include (in 820F) forming, for each of the plurality of spontaneously polarizable capacitor elements, a sidewall spacer laterally surrounding the respective the spontaneously polarizable capacitor structure and the spacer (see, for example 914C in FIG. 9C). The method 800F may include (in 822F), structuring the first electrode layer to form a plurality of first electrodes, wherein each of the first electrodes is associated with a spontaneously polarizable capacitor structure of the plurality of spontaneously polarizable capacitor structure and a second electrode of the plurality of second electrodes (see, for example 916C in FIG. 9C). The first electrode, the spontaneously polarizable capacitor structure, and the second electrode may each form a memory cell of the memory cell arrangement. The method 800F may include (in 824F) annealing the spontaneously polarizable capacitor elements, the first electrodes and the second electrodes (see, for example 918C in FIG. 9C in which the arrows indicate the temperature treatment). Illustratively, the annealing may be performed on the fully encapsulated memory stack. The method 800F may include (in 826F), after annealing, forming at least one vertical interconnect access, via, at least partially within the heat barrier layer and electrically conductively connected to at least one of the one or more metallization layers.

FIG. 9D shows at least parts of an exemplary manufacturing of a memory cell in accordance with method 800G. Method 800G may include (in 806G) forming an electrode contact at least partially within the heat barrier layer and in direct contact with at least one of the one or more metallization layers. The method 800G may include (in 808G) forming a first electrode layer over the heat barrier layer such that at least a portion of the first electrode layer is electrically conductively connected to the electrode contact (see, for example 902D in FIG. 9D). The method 800G may include (in 810G), structuring the first electrode layer to form a plurality of first electrodes. Each first electrode may be associated with a memory cell (e.g., memory cell 200) of the memory cell arrangement. Structuring the first electrode layer to form the plurality of first electrodes may include depositing a mask material (e.g., a hard mask) over the first electrode layer (see, for example 904D in FIG. 9D), etching the first electrode layer to form the plurality of first electrodes (see, for example 906D in FIG. 9D), and removing the mask material. The method 800G may include (in 812G) forming a spontaneously polarizable memory element over the first electrodes. The method 800G may include (in 814G) forming a second electrode layer over the spontaneously polarizable memory element (see, for example 908D in FIG. 9D). The method 800G may include (in 816G) annealing the spontaneously polarizable memory element, the first electrodes, and the second electrode layer (see, for example 910D in FIG. 9D in which the arrows indicate the temperature treatment). The method 800G may include (in 818G) structuring the second electrode layer to form a plurality of second electrodes, wherein each of the second electrodes is associated with a first electrode of the plurality of first electrodes. Structuring the second electrode layer to form the plurality of second electrodes may include depositing a mask material (e.g., a hard mask) over the second electrode layer (see, for example 912D in FIG. 9D), etching the second electrode layer to form the plurality of second electrodes (see, for example 914D in FIG. 9D), and removing the mask material. Each first electrode of the plurality of first electrodes, the second electrode associated with the first electrode, and the spontaneously polarizable memory element disposed between the respective first electrode and the associated second electrode may form a spontaneously polarizable capacitor structure as a memory cell of the memory cell arrangement. Illustratively, in this case, the spontaneously polarizable memory element may not be patterned which reduces (e.g., prohibits) damages to the edges of the memory stack serving as spontaneously polarizable capacitor structure.

According to various aspects, forming the memory element or memory layer in any of the methods 800A, 800B, 800C, 800D, 800E may include depositing the spontaneously polarizable material (e.g., using atomic layer deposition, ALD).

According to various aspects, the methods 800A, 800B, 800C, 800D, 800E allow to manufacture a memory cell including a SPOC structure as part of the interlayer metallization. The SPOC structures 202, described herein, allow the use of a spontaneously polarizable material as part of the interlayer metallization without losing any CMOS performance. The heat barrier(s) described herein allow the use of a spontaneously polarizable material which requires a crystallization temperature higher than 400° C. (e.g., in the range from about 400° C. to about 650° C.). The encapsulation structure, described herein, allow to the use of low-k dielectric materials as embedding structure and/or insulating layer to reduce manufacturing costs. The methods 800A, 800B, 800C, 800D, 800E allow to manufacture a memory cell including a SPOC structure as part of the interlayer metallization with only two or three additional lithography steps, as described above.

In the following, various examples are provided that may include one or more aspects described above with reference to the memory cell 200 and the methods 800A; 800B, 800C. It may be intended that aspects described in relation to one of the methods 800A, 800B, 800C may apply also to the other methods. It may be intended that aspects described in relation to the methods 800A, 800B, 800C may apply also to the memory cell 200, and vice versa. For example, the methods 800A, 800B, 800C may include the formation of any structure of the memory cell 200.

Example 1 is a memory cell arrangement including: one or more memory cells, each of the one or more memory cells including: an embedding structure, and a spontaneously polarizable capacitor structure disposed at least partially within the embedding structure, wherein the spontaneously polarizable capacitor structure includes or consists of a memory element, the memory element consisting of a spontaneously polarizable material.

In Example 2, the memory cell arrangement of Example 1 can optionally include that the spontaneously polarizable material includes or consists of a remanently polarizable material, preferably a ferroelectric material.

In Example 3, the memory cell arrangement of Example 2 can optionally include that the ferroelectric material is or includes at least one of the following: ferroelectric hafnium oxide, ferroelectric zirconium oxide, or a mixture of both.

In Example 4, the memory cell arrangement of Example 1 can optionally include that the spontaneously polarizable material includes or consists of non-remanently polarizable material, preferably an antiferroelectric material.

In Example 5, the memory cell arrangement of Example 4 can optionally include that the antiferroelectric material is or includes at least one of the following: antiferroelectric hafnium oxide, antiferroelectric zirconium oxide, or a mixture of both.

In Example 6, the memory cell arrangement of any one of Examples 1 to 5 can optionally include that the spontaneously polarizable material includes or consists of hafnium oxide (e.g., consists of hafnium oxide, hafnium zirconium oxide, hafnium silicon oxide hafnium lanthanum oxide or hafnium lanthanum zirconium oxide), zirconium oxide and/or aluminum nitride (e.g., consists of aluminum nitride, aluminum scandium nitride or aluminum boron nitride).

In Example 7, the memory cell arrangement of any one of Examples 1 to 6 can optionally include that the spontaneously polarizable capacitor structure includes one or more interlayers (e.g., aluminum oxide and/or dielectric hafnium oxide) disposed between layers of the spontaneously polarizable material.

In Example 8, the memory cell arrangement of any one of Examples 1 to 7 can optionally include that the spontaneously polarizable capacitor structure includes or consists of the memory element and at least one electrode layer (e.g., a bottom electrode layer and/or a top electrode layer) directly contacting the memory element.

In Example 9, the memory cell arrangement of any one of Examples 1 to 8 can optionally include that the spontaneously polarizable capacitor structure includes or consists of the memory element and of a first electrode layer (e.g., a top electrode layer) disposed on a first side of the memory element (e.g., in direct contact with the memory element) and/or a second electrode layer (e.g., a bottom electrode layer) disposed on a second side of the memory element (e.g., in direct contact with the memory element), wherein the second side of the memory element is opposite to the first side of the memory element.

In Example 10, the memory cell arrangement of Example 9 can optionally include that the first electrode layer and/or the second electrode layer includes or consists of titanium nitride.

In Example 11, the memory cell arrangement of Example 9 or 10 can optionally include that the first electrode layer includes or consists of an electrode stack having a first side directly contacting the memory element and a second side opposite the first side, the electrode stack including: a first layer providing the first side of the electrode stack, the first layer including an oxidation resistant metal (e.g., Pt), and/or a second layer providing the second side of the electrode stack, wherein the second layer includes an etch resistant material (e.g., TiN) and is configured as an etch stop.

In Example 12, the memory cell arrangement according to any one of Examples 9 to 11 can optionally include that the first electrode layer and/or the second electrode layer includes or consists of an electrode material having a workfunction equal to or greater than 5 eV. In Example 13, the memory cell arrangement of any one of Examples 9 to 12 can optionally include that the coefficient of thermal expansion of the first electrode layer and/or the second electrode layer is different from the coefficient of thermal expansion of the memory element.

In Example 14, the memory cell arrangement of any one of Examples 9 to 13 can optionally include that the second electrode layer includes or consists of an electrode material having a predefined crystallographic texture.

In Example 15, the memory cell arrangement according to any one of Examples 9 to 14 can optionally include that the second electrode layer includes a first side directly contacting the memory element and a second side opposite the first side, wherein the spontaneously polarizable capacitor structure further includes a diffusion barrier layer (e.g., a platinum layer) disposed in direct contact with the second side of the second electrode layer, and/or wherein the first side has a root mean squared, RMS, surface roughness less than 1 nm (e.g., less than 0.3 nm).

In Example 16, the memory cell arrangement of any one of Examples 9 to 15 can optionally include that an extension of the first electrode layer in a direction parallel to a contact plane is less than an extension of the memory element in the direction parallel to the contact plane, wherein the first electrode layer is disposed in direct contact with the memory element and wherein the contact plane corresponds to the plane in which the first electrode layer and the memory element are contacting each other.

In Example 17, the memory cell arrangement of Example 16 can optionally include that the spontaneously polarizable capacitor structure includes an encapsulation structure (e.g., a spacer laterally surrounding the first electrode layer) disposed in direct contact with the portion of the memory element within the contact plane which is not directly contacting the first electrode layer, wherein preferably the encapsulation structure is disposed in direct contact with the first electrode layer.

In Example 18, the memory cell arrangement of any one of Examples 1 to 17 can optionally include that spontaneously polarizable capacitor structure and/or each of the one or more memory cells includes an encapsulation structure (e.g., an inner spacer and/or an outer spacer) disposed between the memory element of the spontaneously polarizable capacitor structure and the embedding structure (e.g., laterally surrounding the memory element) such that there is no direct contact between the memory element and the embedding structure.

In Example 19, the memory cell arrangement according to Example 18 provided that in combination with any one of Examples 9 to 17 can optionally include that the encapsulation structure is also disposed between the first electrode layer of the spontaneously polarizable capacitor structure and the embedding structure and/or the second electrode layer of the spontaneously polarizable capacitor structure and the embedding structure such that there is no direct contact between first and/or second electrode layer and the embedding structure.

In Example 20, the memory cell arrangement of Example 18 or 19 can optionally include that the encapsulation structure includes: a hydrogen barrier layer configured as a hydrogen barrier (e.g., including or consisting of aluminum oxide) between the embedding structure and the memory element, and/or an electrically insulating layer (e.g., including or consisting of a high-k dielectric), and/or a layer configured to introduce strain or stress into the memory element (e.g., including or consisting of silicon nitride).

In Example 21, the memory cell arrangement of any one of Examples 1 to 20 can optionally include that each of the one or more memory cells further includes: a first electrode contact (e.g., a top electrode contact) disposed at least partially within the embedding structure and electrically conductively connected to the spontaneously polarizable capacitor structure (e.g., to the memory element or to first electrode layer in the case that the spontaneously polarizable capacitor structure includes the first electrode layer).

In Example 22, the memory cell arrangement of Example 21 can optionally include that the first electrode contact is disposed in direct contact with the spontaneously polarizable capacitor structure (e.g., in direct contact with the memory element or the first electrode layer).

In Example 23, the memory cell arrangement of Example 21 or 22 can optionally include that the first electrode contact includes or consists of copper, tungsten, or titanium nitride.

IN Example 24, the memory cell arrangement according to any one of Examples 1 to 23 can optionally include that each of the one or more memory cells further includes: a second electrode contact (e.g., a bottom electrode contact) electrically conductively connected to the spontaneously polarizable capacitor structure (e.g., to the memory element or to second electrode layer in the case that the spontaneously polarizable capacitor structure includes the second electrode layer).

In Example 25, the memory cell arrangement of Example 24 can optionally include that the second electrode contact is disposed in direct contact with the spontaneously polarizable capacitor structure (e.g., in direct contact with the memory element or the second electrode layer).

In Example 26, the memory cell arrangement of Example 24 or 25 can optionally include that the second electrode contact includes or consists of copper, tungsten, or titanium nitride.

In Example 27, the memory cell arrangement according to any one of Examples 24 to 26 provided that in combination with any one of Examples 21 to 23 can optionally include that the first electrode contact is disposed in direct contact with a first side of the spontaneously polarizable capacitor structure and wherein the second electrode contact is disposed with a second side of the spontaneously polarizable capacitor structure opposite to the first side.

In Example 28, the memory cell arrangement of any one of Examples 1 to 27 can optionally include that each of the one or more memory cells further includes: an insulating layer, wherein a first portion of the insulating layer is disposed in direct contact with the embedding structure and wherein a second portion of the insulating layer is disposed in direct contact with at least a portion of the spontaneously polarizable capacitor structure (e.g., in direct contact with the memory element or the second electrode layer in the case that the spontaneously polarizable capacitor structure includes the second electrode layer).

IN Example 29, the memory cell arrangement according to Example 28 provided that in combination with any one of Examples 24 to 27 can optionally include that the second electrode contact is disposed at least partially within the insulating layer.

In Example 30, the memory cell arrangement of Example 29 can optionally include that the second electrode contact is disposed in direct contact with the insulating layer.

In Example 31, the memory cell arrangement of Example 29 can optionally include that each of the one or more memory cells further includes: an encapsulation structure disposed in a gap between the second electrode contact (e.g., laterally surrounding the second electrode contact) and the insulating layer (e.g., in direct contact with the second electrode contact and in direct contact with the insulating layer).

In Example 32, the memory cell arrangement of Example 31 can optionally include that the encapsulation structure is disposed such that there is no direct contact between the second electrode contact and the insulating layer.

In Example 33, the memory cell arrangement of Example 31 or 32 can optionally include that the encapsulation structure completely surrounds the second electrode contact between the second electrode contact and the insulating layer.

In Example 34, the memory cell arrangement of any one of Examples 28 to 33 can optionally include that the insulating layer is or includes an electrically insulating layer.

In Example 35, the memory cell arrangement of Example 34 can optionally include that the electrically insulating layer includes or consists of silicon oxynitride (SiON).

In Example 36, the memory cell arrangement of any one of Examples 28 to 35 can optionally include that at least a part of or the complete insulating layer is configured as a heat barrier to reduce a heat transfer between portions of the memory cell arrangement disposed on opposite sides of the heat barrier (e.g., to reduce a heat transfer to the portion of the memory cell arrangement disposed between the heat barrier and the substrate).

In Example 37, the memory cell arrangement of Example 36 can optionally include that the heat barrier includes or consists of an aerogel and/or a (e.g., porous) low-k dielectric material.

In Example 38, the memory cell arrangement according to Example 36 or 37 can optionally include that the heat barrier includes or consists of a material having at 25° C. a thermal conductivity of less than $1 \text{ W·m}^{-1}\text{·K}^{-1}$.

In Example 39, the memory cell arrangement of any one of Examples 36 to 38 can optionally include that the heat barrier includes or consists of a material having a thermal conductivity less than the thermal conductivity of silicon oxide and/or silicon nitride.

In Example 40, the memory cell arrangement according to any one of Examples 36 to 39 can optionally include that the heat barrier has a thickness less than 50 nm (e.g., a thickness in the range from about 5 nm to about 30 nm).

In Example 41, the memory cell arrangement of any one of Examples 36 to 40 can optionally include that the heat barrier has a porosity greater than 60 percent (e.g., greater than 70%, e.g., greater than 80%, e.g., greater than 90%).

In Example 42, the memory cell arrangement of any one of Examples 1 to 41 can optionally include that the spontaneously polarizable capacitor structure has a planar structure, a curved structure, or trapezoidal structure.

In Example 43, the memory cell arrangement according to any one of Examples 1 to 42 can optionally include that each of the one or more memory cells is disposed between two consecutive metallization layers (Mn and Mn+1 with n≥1) of an interlayer metallization.

Example 44 is a memory cell including: a heat barrier layer disposed over one or more metallization layers of an interlayer metallization (i.e., at least over the first metallization layer M1), wherein the heat barrier layer is configured as a heat barrier to the one or more metallization layers, and a spontaneously polarizable capacitor structure disposed over the heat barrier layer, wherein the spontaneously polarizable capacitor structure includes or consists of a memory element, the memory element consisting of a spontaneously polarizable material.

Example 45 is a method for manufacturing a memory cell arrangement, the method including: forming one or more metallization layers at least one of over or in a substrate, forming a heat barrier layer over the one or more metallization layers, wherein the heat barrier layer is configured as a heat barrier to the one or more metallization layers, forming one or more memory cells, each of the one or more memory cells including a spontaneously polarizable capacitor structure, such that the spontaneously polarizable capacitor structure is electrically conductively connected to at least one of the one or more metallization layers, wherein the spontaneously polarizable capacitor structure includes or consists of a memory element, the memory element consisting of a spontaneously polarizable material, annealing the memory elements, and after annealing the memory elements, forming at least one vertical interconnect access, via, at least partially within the heat barrier layer and electrically conductively connected to at least one of the one or more metallization layers.

Example 46 is a method for manufacturing a memory cell arrangement, the method including: forming one or more metallization layers at least one of over or in a substrate, forming a heat barrier layer over the one or more metallization layers, wherein the heat barrier layer is configured as a heat barrier to the one or more metallization layers, forming at least one electrode contact at least partially within the heat barrier layer and in direct contact with at least one of the one or more metallization layers, forming at least one memory cell including a spontaneously polarizable capacitor structure, such that at least a portion of the spontaneously polarizable capacitor structure is in direct contact with the at least one electrode contact, wherein the spontaneously polarizable capacitor structure includes or consists of a memory element, the memory element consisting of a spontaneously polarizable material, annealing the memory element, and after annealing the memory element, forming at least one vertical interconnect access, via, at least partially within the heat barrier layer and electrically conductively connected to at least one of the one or more metallization layers.

In Example 47, the method according to Example 45 or 46 can optionally include that forming the memory cell(s) includes: forming the memory element over the one or more metallization layers electrically conductively connected to the at least one of the one or more metallization layers, forming an electrode layer (e.g., a top electrode layer) over and in direct contact with the memory element at a temperature lower than 50° C., and structuring the memory element and the electrode layer to form the spontaneously polarizable capacitor structure(s) of the memory cell(s).

In Example 48, the method according to Example 45 or 46 can optionally include that forming the memory cell(s) includes: forming a first electrode layer (e.g., a bottom electrode layer) over the one or more metallization layers electrically conductively connected to the at least one of the one or more metallization layers, forming the memory element over and in direct contact with the first electrode layer, forming a second electrode layer (e.g., a top electrode layer) over and in direct contact with the memory element at a temperature lower than 50° C., and structuring first electrode layer, the memory element and the second electrode layer to form the spontaneously polarizable capacitor structure(s) of the memory cell(s).

Example 49 is a method for manufacturing a memory cell arrangement, the method including: forming one or more metallization layers at least one of over or in a substrate, forming a heat barrier layer over the one or more metallization layers, wherein the heat barrier layer is configured as a heat barrier to the one or more metallization layers, forming an electrode contact at least partially within the heat barrier layer and in direct contact with at least one of the one or more metallization layers, forming a memory element over the heat barrier layer such that at least a portion of the memory element is electrically conductively connected to the electrode contact, wherein the memory element consists of a spontaneously polarizable material, annealing the memory element, after annealing the memory element, structuring the memory element to form a plurality of spontaneously polarizable capacitor structures, wherein each spontaneously polarizable capacitor structure is associated with a memory cell of the memory cell arrangement, and after structuring the memory element, forming at least one vertical interconnect access, via, at least partially within the heat barrier layer and electrically conductively connected to at least one of the one or more metallization layers.

In Example 50, the method according to Example 49 can optionally further include: forming an electrode layer (e.g., a top electrode layer) over and in direct contact with the memory element at a temperature lower than 50° C. (i) prior to annealing the memory element or (ii) after annealing the memory element and prior to structuring the memory element.

In Example 51, the method according to Example 49 can optionally further include: forming a first electrode layer (e.g., a bottom electrode layer) over the heat barrier layer prior to forming the memory element, wherein the memory element is formed over and in direct contact with the first electrode layer, forming a second electrode layer (e.g., a top electrode layer) over and in direct contact with the memory element at a temperature lower than 50° C. (i) prior to annealing the memory element or (ii) after annealing the memory element and prior to structuring the memory element.

In Example 52, the method of Example 48 or 51 can optionally include that forming the memory element includes a surface treatment of the first electrode layer prior to depositing the spontaneously polarizable material.

In Example 53, the method according to any one of Examples 47, 48, 50 or 51 and optionally in combination with Example 52 can optionally include that forming the (second) electrode layer includes a surface treatment of the memory element prior to depositing an electrode material the (second) electrode layer includes or consists of.

In Example 54, the method according to any one of Examples 45 to 53 can optionally include that annealing the memory element includes annealing the memory element at a temperature higher than 400° C. (e.g., at a temperature in the range from about 450° C. to about 650° C.).

In Example 55, the method of any one of Examples 45 to 54 can optionally include that the heat barrier layer includes or consists of an aerogel and/or a (e.g., porous) low-k dielectric material.

In Example 56, the method according to any one of Examples 45 to 55 can optionally include that the heat barrier layer includes or consists of a material having at 25° C. a thermal conductivity of less than $1 \; W \cdot m^{-1} \cdot K^{-1}$.

In Example 57, the method according to any one of Examples 45 to 56 can optionally include that the one or more metallization layers include at least a first metallization layer, M1, disposed over contact pads for contacting transistors of the memory cell arrangement.

In Example 58, the method of any one of Examples 45 to 56 can optionally further include: forming one or more transistors at least one of over or in the substrate and forming one or more contact pads electrically conductively connected to the one or more transistors prior to forming the one or more metallization layers over the one or more contact pads.

In Example 59, the method according to any one of Examples 45 to 58 can optionally include that the one or more metallization layers include at least one copper metallization layer formed by a dual damascene process.

Example 60 is a memory cell configured in accordance with the memory cell of any one of Examples 1 to 43.

Example 61 is a memory cell including: a thermally insulating layer disposed over one or more metallization layers of a metallization, an embedding structure disposed over the thermally insulating layer, and a spontaneously polarizable capacitor structure disposed at least partially within the embedding structure, wherein the spontaneously polarizable capacitor structure includes a spontaneously polarizable memory element, wherein the thermally insulating layer is configured as a heat barrier to reduce a heat transfer through the embedding structure into the one or more metallization layers.

In Example 62, the memory cell of Example 61 can optionally include that the spontaneously polarizable memory element includes or consists of a remanently polarizable material, preferably a ferroelectric material, or wherein the spontaneously polarizable memory element includes or consists of non-remanently polarizable material, preferably an antiferroelectric material.

In Example 63, the memory cell of Example 61 or 62 can optionally include that at least a portion of the thermally insulating layer is disposed between the spontaneously polarizable capacitor structure and the one or more metallization layers.

In Example 64, the memory cell of any one of Examples 61 to 63 can optionally include that the spontaneously polarizable capacitor structure includes or consists of the spontaneously polarizable memory element and of a first electrode layer disposed on a first side of the spontaneously polarizable memory element and/or a second electrode layer disposed on a second side of the spontaneously polarizable memory element opposite to the first side.

In Example 65, the memory cell of Example 64 can optionally include that the first electrode layer includes or consists of an electrode stack having a first side directly contacting the spontaneously polarizable memory element and a second side opposite the first side, the electrode stack including: a first layer providing the first side of the electrode stack, the first layer including an oxidation resistant metal, and/or a second layer providing the second side of the electrode stack, wherein the second layer is configured as an etch stop.

In Example 66, the memory cell of Example 64 or 65 can optionally include that the coefficient of thermal expansion of the first electrode layer and/or the second electrode layer is different from the coefficient of thermal expansion of the spontaneously polarizable memory element.

In Example 67, the memory cell of any one of Examples 64 to 66 can optionally include that an extension of the first electrode layer in a direction parallel to a contact plane is less than an extension of the spontaneously polarizable memory element in the direction parallel to the contact plane, wherein the first electrode layer is disposed in direct contact with the spontaneously polarizable memory element and wherein the contact plane corresponds to the plane in which the first electrode layer and the spontaneously polarizable memory element are contacting each other.

In Example 68, the memory cell of any one of Examples 61 to 67 can optionally include that spontaneously polarizable capacitor structure and/or the more memory cell includes an encapsulation structure disposed between the spontaneously polarizable memory element and the embedding structure such that there is no direct contact between the spontaneously polarizable memory element and the embedding structure.

In Example 69, the memory cell of Example 68 can optionally include that the encapsulation structure includes: a hydrogen barrier layer configured as a hydrogen barrier between the embedding structure and the spontaneously polarizable memory element, and/or an electrically insulating layer, and/or a layer configured to introduce compressive stress or tensile stress into the spontaneously polarizable memory element.

In Example 70, the memory cell of any one of Examples 61 to 69 can optionally further include: a first electrode contact disposed at least partially within the embedding structure and in direct contact with the spontaneously polarizable capacitor structure.

In Example 71, the memory cell of any one of Examples 61 to 70 can optionally further include: a second electrode contact disposed between the spontaneously polarizable capacitor structure and the one or more metallization layers and in direct contact with the spontaneously polarizable capacitor structure, wherein, preferably, provided that in combination with Example 12, the first electrode contact is disposed in direct contact with a first side of the spontaneously polarizable capacitor structure and the second electrode contact is disposed in direct contact with a second side of the spontaneously polarizable capacitor structure opposite to the first side.

In Example 72, the memory cell of Example 71 provided that in combination with Example 63 can optionally include that the second electrode contact is disposed at least partially within the thermally insulating layer, wherein, preferably, the memory cell further includes an electrode encapsulation structure disposed in a gap between the second electrode contact and the thermally insulating layer such that there is no direct contact between the second electrode contact and the thermally insulating layer.

In Example 73, the memory cell of any one of Examples 61 to 72 can optionally include that the thermally insulating layer includes or consists of an aerogel and/or a porous low-k dielectric material.

In Example 74, the memory cell of any one of Examples 61 to 73 can optionally include that the thermally insulating layer includes or consists of a material having at 25° C. a thermal conductivity of less than 1 W·m-1·K-1, and/or wherein the thermally insulating layer has a thickness of less than 50 nm, and/or wherein the thermally insulating layer has a porosity greater than 60 percent.

In Example 75, the memory cell of any one of Examples 61 to 74 can optionally include that the thermally insulating layer includes or consists of a material having a thermal conductivity less than the thermal conductivity of: polycrystalline silicon, epitaxial silicon, dense silicon films, silicon oxide, and/or silicon nitride.

In Example 76, the memory cell of any one of Examples 61 to 75 can optionally include that the memory cell is disposed between two consecutive metallization layers (Mn and Mn+1 with n≥1) of the metallization (e.g., interlayer metallization).

Example 77 is a method for manufacturing a memory cell arrangement, the method including: forming one or more metallization layers at least one of over or in a substrate, forming a thermally insulating layer over the one or more metallization layers, wherein the thermally insulating layer is configured as a heat barrier to reduce a heat transfer into the one or more metallization layers, forming at least one electrode contact at least partially within the thermally insulating layer and in direct contact with at least one of the one or more metallization layers, forming a spontaneously polarizable capacitor structure by forming a first electrode layer over the heat barrier layer such that at least a portion of the first electrode layer is electrically conductively connected to the electrode contact forming a spontaneously polarizable memory element over the first electrode layer, and forming a spontaneously polarizable memory element over the first electrode layer, structuring the second electrode layer to form a plurality of second electrodes, forming, for each of the plurality of second electrodes, a first encapsulation structure laterally surrounding the respective second electrode, structuring the spontaneously polarizable memory element to form a plurality of spontaneously polarizable capacitor elements, wherein each of the spontaneously polarizable capacitor elements is associated with a second electrode of the plurality of second electrodes, forming, for each of the plurality of spontaneously polarizable capacitor elements, a second encapsulation structure laterally surrounding the spontaneously polarizable capacitor structure and the first encapsulation structure, structuring the first electrode layer to form a plurality of first electrodes, wherein each of the first electrodes is associated with a spontaneously polarizable capacitor structure of the plurality of spontaneously polarizable capacitor elements and a second electrode of the plurality of second electrodes forming a spontaneously polarizable capacitor structure, annealing the spontaneously polarizable capacitor structures to form a plurality of memory cells of the memory cell arrangement, and after annealing the spontaneously polarizable memory element, forming at least one vertical interconnect access at least partially within the thermally insulating layer and electrically conductively connected to at least one of the one or more metallization layers.

Example 78 is a method for manufacturing a memory cell arrangement, the method including: forming one or more metallization layers at least one of over or in a substrate, forming a thermally insulating layer over the one or more metallization layers, wherein the thermally insulating layer is configured as a heat barrier to reduce a heat transfer into the one or more metallization layers, forming an electrode contact at least partially within the thermally insulating layer and in direct contact with at least one of the one or more metallization layers, forming a first electrode layer over the thermally insulating layer such that at least a portion of the spontaneously polarizable memory element is electrically conductively connected to the electrode contact, structuring the first electrode layer to form a plurality of first electrodes, forming a spontaneously polarizable memory element over the first electrodes, forming a second electrode layer over the spontaneously polarizable memory element, annealing the spontaneously polarizable memory element, the first electrodes and the second electrode layer, after annealing the spontaneously polarizable memory element, structuring the second electrode layer to form a plurality of second electrodes, wherein each of the second electrodes is associated with a first electrode of the plurality of first electrodes, wherein the each second electrode of the plurality of second electrodes, the associated first electrode and a portion of the spontaneously polarizable memory element disposed between the first electrode and the second electrode forms a spontaneously polarizable capacitor structure, and after structuring the second electrode layer, forming at least one vertical interconnect access at least partially within the thermally insulating layer and electrically conductively connected to at least one of the one or more metallization layers.

In Example 79, the method of Example 77 or 78 can optionally include that annealing the spontaneously polarizable memory element includes annealing the spontaneously polarizable memory element at a temperature higher than 400° C. (e.g., at a temperature in the range from about 450° C. to about 650° C.).

In Example 80, the method of any one of Examples 77 to 79 can optionally include that the one or more metallization layers include at least a first metallization layer, M1, of an interlayer metallization disposed over a contact metallization the contact metallization including contact pads for contacting transistors of the memory cell arrangement.

Several aspects are described with reference to a structure (e.g., a memory transistor structure, e.g., a field-effect transistor structure, e.g., a ferroelectric field-effect transistor structure, e.g., a capacitive memory structure) and it is noted that such a structure may include solely the respective element (e.g., a memory transistor, e.g., a field-effect transistor, e.g., a ferroelectric field-effect transistor, e.g., a capacitive memory); or, in other aspects, a structure may include the respective element and one or more additional elements.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

The term "switch" may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term "switch" may thus be used herein to describe a modification of the memory state a memory cell is residing in, from a first memory state to a second memory state. The term "switch" may also be used herein to describe a modification of a polarization, for example of a spontaneously-polarizable memory element (e.g., of a spontaneously-polarizable layer, such as a remanent-polarizable layer). For example, a polarization of a spontaneously-polarizable memory element may be switched, such that the sign of the polarization varies from positive to negative or from negative to positive, while the absolute value of the polarization may remain in some aspects substantially unaltered. According to various aspects, writing a memory cell may include bringing the memory cell from one of at least two memory states into another one of the at least two memory states of the memory cell (e.g., from the LVT state into the HVT state, or vice versa).

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "coupled to" used herein with reference to functional parts of a memory cell (e.g., functional parts of a memory structure) that are coupled to respective nodes (e.g., source-line node, bit-line node, and/or word-line node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bit-line node of the memory cell or the source/drain node of the field-effect transistor memory structure may provide the bit-line node of the memory cell.

The term "metal" or "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{-10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

The term "content" may be used herein, in some aspects, in relation to the "content of an element" in a material or in a layer to describe the mass percentage (or fraction) of that element over a total mass of the material (or of the layer). The term "content" may be used herein in relation to the "content of defects" in the structure of a material to describe the mass percentage of the defects over a total mass of the constituents of the structure. The term "content" may be used herein, in some aspects, in relation to the "content of an element" in a material or in a layer to describe the volume percentage of that element over a total volume of the material (or of the layer). The term "content" may be used herein in relation to the "content of defects" in the structure of a material to describe the volume percentage of the defects over a total volume of the structure.

The expression "a material of an element" or "a material of a layer", for example "a material of a memory element", or "a material of an electrode layer" may be used herein to describe a main component of that element or layer, e.g., a main material (for example, a main element or a main compound) present in that element or layer. The expression "a material of an element" or "a material of a layer" may describe, in some aspects, the material of that element or layer having a weight percentage greater than 60% over the total weight of the materials that the element or layer includes. The expression "a material of an element" or "a material of a layer" may describe, in some aspects, the material of that element or layer having a volume percentage greater than 60% over the total volume of the materials that the element or layer includes. As an example, a material of an element or layer including aluminum may describe that that element or layer is formed mostly by aluminum, and that other elements (e.g., impurities) may be present in a smaller proportion, e.g., having less weight percentage or less volume percentage compared to aluminum. As another example, a material of an element or layer including titanium nitride may describe that that element or layer is formed mostly by titanium nitride, and that other elements (e.g., impurities) may be present in a smaller proportion, e.g., having less weight percentage or less volume percentage compared to titanium nitride.

The term "region" used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.,). In some aspects, the continuous region of a semiconductor portion may be provided by semiconductor material having only one dominant doping type.

The word "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g., a layer, a substrate, a wafer, etc.) or "laterally" next to, may be used herein to mean an extent or a positional relationship along a surface of the carrier. That means, in some aspects, that a surface of a carrier (e.g., a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g., perpendicular to the main processing surface of a carrier).

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g., parallel to the main processing surface) the "thickness" of the layer formed on the surface of the support may be the same as the height of the layer.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
   a thermally insulating layer disposed over one or more metallization layers of a metallization;
   an embedding structure disposed over the thermally insulating layer; and
   a spontaneously polarizable capacitor structure disposed at least partially within the embedding structure, wherein the spontaneously polarizable capacitor structure comprises a spontaneously polarizable memory element; and
   a first electrode contact disposed at least partially within the embedding structure and in direct contact with the spontaneously polarizable capacitor structure,
   wherein the thermally insulating layer is configured as a heat barrier to reduce a heat transfer through the embedding structure into the one or more metallization layers; and wherein the thermally insulating layer has a porosity greater than 60%.

2. The memory cell according to claim 1,
   wherein the spontaneously polarizable memory element comprises or consists of a remanently polarizable material; or
   wherein the spontaneously polarizable memory element comprises or consists of non-remanently polarizable material.

3. The memory cell according to claim 1,
   wherein at least a portion of the thermally insulating layer is disposed between the spontaneously polarizable capacitor structure and the one or more metallization layers.

4. The memory cell according to claim 1,
   wherein the spontaneously polarizable capacitor structure comprises or consists of the spontaneously polarizable memory element and of a first electrode layer disposed on a first side of the spontaneously polarizable memory element and/or a second electrode layer disposed on a second side of the spontaneously polarizable memory element opposite to the first side.

5. The memory cell according to claim 4,
   wherein the first electrode layer comprises or consists of an electrode stack having a first side comprising the first electrode contact in direct contact with the spontaneously polarizable memory element and a second side opposite the first side, the electrode stack comprising:
   a first layer providing the first side of the electrode stack, the first layer comprising an oxidation resistant metal, and/or
   a second layer providing the second side of the electrode stack, wherein the second layer is configured as an etch stop.

6. The memory cell according to claim 4,
   wherein a coefficient of thermal expansion of the first electrode layer and/or the second electrode layer is different from the coefficient of thermal expansion of the spontaneously polarizable memory element.

7. The memory cell according to claim 4,
wherein an extension of the first electrode layer in a direction parallel to a contact plane is less than an extension of the spontaneously polarizable memory element in the direction parallel to the contact plane, wherein the first electrode layer is disposed in direct contact with the spontaneously polarizable memory element and wherein the contact plane corresponds to the plane in which the first electrode layer and the spontaneously polarizable memory element are contacting each other.

8. The memory cell according to claim 1,
wherein the spontaneously polarizable capacitor structure and/or memory cell comprises an encapsulation structure disposed between the spontaneously polarizable memory element and the embedding structure.

9. The memory cell according to claim 8,
wherein the encapsulation structure comprises:
a hydrogen barrier layer configured as a hydrogen barrier between the embedding structure and the spontaneously polarizable memory element, and/or
an electrically insulating layer, and/or
a layer configured to introduce compressive stress or tensile stress into the spontaneously polarizable memory element.

10. The memory cell according to claim 1, further comprising:
a second electrode contact disposed between the spontaneously polarizable capacitor structure and the one or more metallization layers and in direct contact with the spontaneously polarizable capacitor structure.

11. The memory cell according to claim 10,
wherein at least a portion of the thermally insulating layer is disposed between the spontaneously polarizable capacitor structure and the one or more metallization layers;
wherein the second electrode contact is disposed at least partially within the thermally insulating layer;
wherein, optionally, the memory cell further comprises an electrode encapsulation structure disposed in a gap between the second electrode contact and the thermally insulating layer such that there is no direct contact between the second electrode contact and the thermally insulating layer.

12. The memory cell according to claim 1,
wherein the thermally insulating layer comprises or consists of an aerogel.

13. The memory cell according to claim 1,
wherein the thermally insulating layer comprises or consists of a material having at 25° C., a thermal conductivity of less than 1 $W \cdot m^{-1} K^{-1}$;
wherein the thermally insulating layer has a thickness of less than 50 nm; or
combinations thereof.

14. The memory cell according to claim 1,
wherein the thermally insulating layer comprises or consists of a material having a thermal conductivity less than the thermal conductivity of: polycrystalline silicon, epitaxial silicon, dense silicon films, silicon oxide, and/or silicon nitride.

15. The memory cell according to claim 1,
wherein the memory cell is disposed between two consecutive metallization layers of the metallization.

16. A memory cell comprising:
a thermally insulating layer disposed over one or more metallization layers of a metallization, wherein the thermally insulating layer has a porosity greater than 60%;
an embedding structure disposed over the thermally insulating layer; and
a spontaneously polarizable capacitor structure disposed at least partially within the embedding structure, wherein the spontaneously polarizable capacitor structure comprises a spontaneously polarizable memory element,
wherein the thermally insulating layer is configured as a heat barrier to reduce a heat transfer through the embedding structure into the one or more metallization layers, wherein the spontaneously polarizable capacitor structure and/or the memory cell comprises an encapsulation structure disposed between the spontaneously polarizable memory element and the embedding structure such that there is no direct contact between the spontaneously polarizable memory element and the embedding structure.

17. A memory cell comprising:
a thermally insulating layer disposed over one or more metallization layers of a metallization, wherein the thermally insulating layer has a porosity greater than 60%;
an embedding structure disposed over the thermally insulating layer;
a spontaneously polarizable capacitor structure disposed at least partially within the embedding structure, wherein the spontaneously polarizable capacitor structure comprises a spontaneously polarizable memory element, wherein the thermally insulating layer is configured as a heat barrier to reduce a heat transfer through the embedding structure into the one or more metallization layers; and
a second electrode contact disposed between the spontaneously polarizable capacitor structure and the one or more metallization layers and in direct contact with the spontaneously polarizable capacitor structure.

* * * * *